United States Patent
Billings et al.

(10) Patent No.: US 6,950,785 B1
(45) Date of Patent: Sep. 27, 2005

(54) NONLINEAR SYSTEMS, METHOD OF DESIGN THEREOF AND COMPUTER PROGRAM PRODUCT

(75) Inventors: Stephen Alec Billings, Sheffield (GB); Zi Qiang Lang, Sheffield (GB)

(73) Assignee: University of Sheffield, Sheffield (GB)

( * ) Notice: Subject to any disclaimer, the term of this patent is extended or adjusted under 35 U.S.C. 154(b) by 0 days.

(21) Appl. No.: 09/623,281

(22) PCT Filed: Mar. 2, 1999

(86) PCT No.: PCT/GB99/00550

§ 371 (c)(1),
(2), (4) Date: Nov. 21, 2000

(87) PCT Pub. No.: WO99/45644

PCT Pub. Date: Sep. 10, 1999

(30) Foreign Application Priority Data

Mar. 3, 1998 (GB) .............................. 9804412

(51) Int. Cl.[7] .............................. G06F 17/10
(52) U.S. Cl. .......................................... 703/2
(58) Field of Search ................. 375/346, 296; 84/662; 600/559; 359/341; 367/135; 702/75–77, 189; 708/400; 703/2, 4, 13; 455/296, 314, 112, 323; 360/69; 700/28, 29

(56) References Cited

U.S. PATENT DOCUMENTS 5,703,313 A  * 12/1997  Pierce et al. ................. 84/622
5,880,877 A  *  3/1999  Fermann ................ 359/341.31
5,885,225 A  *  3/1999  Keefe et al. ................. 600/559
5,995,565 A  * 11/1999  Tong et al. .................. 375/346

OTHER PUBLICATIONS

Mansour et al., "Frequency domain non–linear adaptive filter", IEEE 1981.*
Kasparis et al., "Non–linear filtering techniques for narrow band interference rejection in direct sequence spread spectrum systems", IEEE 1991.*

* cited by examiner

Primary Examiner—Kevin J. Teska
Assistant Examiner—Kandasamy Thangavelu
(74) Attorney, Agent, or Firm—Fish & Richardson P.C.

(57) ABSTRACT

The present invention relates to nonlinear systems and methods of design thereof in the frequency domain. Typically, conventional linear filter design involves attenuating signals at frequencies which are not of interest and dissipating the energy at those frequencies as, for example, heat or sound. However, in more systems, it is not always convenient to design a linear system or design a system solely with energy attenuation in mind. Therefore, the present invention provides a nonlinear system and method of design thereof in the frequency domain which can be used to transfer energy at a first pre-determinable frequency, or frequency range, to a second pre-determinable frequency, or frequency range. Using the method of the present invention a nonlinear system can be developed which can meet given energy transfer requirements or a nonlinear system can be designed which can alter the transfer function of an existing nonlinear or linear system.

34 Claims, 38 Drawing Sheets

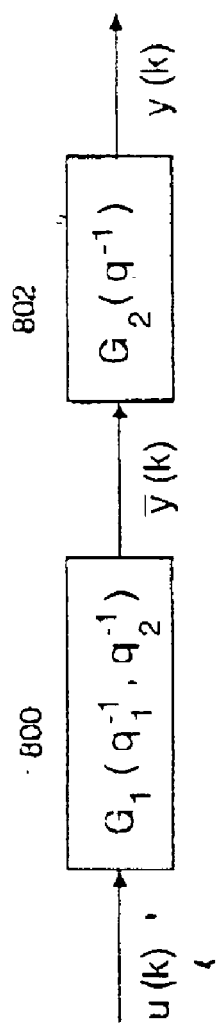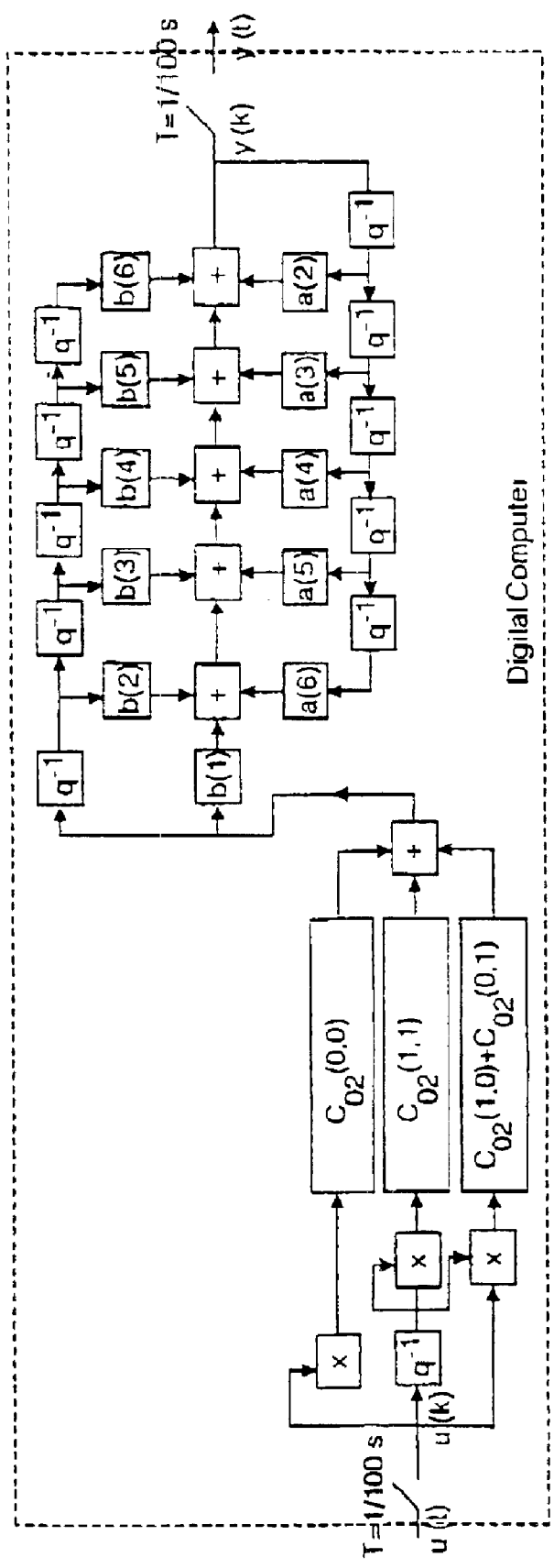
Fig. 8
Fig. 9

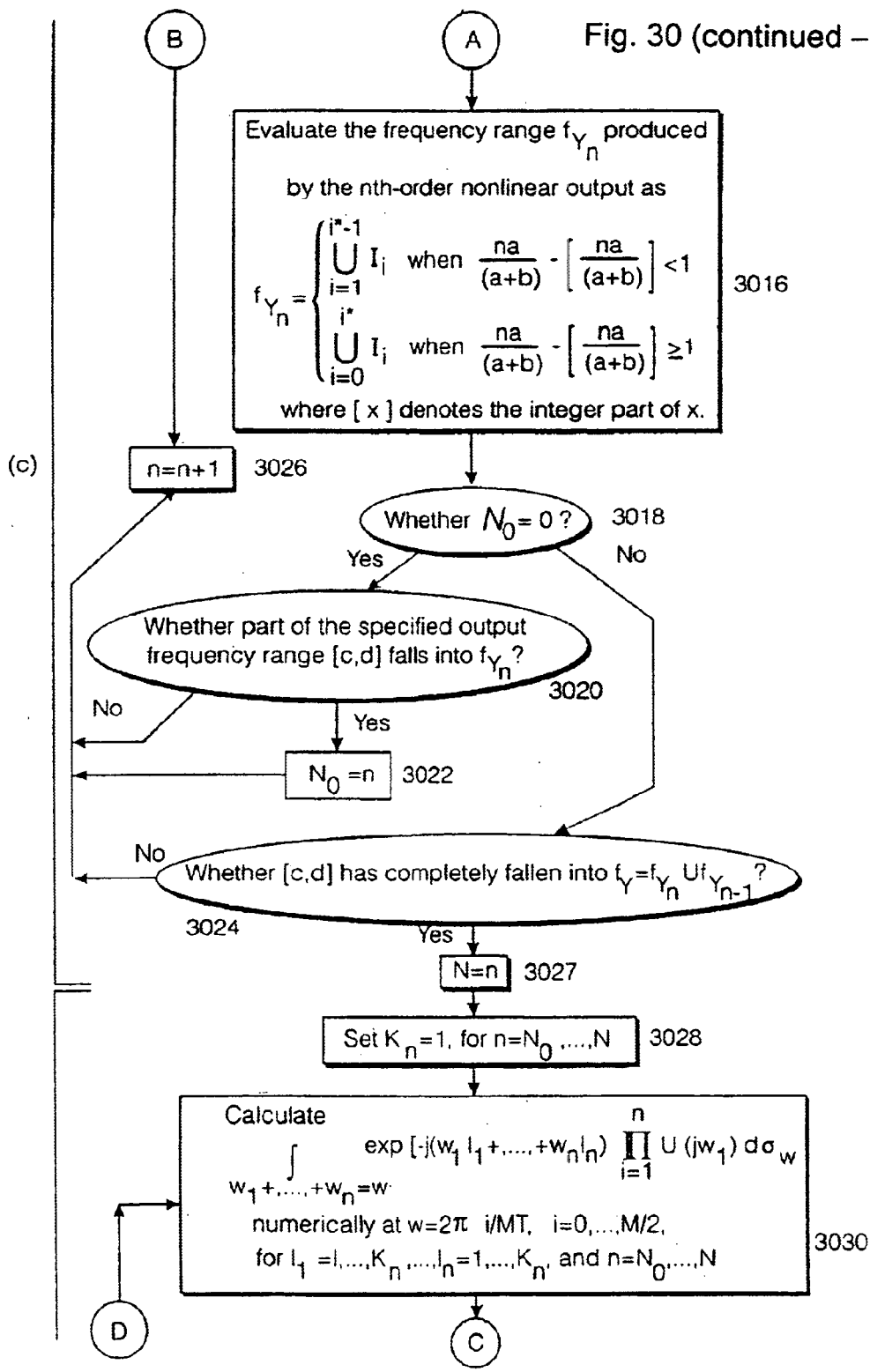
Fig. 30 (continued −1)

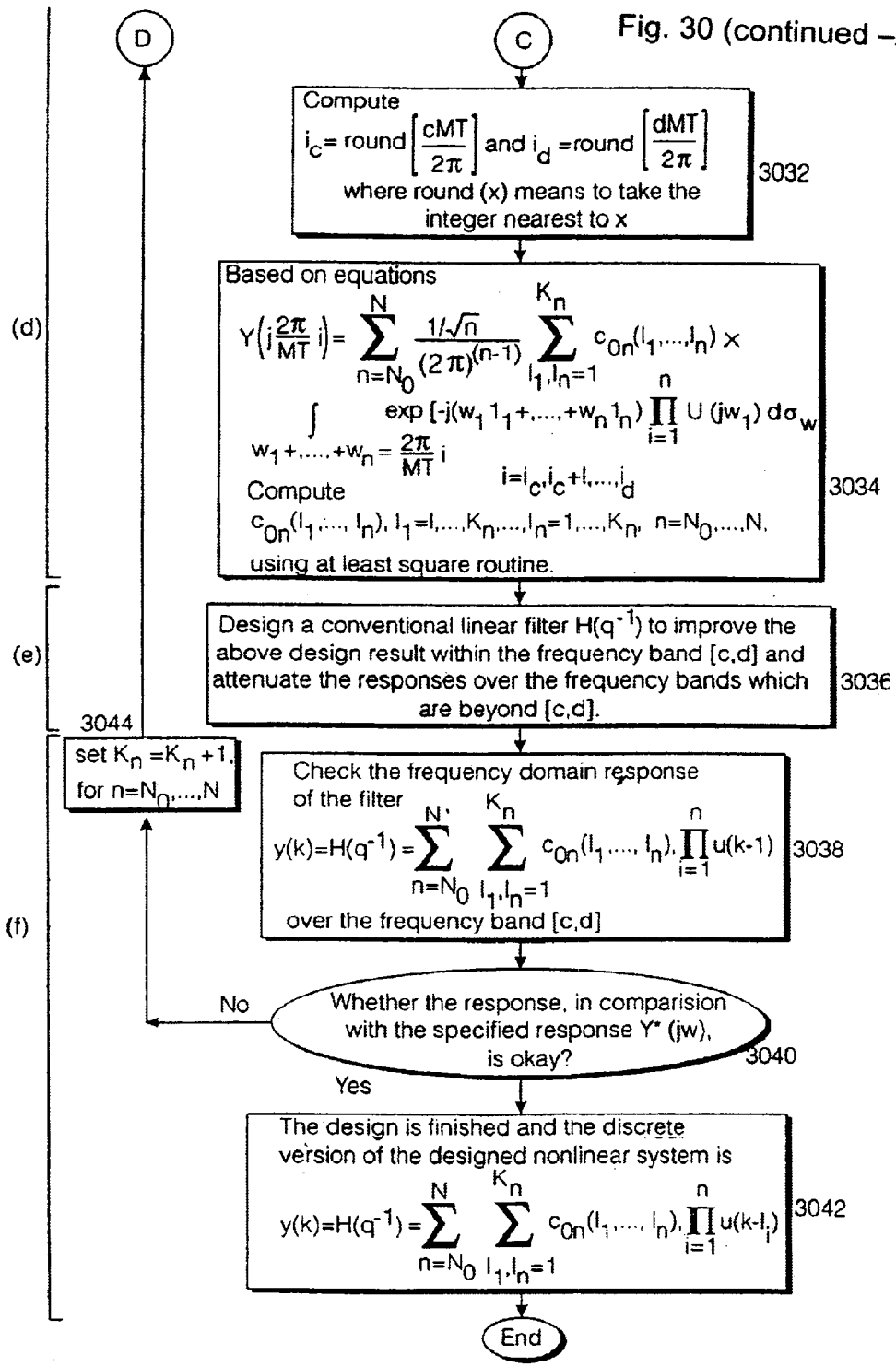
Fig. 30 (continued –2)

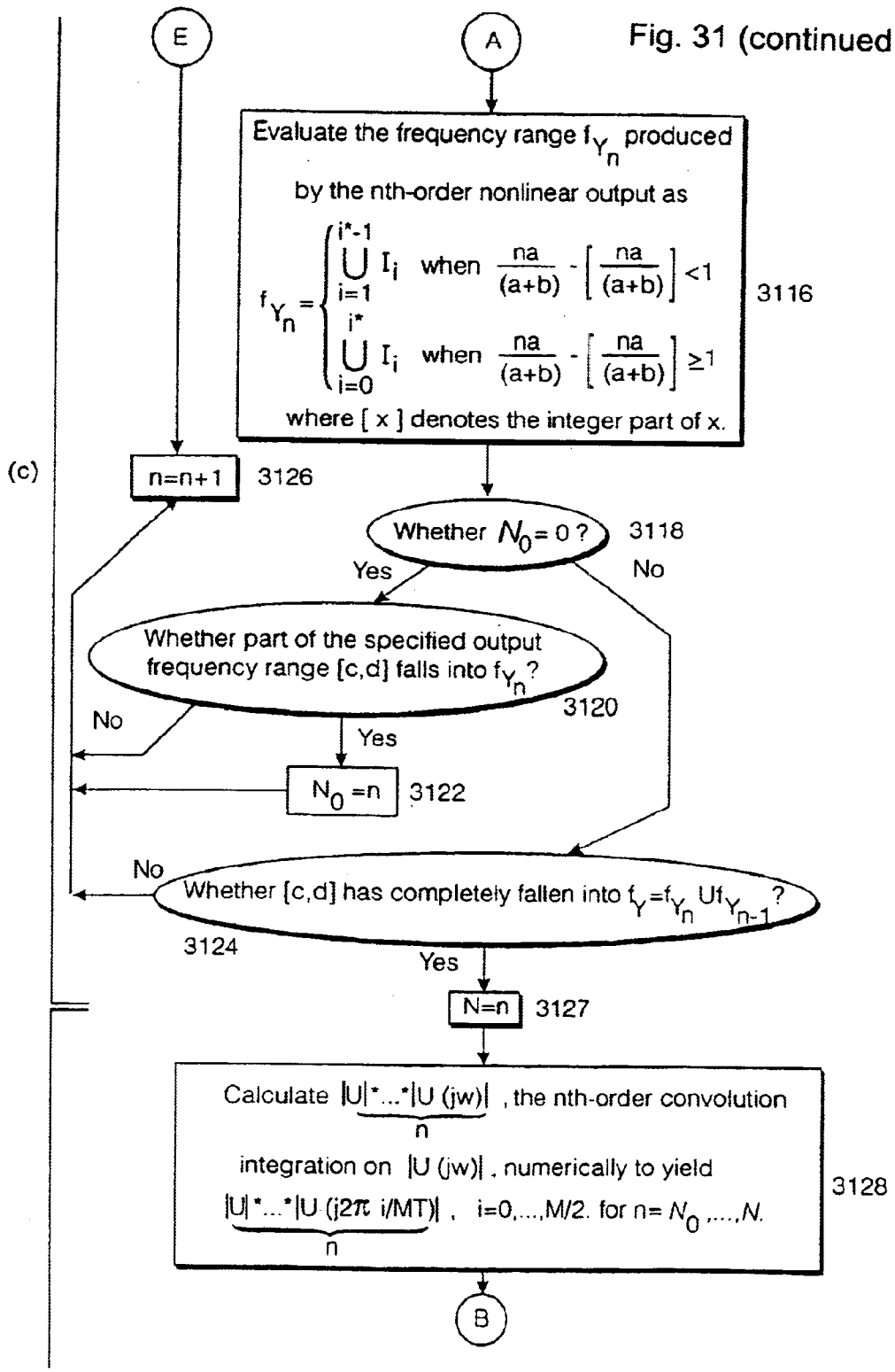
Fig. 31 (continued –1)

Fig. 31 (continued -2)
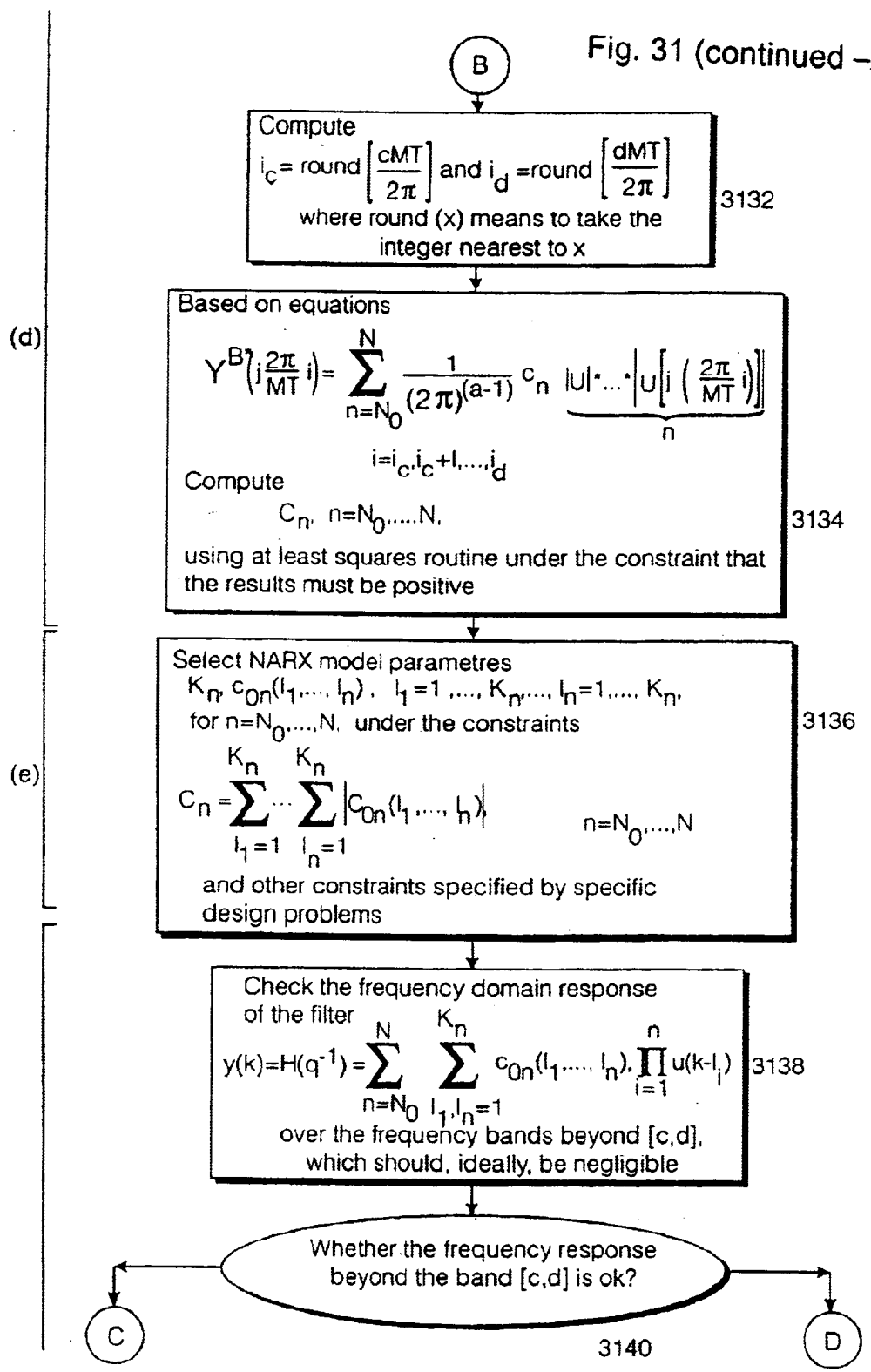

Fig. 31 (continued -3)
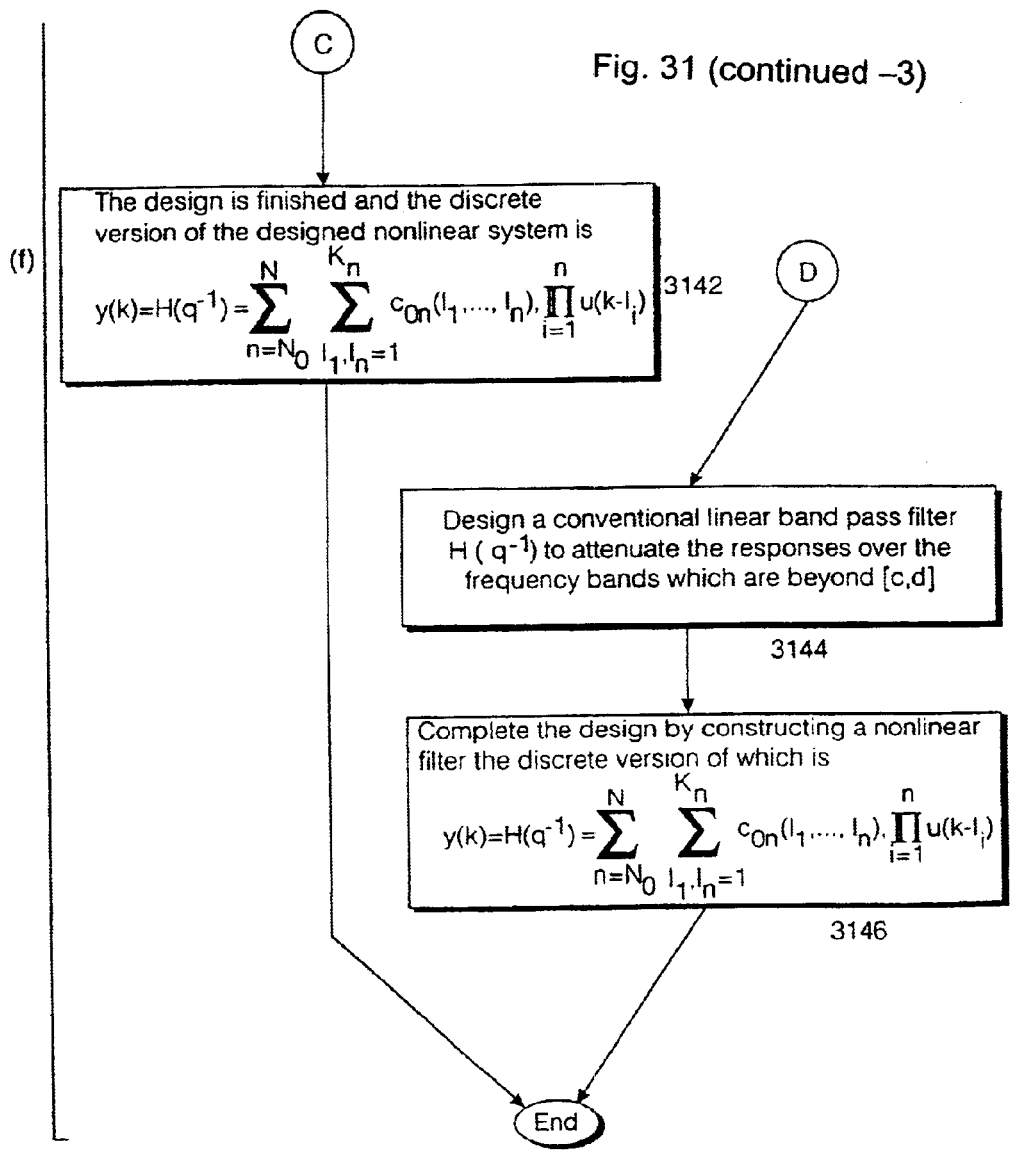

NONLINEAR SYSTEMS, METHOD OF DESIGN THEREOF AND COMPUTER PROGRAM PRODUCT

The present invention relates to non-linear systems, methods of design thereof in the frequency domain and computer program products. More particularly, the present invention relates to a non-linear system having pre-determinable frequency response characteristics. The invention can be utilised to design and realise, for example, nonlinear filters having a required frequency response or transfer functions having specified transfer characteristics or within a control system context.

The possible frequency components in an output signal of a linear system are exactly the same as the frequency components of a corresponding input signal. Conventional linear filter design is based on the principle that energy in unwanted frequency bands is attenuated.

The Dolby filter, which varies the amplitude of the output signal as a function of the level and frequency of the input, is an example of a nonlinear filter system. However, when compared with the input, the output does not contain any additional frequency components. Modulation is another concept related to nonlinear filtering, which is associated with signal transmission where the signal to be transmitted is modulated by a carrier signal and then transmitted through a medium. Although a modulation device allows energy to be moved from one frequency band to another, the output frequency components of such a device depend not only on the input components but mainly on the carrier signal. Therefore, the energy transfer implemented by modulation is realised by a two input and one output system where one input is the carrier signal and the other input is the signal to be processed.

The prior art lacks a non-linear system and method of/apparatus for the design of such a non-linear system for predictably transferring energy from one frequency or band of frequencies of an input signal to another frequency or band of frequencies independently of any other input signal. Further, the prior art lacks a non-linear control system which can predictably transfer energy from one frequency band to another frequency band.

It is an object of the present invention to at least mitigate some of the problems of the prior art.

Accordingly, a first aspect of the present invention provides a method for designing a non-linear system for transferring energy from a time or spatial domain input signal having a first spectrum at a first pre-determinable frequency or range of frequencies to a time or spatial domain output signal having a second spectrum at a second pre-determinable frequency or range of frequencies.

Preferably, the method comprises of the steps of
identifying the first spectrum of the time or spatial domain input signal from which energy is to be transferred,
specifying the second spectrum of the time or spatial domain output signal to which said energy is to be transferred, and
calculating, using a frequency domain description of said output signal, for example, the output spectrum, expressed in terms of a frequency domain description of said input signal and coefficients of a time or spatial domain description of a generalised non-linear system, the coefficients of a said time or spatial domain description of said generalised non-linear system in order to give effect to the energy transfer.

Advantageously, the present invention allows energy at a particular frequency within a given system to be transferred to another frequency or band of frequencies at which the response of the system is greatly reduced or negligible, or
allows energy of a signal which is transmitted at a particular frequency or band of frequencies to be transferred, without using an additional modulating signal, to another frequency or band of frequencies at which the associated transmission media allows signals to pass, or
allows energy at a particular band of frequencies to be transferred and spread over a new wider range of frequencies so as to attenuate the energy by employing the desired interkernel and intrakernel effects of nonlinear systems.

The present invention is based upon the relationship between the input and output spectra or frequency components of nonlinear systems, and the relationship between the input and output frequencies and/or frequency ranges in the nonlinear case. In addition, the invention utilises a mapping between the time or spatial domains and frequency domain which allows the output spectra or frequency content of nonlinear systems to be described completely by the coefficients of time or spatial domain models which represent the filter or non-linear system to be constructed.

A second aspect of the present invention provides a method for manufacturing a non-linear system for transferring energy from a time or spatial domain input signal having a first spectrum at a first pre-determinable frequency or range of frequencies to a time or spatial domain output signal having a second spectrum at a second pre-determinable frequency or range of frequencies, said method of manufacture comprising the steps of
(a) designing said non-linear system comprising the steps of
identifying the first spectrum of the time or spatial domain input signal from which energy is to be transferred,
specifying the second spectrum of the time or spatial domain output signal to which said energy is to be transferred, and
calculating, using a frequency domain description of said output signal, for example, the output spectrum, expressed in terms of a frequency domain description of said input signal and coefficients of a time or spatial domain description of a generalised non-linear system, the coefficients of a time or spatial domain description of said generalised non-linear system in order to give effect to the energy transfer, and
(b) materially producing the non-linear system so designed.

A third aspect of the present invention provides a data processing system which can transfer energy from a time or spatial domain input signal having a first spectrum at a first pre-determinable frequency or range of frequencies to a time or spatial domain output signal having a second spectrum at a second pre-determinable frequency or range of frequencies, said system comprising
means for identifying the first spectrum of the time or spatial domain input signal from which energy is to be transferred,
means for specifying the second spectrum of the time or spatial domain output signal to which said energy is to be transferred, and
means for calculating, using a frequency domain description of said output signal, for example, the output spectrum, expressed in terms of a frequency domain description of said input signal and coefficients of a time or spatial domain description of a generalised non-linear system, the coefficients of a time or spatial domain description of said generalised non-linear system in order to give effect to the energy transfer.

A fourth aspect of the present invention provides a computer program product for designing a non-linear system for transferring energy from a time or spatial domain input signal having a first spectrum at a first pre-determinable frequency or range of frequencies to a time or spatial domain output signal having a second spectrum at a second pre-determinable frequency or range of frequencies, said computer program product comprising computer program code means for identifying the first spectrum of the time or spatial domain input signal from which energy is to be transferred, computer program code means for specifying the second spectrum of the time or spatial domain output signal to which said energy is to be transferred, and computer program code means for calculating, using a frequency domain description of said output signal, for example, the output spectrum, expressed in terms of a frequency domain description of said input signal and coefficients of a time or spatial domain description of a generalised non-linear system, the coefficients of a time or spatial domain description of said generalised non-linear system in order to give effect to the energy transfer.

A fifth aspect of the present invention provides a non-linear system which can transfer energy from a time or spatial domain input signal having a first spectrum at a first pre-determinable frequency or range of frequencies to a time or spatial domain output signal having a second spectrum at a second pre-determinable frequency or range of frequencies, said system comprising means for identifying the first spectrum of the time or spatial domain input signal from which energy is to be transferred, means for specifying the second spectrum of the time or spatial domain output signal to which said energy is to be transferred, and means for giving effect to the energy transfer using coefficients of a time or spatial domain description of a generalised non-linear system, said coefficients having been calculated using a frequency domain description of said output signal, for example, the output spectrum, expressed in terms of a frequency domain description of said input signal and coefficients of a time or spatial domain description of a generalised non-linear system.

Advantageously, the fifth embodiment allows processing for the determination of the coefficients to be performed off-line and merely incorporated into a non-linear system which uses the coefficients.

Embodiments of the present invention will be described by way of examples only, with reference to the accompanying in which:

FIG. 8 depicts schematically a non-linear system;

FIG. 9 shows a digital implementation of the non-linear system shown in FIG. 8;

Figure 1:
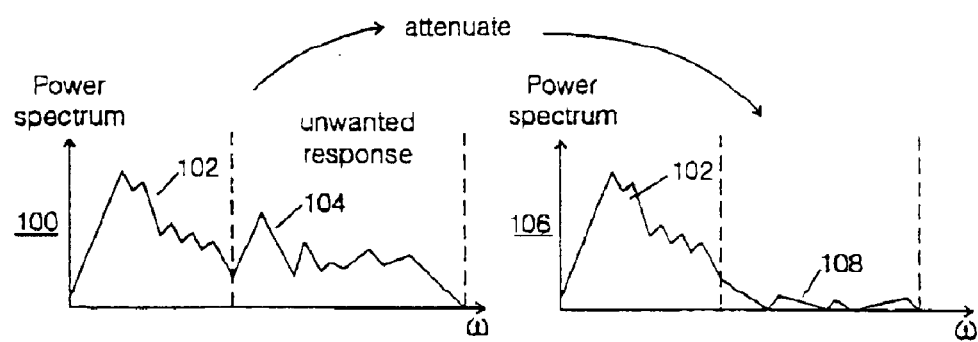
FIG. 1 shows the effect of traditional signal processing by, for example, a linear filter.

Referring to FIG. 1, there is shown the principle of, for example, traditional low pass, high pass, and band pass filtering. FIG. 1 shows the power spectrum of a signal 100 both before and after processing. The energy of a signal 100 to be filtered comprises two parts, namely, a first part 102 for further processing or of interest and a second part 104 which is of no interest. Typically, the second part 104 of the signal is attenuated which results in a second signal 106. The second signal 106 comprises the original or a copy of the first part 102 and an attenuated portion or an attenuated version of the second part 108.

Figure 2:
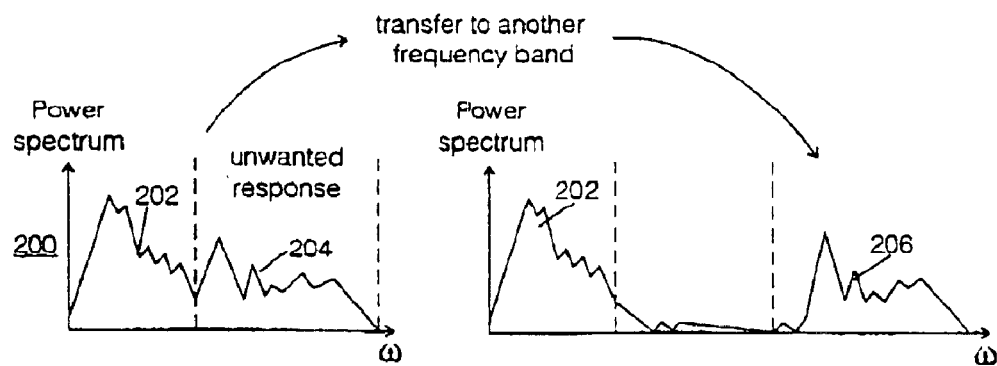
FIG. 2 illustrates signal processing according to one aspect of the present invention.

FIG. 2 illustrates the principle of signal processing according to one aspect of the present invention. FIG. 2 shows the power spectrum of a signal 200 both before and after processing. The signal comprises a first portion 202 and a second portion 204. The first portion 202 of the signal 200 is of interest for further processing or output. Accordingly, as a result of the signal processing using the present invention, the first portion 202 is retained and the energy in the second portion 204 is translated to another frequency band 206.

DETAILED DESCRIPTION

The theory and method underlying the present invention will now be described in general terms in steps (i) to (vi).

(i) Determine the frequency spectrum of a signal to be processed, including the range of frequencies of the signal.

(ii) Specify the frequency spectrum of the output signal.

(iii) Determine the structure of a Nonlinear Auto-Regressive model with eXogenous inputs (NARX model) to ensure that the energy transformation between different frequency bands and other design requirements, for example, specifications for magnitude and/or phase of the output spectrum over the required output frequency band can be met or realised.

The general expression for a NARX model is given by $$y(k) = \sum_{n=1}^{N} y_n(k) \quad (1)$$

where $y_n(k)$ is a 'NARX nth-order output' given by $$y_n(k) = \sum_{p=01, l_{p+q}=1}^{n} \sum^{K_n} c_{pq}(l_i, \ldots, l_{p+q}) \prod_{i=1}^{p} y(k-l_i) \prod_{i=p+1}^{p+q} u(k-l_i) \quad (2)$$

with $$p+q=n, l_i=1, \ldots, k_n, i=1, \ldots,$$

$$p+q, \text{ and } \sum_{l_i, l_{p+q}=1}^{K_n} \equiv \sum_{l_i=1}^{K_n} \ldots \sum_{l_{p+q}=i}^{K_n}$$

$K_n$ is the maximum lag and $y(.)$, $u(.)$, and $C_{pq}(.)$ are the output, input, and model coefficients respectively. A specific instance of the NARX model such as $y(k)=0.3u(k-1)+0.7y(k-1)-0.02u(k-1)u(k-1)-0.04u(k-2)u(k-1)-0.06y(k-1)u(k-3)-0.08y(k-2)y(k-3)$ may be obtained from the general form (1) and (2) with $c_{01}(1)=0.3$, $c_{10}(1)=0.7$, $c_{02}(1,1)=-0.02$, $C_{02}(2,1)=-0.04$, $c_{11}(1,3)=-0.06$, $C_{20}(2,3)=-0.08$, else $c_{pq}(.)=0$ Simplified designs will be considered below where the NARX model with only input nonlinearities is employed. However, it will be appreciated by one skilled in the art that the present invention is not limited to use in relation to only input nonlinearities. The present invention can equally well be used in circumstances of both non-linear outputs and non-linear inputs and outputs. Equally, the invention is not restricted to realisation as a NARX model. The invention may be realised using many alternative model forms either in discrete time or continuous time. Models such as the Hammerstein and Wiener model, or continuous time models, for example, a nonlinear differential equation model could be used or any other model, including discrete or continuous spatial models, that can be mapped into the frequency domain. However, for each of the models the main design principle is the same.

The NARX model with only input nonlinearities is given by equation (1) where $$y_n(k) = \begin{cases} \sum_{l_i, l_n=1}^{K_n} c_{0n}(l_i, \ldots, l_n) \prod_{i=1}^{n} u(k-l_i) & \text{for } n \geq 2 \\ \sum_{l_i=1}^{K_l} c_{10}(l_i)y(k-l_i) + \sum_{l_i=1}^{K_l} c_{01}(l_i)u(k-l_i) & \text{for } n=1 \end{cases} \quad (3)$$

The structure of the NARX model (1) and (3) is defined by the values of N, $K_n$, n32 1, ... N, and, for each n (an integer between 1 and N inclusive), involves terms of the form $$c_{0n}(l_i, \ldots, l_n) \prod_{i=1}^{n} u(k-l_i) \quad l_i=1, \ldots, K_n, i=1, \ldots, n,$$

when $n \geq 2$ and $$c_{10}(l_1)y(k-l_1), c_{01}(l_2)u(k-l_1), l_2=1, \ldots, K_1$$

when n=1 in the model.

The parameter N in the non-linear model (1) and (3) is associated with the realisability of the model required to give effect to the energy transformation. The ability to be able to realise the energy transformation is determined from the relationship between the input and output frequencies or frequency ranges of non-linear systems.

The structure parameters $K_n$, n=1, ... N, are associated with the extent to which specific design requirements such as the magnitude and/or phase of the output spectrum over the required output frequency band can be satisfied. These parameters are iteratively determined as part of the design. The model could initially be assumed to be of a simple form in terms of these parameters. However, if the initial choice of parameters does not produce a satisfactory design the parameters are progressively or gradually revised according to the energy transfer effect of the resulting non-linear system.

For systems described by the NARX model (1) and (3), the relationship between the input and output frequencies or frequency ranges is given by $$f_Y = f_{Y_N} \cup f_{Y_{N-1}} \quad (4)$$

where $f_Y$ denotes the range of frequencies of the output, and $F_{Y_N}$ and $F_{Y_{N-1}}$ denote the ranges of frequencies produced by the Nth-order and (N−1)th-order nonlinearities, and $$f_{y_0} = \begin{cases} \bigcup_{k=0}^{i^*-i} I_k & \text{when } \frac{nb}{(a+b)} - \left[\frac{na}{(a+b)}\right] < 1 \\ \bigcup_{k=0}^{i^*} I_k & \text{when } \frac{nb}{(a+b)} - \left[\frac{na}{(a+b)}\right] \geq 1 \\ & n = N \text{ and } N-1 \end{cases}$$

where [.] relates to or means take the integer part, $$i^* = \left[\frac{na}{(a+b)}\right] + 1$$

$$I_k = [na - k(a+b), nb - k(a+b)] \text{ for } k = 0, \ldots, i^*-1,$$

$$I_{i^*} = (0, nb - i^*(a+b),],$$

and the frequencies of the signal to be processed are in the range defined by the interval [a,b].

Given [a,b] and the required output frequency range $f_Y$, the smallest N for the NARX model (1) and (3) which can bring about the specified frequency domain energy transformation can be determined from equation 4.

(iv) Map the NARX model with the structure given in (iii) into the frequency domain to yield the frequency domain description. The frequency domain description is given in terms of the Generalised Frequency Response Functions (GFRSs), $H_n(jw_1, \ldots, jw_n)$, n=1, ..., N, which, after this mappings, are specified in terms of time or spatial domain model parameters.

The mapping of the NARX model (1) and (3) between the time or spatial domain and the frequency domain is given by $$H_n(jw_i, \ldots, jw_n) = \frac{1}{\left\{1 - \sum_{l_i=1}^{K_1} c_{10}(l_1)\exp[-j(w_i +, \ldots, +w_n)l_i]\right\}} \sum_{l_i,l_n=1}^{K_n} c_{On}(l_i, \ldots, l_n)\exp\{-j(w_i l_i +, \ldots, w_n l_n)\} \quad (5)$$

$n = 1, \ldots, N$

Therefore the frequency properties of the system can be completely defined in terms of the parameters $c_{qp}$ (.) of the time or spatial domain description of the system.

(v) The output frequency response of the non-linear system (1) and (3) is given by $$Y(jw) = \sum_{n=1}^{w} Y_n(jw) \text{ where} \quad (6)$$

$$Y_n(jw) = \frac{1/\sqrt{n}}{(2\pi)^{n-1}} \int_{w_i+,\ldots,+w_n=w} H_n(jw_i, \ldots, jw_n) \prod_{i=1}^{n} U(jw_i) d\sigma_w \quad (7)$$

denoting an integration over the nth-dimensional hyperplane $w_1+, \ldots, +w_n = w$ Based on this relationship, the parameters in $H_n(jw_1, \ldots, jw_n)$, n=1, ..., N, which, due to the mapping performed in (iv), are the same parameters as those in the time or spatial domain model are determined. This step enables the shape of the output frequency spectrum Y(jw) to be defined which in turn ensures that the spectrum approaches the specified output frequency spectrum as closely as possible.

Different design specifications can lead to different implementations of corresponding designs.

(v.1) Firstly, given knowledge of the input spectrum U(jw) and the required output spectrum Y*(jw). Substituting (5) and (7) into (6) yields $$Y(jw) = \quad (8)$$

$$\frac{1}{\left\{1 - \sum_{l_i=1}^{K_i} c_{10}(l_i)\exp(-jwl_i)\right\}} \sum_{n=1}^{N} \frac{1/\sqrt{n}}{(2\pi)^{(n-1)}} \sum_{l_i,l_n=1}^{K_n} C_{0n}(l_i, \ldots, l_n) \times$$

$$\int_{w_i+,\ldots,+w_n=w} \exp[-j(w_i l_i +, \ldots, +w_n l_n)] \prod_{i=1}^{n} U(jw_i) d\sigma_w$$

Equation (8) enables the parameters associated with the time or spatial domain NARX model, $c_{On}(1_1, \ldots, 1_n)$, $1_1=1, \ldots, K_n, \ldots, 1_n1=1, \ldots, K_n$, n=1, ..., N, and $c_{10}(1_1)$, $1_1=1, \ldots, K_1$, to be determined as follows to implement the required design:

1) Based upon the equation $$Y^*(jw) = \sum_{n=1}^{N} \frac{1/\sqrt{n}}{(2\pi)^{(n-1)}} \sum_{l_i,l_n=1}^{K_n} C_{0n}(l_i, \ldots, l_n) \times \quad (9)$$

-continued $$\int_{w_i+,\ldots,+w_n=w} \exp[-j(w_i l_i +,\ldots,+w_n l_n)] \prod_{i=1}^{n} U(jw_i) d\sigma_w$$

determine parameters $$c_{On}(1_1,\ldots,1_n), 1_1=1,\ldots,K_n,\ldots,1_n=1,\ldots,K_n, n=1,\ldots,N,$$

using a least squares routine to make the right hand side of equation (9) approach the specified output spectrum as closely as possible.

The first term on the right hand side of equation (8)

$$\frac{1}{\left\{1 - \sum_{l_i=1}^{K_i} c_{10}(l_i)\exp(-jwl_i)\right\}}$$

is omitted from (9). The omitted term represents linear output terms in the time or spatial domain realisation of the nonlinear system and these may not be needed to achieve the design at this step, hence they are omitted from (9).

2) In order to augment the performance of a filter designed as above, it may be desirable to also design a suitable linear filter H(hw) to improve the approximation to Y*(jw) obtained in 1) above such that $$H(jw) = \sum_{n=1}^{N} \frac{1/\sqrt{n}}{(2\pi)^{(n-1)}} \sum_{l_i,l_n=1}^{K_n} C_{0n}(l_i,\ldots,l_n) \times$$

$$\int_{w_i+,\ldots,+w_n=w} \exp[-j(w_i l_i +,\ldots,+w_n l_n)] \prod_{i=1}^{n} U(jw_i) d\sigma_w$$

can achieve a better approximation to Y*(jw). As part of this linear design the parameter $c_{10}(1_1), 1_1=1,\ldots,K_1$, which were omitted from (8) to get (9), can be obtained from the parameters of the linear filter.

Design 1 hereafter illustrates the design of a non-linear system using this first case.

(V.2) Secondly, given the input spectrum U(jw), and a specified bound for the magnitude of the required output spectrum $Y^{B*}(w)$.

A bound $Y^B(w)$ for the magnitude of the output spectrum Y(jw) of the NARX model (1) and (3) can be expressed as $$Y^B(w) = \sum_{n=1}^{N} \frac{1}{(2\pi)^{(n-1)}} |H_n(jw_i,\ldots,jw_n)|_w^B \frac{|U|*\ldots*|U(jw)|}{n} \quad (10)$$

according to the result in Billings, S. A. and Lang, Zi-Qiang, 1996, A bound for the magnitude characteristics of nonlinear output frequency response functions, Part 1: Analysis and computation: Int. J. Control, Vol.65, pp304–328, where $$\frac{|U|*\ldots*|U(jw)|}{n}$$

denotes the n-dimensional convolution integration for the magnitude characteristic of the input spectrum and $$|H_n(jw_1,\ldots,jw_n)|_w^B$$

represents a bound for the GFRFs magnitude $$|H_n(jw_1,\ldots,jw_n)|$$

with $w_1,\ldots,w_n$ satisfying the constraint $w_1+,\ldots,+w_n=w$. For the NARX model (1) and (3), $$|H_n(jw_1,\ldots,jw_n)|_w^B$$

can be evaluated as follows $$|H_n(jw_i,\ldots,jw_n)|_w^B = \frac{1}{\left|1 - \sum_{l_i=1}^{K_i} c_{10}(l_i)\exp(-jwl_i)\right|} \sum_{l_i,l_n=1}^{K_n} |c_{0n}(l_i,\ldots,l_n)| \quad (11)$$

Combining (10) and (11) yields $$Y^B(w) = \frac{1}{\left|1 - \sum_{l_i=1}^{K_i} c_{10}(l_i)\exp(-jwl_i)\right|} \sum_{n=1}^{N} \frac{1}{(2\pi)^{(n-1)}} C_n \frac{|U|*\ldots*|U(jw)|}{n} \quad (12)$$

$$\text{where } C_n = \sum_{l_i,l_n=1}^{K_n} |c_{0n}(l_i,\ldots,l_n)|$$

Equation (11) enables $$C_n = \sum_{l_i,l_n=1}^{K_n} |c_{0n}(l_i,\ldots,l_n)|$$

and $c_{10}(1_1), 1_1=1,\ldots,K_1$ to be determined for shaping the bound $Y^B(w)$ for Y(jw) in order to make this bound approach $Y^{B*}(w)$. The procedure which can be used to achieve this is as below.

1) Based upon the equation $$Y^{a-}(w) = \sum_{n=1}^{N} \frac{1}{(2\pi)^{(n-1)}} C_n \frac{|U|*\ldots*|U(jw)|}{n} \quad (13)$$

used a least squares routine to make the right hand side of the above equation approach $Y^{B*}(w)$ especially over the frequencies or frequency range to which the required energy transformation needs to be implemented. The coefficients $C_n$ n=1,..., N, in equation (13) must be constrained to be positive since $C_n$ is, the result of the summation of the modulus of the coefficients $c_{On}(1_1,\ldots,1_n), 1_1=1,\ldots,K_n,\ldots,1_n=1,\ldots,K_n$.

The first term on the right hand side of equation (12)

$$\frac{1}{\left|1 - \sum_{1_1=1}^{K_1} c_{10}(1_1)\exp(-jwl_1)\right|}$$

is omitted from (13). The omitted term represents linear output terms in the time or spatial domain realisation. These omitted terms may not be needed to achieve the design at this step, hence they are omitted from (13).

2) If necessary, the approximation to $Y^{B*}(w)$ in 1) above can be supplemented using a linear filter with a magnitude characteristic |H(jw)| such that $$|H(jw)| \sum_{n=1}^{N} \frac{1}{(2\pi)^{(n-1)}} c_n \underbrace{|U| * \ldots * |U(jw)|}_{n}$$

provides a better approximation to the specified bound and as a result $c_{10}(1_1)$, $1_1=1, \ldots, K_1$, which were omitted from (12) to get (13), can be obtained from the linear filter parameters.

Design 2 hereafter illustrates the detailed procedure of the above and several examples of the design.

(V.3) Thirdly, there are many practical situations which should be dealt with on an individual basis. There follows examples of two such situations.

Figure 3:
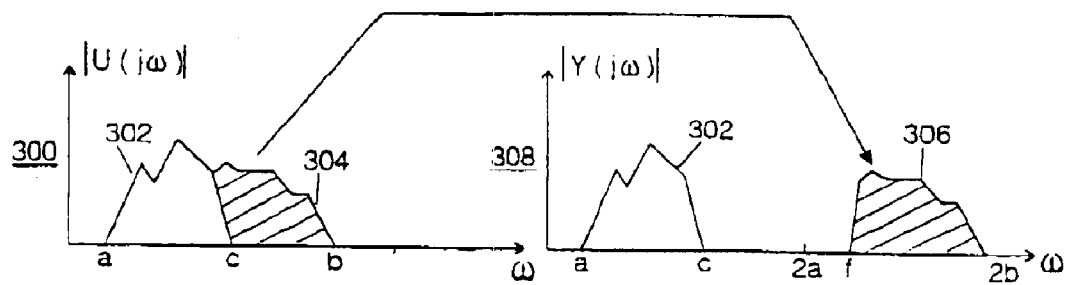
FIG. 3 depicts a further example of the signal processing according to the present invention.

(a) Referring to FIG. 3 there is shown an input signal having a spectrum U(jw) 300 which comprises a portion 302 of interest, between frequencies a and e, and an portion 304, between frequencies e and b, to be translated to another frequency range 306 defined by frequencies f and 2*b* while retaining the portion of interest 302 within the output signal 308.

Figure 4:
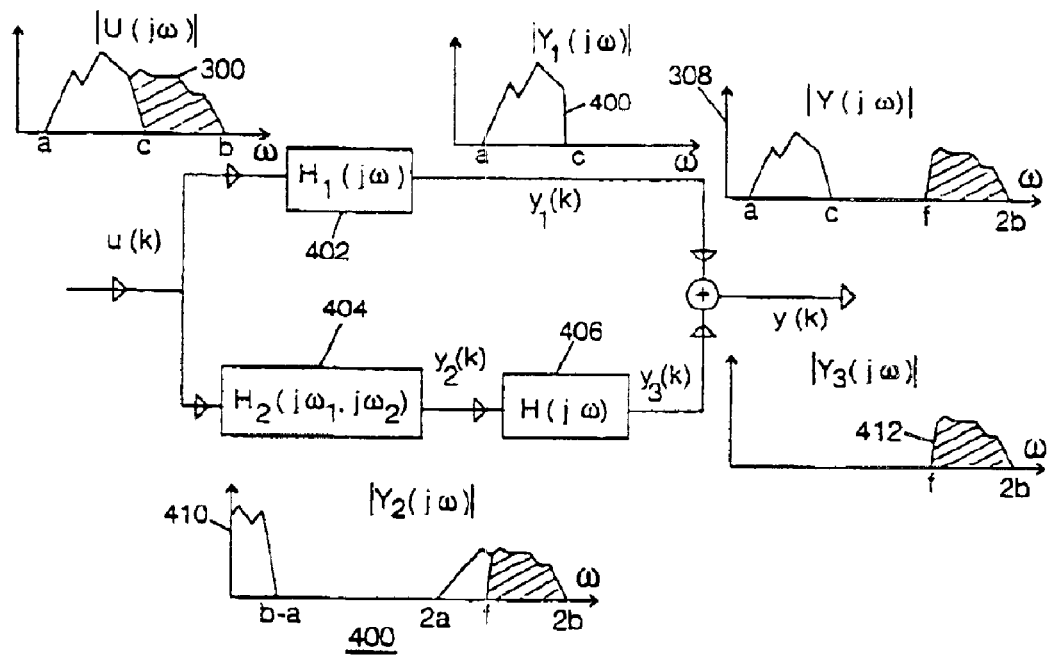
FIG. 4 shows a non-linear system arranged to give effect to the energy transformation shown in FIG. 3.

In order to realise the energy transformation shown in FIG. 3, a non-linear system 400 can be constructed as illustrated in FIG. 4 which comprises means 402, 404 and 406 for implementing the following components $$H_1(jw), H_2(jw_1, jw_2), \text{ and } H(jw).$$

$H_1(jw)$ 402 and $H(jw)$ 406 can be implemented readily using classical linear band pass filters, while $H_2(jw_1, jw_2)$ 404 can be constructed in the time or spatial domain as shown in the equation below $$y_2(k) = \sum_{1_1, 1_2=1}^{K_2} c_{02}(1_1, 1_2) \prod_{i=1}^{2} u(k - 1_1)$$

with the parameters, $c_{02}(1_1,1_2)$, $1_1=1, \ldots, K_2, 1_2=1, \ldots, K_2$ being determined to produce the signal $y_2(k)$ with a required frequency characteristic. Each of the components 402, 404 and 406 have corresponding frequency responses 408, 410 and 412. Consequently, the whole non-linear system can be realised as a non-linear time or spatial domain filter as $$y(k) = H_1(q^{-1})u(k) + H(q^{-1}) \sum_{1_1, 1_2=1}^{K_2} c_{02}(1_1, 1_2) \prod_{i=1}^{2} u(k - 1_1) =$$

$$\frac{H_{1N}(q^{-1})}{H_{1D}(q^{-1})} u(k) + \frac{H_N(q^{-1})}{H_D(q^{-1})} \sum_{1_1, 1_2=1}^{K_2} c_{02}(1_1, 1_2) \prod_{i=1}^{2} u(k - 1_1)$$

$$\text{where } H_1(q^{-1}) = \frac{H_{1N}(q^{-1})}{H_{1D}(q^{-1})}, H(q^{-1}) = \frac{H_N(q^{-1})}{H_D(q^{-1})}$$

are the backward shift operator descriptions of the linear filters which have the frequency response functions $H_1(jw)$ and $H(jw)$, respectively.

The equation for y(k) can be further written as $$H_{1D}(q^{-1})H_D(q^{-1})y(k) =$$

$$H_{1N}(q^{-1})H_D(q^{-1})u(k) + H_N(q^{-1})H_{1D}(q^{-1}) \sum_{1_1, 1_2=1}^{K_2} c_{02}(1_1, 1_2) \prod_{i=1}^{2} u(k - 1_1)$$

which is clearly a NARX model that can be described by equations (1) and (3).

Although the above shows energy transformation from a frequency band to a higher frequency band, energy can equally well be transferred from one frequency band to a lower frequency band.

Figure 5:
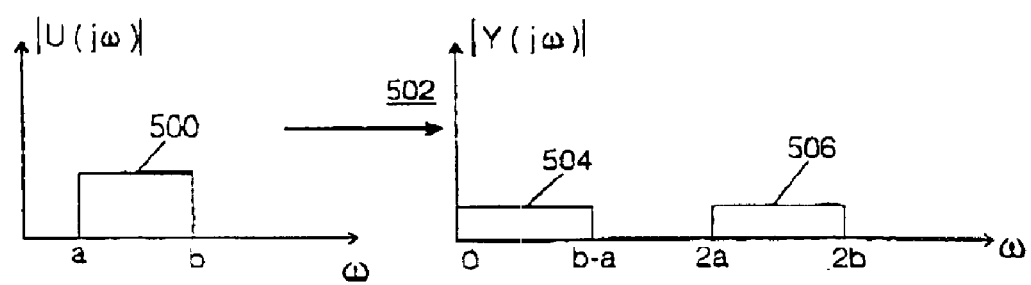
FIG. 5 illustrates a further energy transformation in which energy is distributed over a wider frequency band.

(b) If the objective of the energy transformation and hence the desired non-linear system is only to distribute energy of the signal to be processed over a wider frequency band without energy amplification then a simpler model may be sufficient. Referring to FIG. 5, there is shown schematically an input signal 500 in the frequency domain comprising energy between frequencies a and b. The desired output frequency spectrum 502 comprises two portions, a lower frequency portion 504 and a higher frequency portion 506. It will be appreciated that the energy of the input signal 500 is to be spread over the two frequency ranges 504 and 506.

A quadratic filter, for example, $$y(k) = \alpha \, u^2(k)$$

can be designed to redistribute energy of the original signal u(k), with frequency components over the frequency band [a,b], to the new ranges [0, b-a] and [2*a*,2*b*] without energy amplification provided an appropriate α is selected in the design process described above.

(vi) The final step in the design process is to materially realise, that is, to physically realise the designed filter using appropriate software or hardware or combination of software and hardware.

Although the present invention has been described above with reference to a NARX model, it will be appreciated that the present invention is not limited thereto. The method and realisation of non-linear systems having pre-determinable frequency or energy transfer characteristics can equally well be utilised using other forms of descriptions of non-linear systems or models where there exists a requirement to transform or transfer energy at one frequency or band of frequencies to energy at another frequency or band of frequencies.

The present invention can be used to realise energy transformations over frequencies using a nonlinear system or to modify energy transformation of an existing linear or non-linear system.

Furthermore, the present invention can be applied or utilised in the field of design and realisation of electronic circuits or filters. The energy in the input signal at a particular frequency or band of frequencies is transferred to desired frequency bands. Similarly, in mechanical systems, the addition of non-linear mechanisms could transfer the energy of a vibration at an undesirable frequency to some other frequency. The present invention may also find application in the field of fluid mechanics, for example, in the effects of flow around objects (e.g. oil platform legs), noise in ducting and pipe flow systems.

Alternatively, the modifications which are required to be effected to a known linear or non-linear system, for example, a mechanical system, in order to bring about a particular frequency distribution of energy can be determined using the present invention and then the linear or non-linear system can be so modified.

II. EXAMPLES

II.1 DESIGNS 1

Design No.1 shows an example of how the energy of an input signal having predetermined frequency components can be transferred to other frequencies.

Consider digitally filtering an input signal $$u(t) = \cos t + \cos 2t, \tag{14}$$

wherein the sampling period is $T=1/100$ s.

The first step is to determine the frequency spectrum of the signal to be processed. The frequency spectrum of the signal to be processed comprises input frequencies $$w_{a1}=1 \text{ and } w_{a2}=2.$$

The second step is to specify the output frequency characteristics of the filter. Two different filtering problems will be considered for this example.

The specification for the first problem is to transfer the energy in u(t) to the output frequency $w_{ao}=0$ and the specification for the second problem is to transfer the energy in u(t) to the output frequency $w_{ao}=4$.

Since the sampling period is $T=1/100$ s, the digital input to the filter is $$u(k) = \cos\frac{1}{100}k + \cos\frac{2}{100}k \text{ for } k = 0, 1, \ldots, \tag{15}$$

the normalised input frequencies are therefore $$w_{d1}=1/100 \text{ and } w_{d2}=2/100,$$

and the required normalised output frequencies are $w_{do}=0$ for the first filtering problem and $w_{do}=4/100$ for the second filtering problem.

For this example, the output frequencies produced by the nth-order nonlinearity of a non-linear filter are distributed uniformly in $$f_{Ya} = \begin{cases} \bigcup_{j=0}^{\lambda'-1} I_j & \text{when } \frac{nb}{(a+b)} - \left[\frac{na}{(a+b)}\right] < 1 \\ \bigcup_{j=0}^{\lambda'} I_j & \text{when } \frac{nb}{(a+b)} - \left[\frac{na}{(a+b)}\right] \geq 1 \end{cases} \tag{16}$$

where $$a = \frac{1}{100}, b = \frac{2}{100},$$

[x] means to take the integer part of x, and $$i' = \left[\frac{nb}{(a+b)}\right] + 1,$$

$$I_j = [na - j(a+b), nb - j(a+b)] \text{ for } j = 0, \ldots, i'-1,$$

$$I_{i'} = [0, nb - i'(a+b)],$$

with the difference between any two neighbouring frequencies being $$\Delta = \frac{2}{100} - \frac{1}{100} = \frac{1}{100}.$$

For n=1, it can be evaluated from the above equations that $$f_{Y1} = \left[\frac{1}{100}, \frac{2}{100}\right] \tag{17}$$

and the corresponding output frequencies are $$\left\{\frac{1}{100}, \frac{2}{100}\right\}$$

For n=2, it can be similarly obtained that $$f_{Y2} = I_D \cup I_1 = \left[\frac{2}{100}, \frac{4}{100}\right] \cup \left[0, \frac{4}{100} - \frac{3}{100}\right] = \left[\frac{2}{100}, \frac{4}{100}\right] \cup \left[0, \frac{1}{100}\right]$$

and the corresponding output frequencies are $$\left\{0, \frac{1}{100}, \frac{2}{100}, \frac{3}{100}, \frac{4}{100}\right\}$$

Therefore, a NARX model of up to second order nonlinearity will be sufficient to realise the energy transformations required by the filtering example thereby addressing the third step in the design process.

According to the above analysis, select a NARX model of the form $$y(k) = \sum_{k_1=1}^{K_1} c_{10}(k_1) y(k-k_1) + \sum_{k_1=0}^{K_2} \sum_{k_3=0}^{K_1} c_{02}(k_1, k_2) u(k-k_1) u(k-k_2) \tag{18}$$

as the basic structure for the non-linear filter and take $K_2=1$ for simplicity. The parameters $K_1$, $c_{10}(1)$, ... $c_{10}(K_1)$ and $c_{02}(k_1,k_2)$, $k_1=0, 1$ and $k_2=0, 1$, then need to be determined to completely specify the design.

In order to derive the procedures for determining these parameters, consider the frequency domain characteristics of the filter model (18). According to J. C. Peyton Jones and S. A. Billings, Recursive Algorithm for Computing the Frequency Response of a Class of Non-linear Difference Equation Models, Int. J. Control, 1989, Vol. 50, No. 5, 1925–1940, the generalised frequency response functions of this filter model are $$\begin{cases} H_2(jw) = 0 \\ H_2(jw_1, jw_2) = \dfrac{\sum_{k_1=0}^{1}\sum_{k_2=0}^{1} c_{02}(k_1, k_2)\exp[-j(w_1 k_1 + w_2 k_2)]}{\left[1 - \sum_{k_1=1}^{K_1} c_{10}(k_2)\exp[-j(w_1+w_2)k_1]\right]} \\ H_n(jw_1, \cdots, jw_n) = 0 \text{ for } n \geq 3 \end{cases} \tag{19}$$

The output frequency response of the filter (18) under the input $$u(k) = \cos\frac{1}{100}k + \cos\frac{2}{100}k = \sum_{i=-k, i\neq 0}^{K} \frac{A(w_i)}{2}e^{jw_i t}, \quad (20)$$

$$w_i = \frac{i}{100},$$

$$\tilde{Y}(jw) = \sum_{n=1}^{W} \tilde{Y}_n(jw) = \quad (21)$$

$$\tilde{Y}_2(jw) = \begin{cases} \frac{1}{2}\sum_{w_{i_1}+w_{i_2}=w} A(w_{i_1})A(w_{i_2})H_2(jw_{i_1}, jw_{i_2}) & \text{for } w > 0 \\ \frac{1}{2}\sum_{w_{i_1}+w_{i_2}=w} A(w_{i_1})A(w_{i_2})H_2(jw_{i_1}, jw_{i_2}) & \text{for } w = 0 \end{cases}$$

where $i_1, i_2 \in \{-2,-1,+1,+2\}$, $\tilde{Y}(jw)$ is related to the output spectrum $Y(jw)$ by $$\tilde{Y}(jw) = \begin{cases} 2Y(jw) & \text{for } w > 0 \\ Y(jw) & \text{for } w = 0 \end{cases}$$

and, similarly, $\tilde{Y}_n(jw)$ is related to the nth-order output spectrum $Y_n(jw)$ by $$\tilde{Y}(jw) = \begin{cases} 2Y_n(jw) & \text{for } w > 0 \\ Y_n(jw) & \text{for } w = 0 \end{cases}$$

This is a specific form of the general expression for output frequency responses of non-linear systems which are given by $$Y(jw) = \sum_{n=1}^{N} Y_n(jw) \text{ where} \quad (22)$$

$$Y_n(jw) = \frac{1/\sqrt{n}}{(2\pi)^{n-1}}\int_{w_i+\cdots+w_n=w} H_n(jw_i, \cdots, jw_n)\prod_{n=1}^{n} U(jw_{i_n})d\sigma_v \quad (23)$$

with $$\int (\cdot) d\sigma_w$$

$w_1+, \ldots, +w_n=w$ denoting an integration over the nth-dimensional hyperplane $w_1+, \ldots, +w_n=w$ and N being the maximum order of the dominant system nonlinearities.

Substituting (19) into (21) yields $$\tilde{Y}(jw) = \frac{1}{2}\sum_{w_{i_1}+w_{i_2}=w} A(w_{i_1})A(w_{i_2}) \quad (24)$$

$$\frac{\sum_{k_1=0}^{1}\sum_{k_2=0}^{1} c_{02}(k_1,k_2)\exp[-j(w_{i_1}k_1 + w_{i_2}k_2)]}{\left[1 - \sum_{k_1=1}^{K_1} c_{10}(k_1)\exp[-j(w_{i_1}+w_{i_2})k_1]\right]} =$$

$$\frac{1}{1 - \sum_{k_1=1}^{K_1} c_{10}(k_1)\exp[-jwk_1]}\sum_{k_1=0}^{1}\sum_{k_2=0}^{1} c_{02}(k_1,k_2)\frac{1}{2}$$

$$\sum_{w_{i_1}+w_{i_2}=w} A(w_{i_1})A(w_{i_2})\exp[-j(w_{i_1}k_1 + w_{i_2}k_2)] =$$

$$H(jw)\sum_{k_1=0}^{1}\sum_{k_2=0}^{1} c_{02}(k_1,k_2)f(w,k_1,k_2) \text{ for } w > 0 \text{ and}$$

$$\tilde{Y}(jw) = H(jw)\sum_{k_1=0}^{1}\sum_{k_2=0}^{1} c_{02}(k_1,k_2)\frac{f(w,k_1,k_2)}{2} \text{ for } w = 0 \text{ where} \quad (25)$$

$$H(jw) = \frac{1}{1 - \sum_{k_1=1}^{K_1} c_{10}(k_1)\exp[-jwk_1]} \quad (26)$$

$$f(w,k_1,k_2) = \frac{1}{2}\sum_{w_{i_1}+w_{i_2}=w} A(w_{i_1})A(w_{i_2})\exp[-j(w_{i_1}k_1 + w_{i_2}k_2)] \quad (27)$$

Moreover denoting $$\overline{Y}(jw) = \begin{cases} \sum_{k_1=0}^{1}\sum_{k_2=0}^{1} c_{02}(k_1,k_2)f(w,k_1,k_2) & \text{for } w > 0 \\ \sum_{k_1=0}^{1}\sum_{k_2=0}^{1} c_{02}(k_1,k_2)\frac{f(w,k_1,k_2)}{2} & \text{for } w = 0 \end{cases} \quad (28)$$

given $$\tilde{Y}(jw) = H(jw)\overline{Y}(jw), \quad w \geq 0 \quad (29)$$

In view of the fact that $H(jw)$ is the frequency response function of a classical linear filter and $\overline{Y}(jw)$ is a linear function of the filter parameters $c_{02}(k_1,k_2)$, $k_1=0, 1$ and $k_2 0, 1$, the procedures for determining the parameters of the non-linear filter with the given design requirements and the structure (18) are given as:

(a) From the design requirements, determine the desired output frequency characteristic $\hat{Y}^+(jw)$ and choose the parameters $c_{02}(k_1,k_2)$, $k_1=0, 1$ and $k_2=0, 1$, appropriately to make $\overline{Y}(jw)$ approximate $\hat{Y}^+(jw)$ as well as possible.

(b) Examine the filtering effect of $$\bar{y}(k) = \sum_{k_1=0}^{1} \sum_{k_2=0}^{1} \bar{c}_{02}(k_1, k_2) u(k - k_2) u(k - k_2), \quad (30)$$

where $\hat{c}_{02}(k_1,k_2)$, $k_1=0,1$, $k_2=0,1$, are the results obtained in the procedure (a). If the effect is acceptable, then choose $H(jw)=1$ so that the filter parameters $c_{10}(1)=c_{10}(2)=,\ldots,=c_{10}(K_1)=0$; otherwise design the classical linear filter $H(jw)$ to make $H(jw)\bar{Y}(jw)$ satisfy the requirements for the output frequency characteristics and obtain the filter parameters $K_1, c_{10}(1), c_{10}(2), \ldots, c_{10}(K_1)$ at the same time.

Therefore, in order to address the first problem to transfer energy from u(t), $w_{a1}=1$ and $w_{a2}=2$, to the output frequency $w_{a0}=0$, take $$\tilde{Y}^*(j0) = 1, \tilde{Y}^*(jw_i) = 0, w_i = \frac{i}{100}, i = 1, 2, 3, 4.$$

and for the second problem to transfer energy from u(t), $w_{a1}=1$ and $w_{a2}=2$, to the output frequency $w_{a0}=4$, take $$\tilde{Y}^*\left(j\frac{4}{100}\right) = 1, \tilde{Y}^*(jw_i) = 0, w_i = \frac{i}{100}, i = 1, 2, 3, 0.$$

The filter parameters $\hat{c}_{02}(k_1,k_2)$, $k_1=0,1$, $k_2=0,1$, can then be determined through the group equations $$\begin{cases} \text{Re}[Y^*(j0)] = \sum_{k_1=0}^{1}\sum_{k_2=0}^{1} c_{02}(k_1,k_2) \frac{f^R(0, k_1, k_2)}{2} \\ \vdots \\ \text{Re}\left[\tilde{Y}^*\left(j\frac{4}{100}\right)\right] = \sum_{k_1=0}^{1}\sum_{k_2=0}^{1} c_{02}(k_1,k_2) f^R\left(\frac{4}{100}, k_1, k_2\right) \\ \text{Im}[Y^*(j0)] = \sum_{k_1=0}^{1}\sum_{k_2=0}^{1} c_{02}(k_1,k_2) \frac{f^I(0, k_1, k_2)}{2} \\ \vdots \\ \text{Im}\left[\tilde{Y}^*\left(j\frac{4}{100}\right)\right] = \sum_{k_1=0}^{1}\sum_{k_2=0}^{1} c_{02}(k_1,k_2) f^I\left(\frac{4}{100}, k_1, k_2\right) \end{cases} \quad (31)$$

by the least square's method. In (31) $f^R(\cdot)$ and $f^I(\cdot)$ represent the real and imaginary parts of $f(\cdot)$.

Rewrite (31) as $$\tilde{Y} = \bar{X}\theta \text{ where} \quad (32)$$

$$Y = \left[\text{Re}[\tilde{Y}^*(j0)], \cdots, \text{Re}\left[\tilde{Y}^*\left(j\frac{4}{100}\right)\right], \text{Im}[\tilde{Y}^*(j0)], \cdots, \text{Im}\left[\tilde{Y}^*\left(j\frac{4}{100}\right)\right]\right]^T \quad (33)$$

-continued $$\theta = [c_{02}(0, 0), c_{02}(1, 1), c_{02}(0, 1) + c_{02}(1, 0)]^T \quad (34)$$

$$\bar{x} = \begin{bmatrix} \frac{f^R(0,0,0)}{2} & \frac{f^R(0,1,1)}{2} & \frac{f^R(0,0,1)}{2} \\ \vdots & \vdots & \vdots \\ f^R\left(\frac{4}{100},0,0\right), & f^R\left(\frac{4}{100},1,1\right), & f^R\left(\frac{4}{100},0,1\right), \\ \frac{f^I(0,0,0)}{2} & \frac{f^I(0,1,1)}{2} & \frac{f^I(0,0,1)}{2} \\ \vdots & \vdots & \vdots \\ f^I\left(\frac{4}{100},0,0\right), & f^I\left(\frac{4}{100},1,1\right), & f^I\left(\frac{4}{100},0,1\right), \end{bmatrix}$$

$$= \begin{bmatrix} \frac{4}{2} & \frac{4}{2} & \sum_{i=-2}^{2} \frac{\cos\frac{i}{100}}{2} \\ 2 & 2\cos\frac{1}{100} & \cos\frac{2}{100}+\cos\frac{1}{100} \\ 1 & \cos\frac{2}{100} & \cos\frac{1}{100} \\ 2 & 2\cos\frac{3}{100} & \cos\frac{1}{100}+\cos\frac{2}{100} \\ 1 & \cos\frac{4}{100} & \cos\frac{2}{100} \\ \frac{0}{2} & \frac{0}{2} & \sum_{i=-2}^{2} \frac{\sin\frac{1}{100}}{2} \\ 0 & -2\sin\frac{1}{100} & \sin\frac{1}{100}-\sin\frac{2}{100} \\ 0 & -\sin\frac{2}{100} & -\sin\frac{1}{100} \\ 0 & -2\sin\frac{3}{100} & -\sin\frac{1}{100}-\sin\frac{2}{100} \\ 0 & -\sin\frac{4}{100} & -\sin\frac{2}{100} \end{bmatrix}.$$

Notice that θ can be written in the form of (34) due to the fact that $$f(w;0,1) = f(w;1,0). \quad (36)$$

Therefore, the filter parameters θ for the first filtering problem to transfer energy from u(t), $w_{a1}=1$ and $w_{a2}=2$, to the output frequency $w_{a0}=0$ can be obtained as $$\hat{\theta}_1 = (\bar{X}^t \bar{X})^{-1} \bar{X}^t \tilde{Y}_1 \quad (37)$$

$$\tilde{Y}_1 = \left[1, \overbrace{0, \cdots, 0}^{4}, \overbrace{0, \cdots, 0}^{5}\right]^T, \quad (38)$$

and the parameters θ for the second filtering problem to transfer energy from u(t), $w_{a1}=1$ and $w_{a2}=2$, to the output frequency $w_{a0}=4$ can be obtained as $$\hat{\theta}_2 = (\bar{X}^t \bar{X})^{-1} \bar{X}^t \tilde{Y}_2 \quad (39)$$

where $$\tilde{Y}_2 = \left[\overbrace{0, \cdots, 0}^{4}, \overbrace{0, \cdots, 0}^{5}\right]^T. \quad (40)$$

The results of computing (37) and (39) are $$\hat{\theta}_1 \begin{bmatrix} \hat{c}_{02}^1(0,0) \\ \hat{c}_{02}^1(1,1) \\ \hat{c}_{02}^1(0,1) + \hat{c}_{02}^1(1,0) \end{bmatrix} = \begin{bmatrix} 1187 \\ 1187 \\ -2373.8 \end{bmatrix} \text{ and} \quad (41)$$

$$\hat{\theta}_2 \begin{bmatrix} \hat{c}_{02}^2(0,0) \\ \hat{c}_{02}^2(1,1) \\ \hat{c}_{02}^2(0,1) + \hat{c}_{02}^2(1,0) \end{bmatrix} = \begin{bmatrix} -1206.2 \\ -1206.2 \\ 2413.2 \end{bmatrix} \quad (42)$$

respectively.

Figure 6:
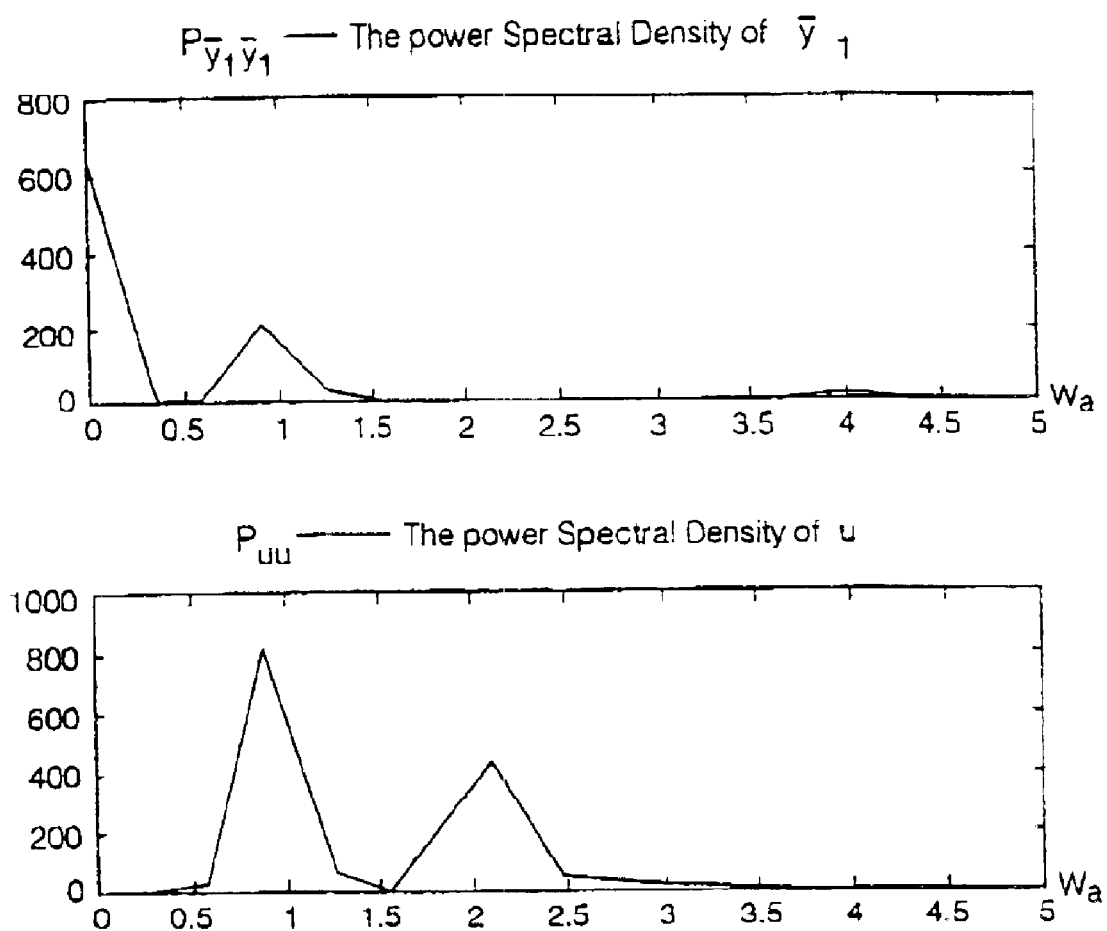
FIG. 6 illustrates the power spectral densities for the input and output signals of a designed nonlinear system.
Figure 7:
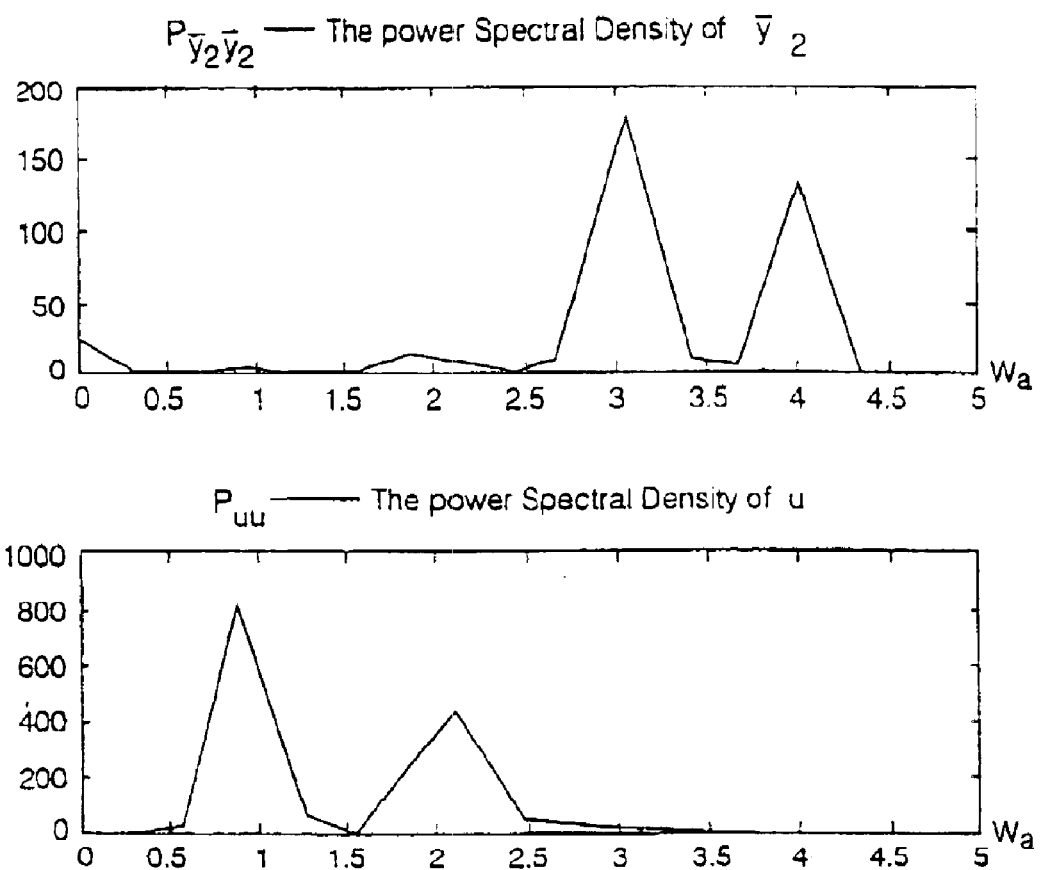
FIG. 7 illustrates the power spectral densities for the input and output signals of another designed nonlinear system.

Under the input of (20), the power spectral densities of the input and output of the non-linear filter $$\bar{y}_1(k) = \sum_{k_1=0}^{1} \sum_{k_2=0}^{1} \hat{c}_{02}^1(k_1, k_2) u(k-k_1) u(k-k_2) = \hat{c}_{02}^1(0,0) u^2(k) + \quad (43)$$

$$\hat{c}_{02}^1(1,1) u^2(k-1) + [\hat{c}_{02}^1(1,0) + \hat{c}_{02}^1(0,1)] u(k-1) u(k)$$

which is initially designed to address the first filtering problem above, are shown in FIG. 6, and the power spectral densities of the input and output of the non-linear filter $$\bar{y}_2(k) \sum_{k_1=0}^{1} \sum_{k_2=0}^{1} \bar{c}_{02}^2(k_1, k_2) u(k-k_1) u(k-k_2) = \hat{c}_{02}^2(0,0) u^2(k) + \quad (44)$$

$$\hat{c}_{02}^2(1,1) u^2(k-1) + [\hat{c}_{02}^2(1,0) + \hat{c}_{02}^2(0,1)] u(k-1) u(k)$$

which is initially designed to address the second filtering problem above, are shown in FIG. 7.

Further improvement to the performances of the filters (43) and (44) may be possible. Therefore, a linear filter, H(jw), is designed in order to further improve the filter performances.

To improve the performance of the filter (43) for the first filtering problem, H(jw) is designed to be a fifth order low-pass type 1 Chebyshev filter with cut off frequency 0.5 rad/sec and 0.5 dB of ripple in the pass-band to ensure a satisfactory frequency response over the pass band. The result is $$H_1(jw) = \frac{b^1(1) + b^1(2)z^{-1} + \cdots + b^1(6)z^{-5}}{1 - a^1(2)z^{-1} - \cdots - a^1(6)z^{-5}} \bigg|_{z=e^{jw}} = \quad (45)$$

$$10^{-12} \frac{\begin{array}{c} 0.0174 + 0.0853z^{-1} + 0.1812z^{-2} + \\ 0.1652z^{-3} + 0.0933z^{-4} + 0.0159z^{-5} \end{array}}{\begin{array}{c} 1 + 4.49941z^{-1} - 9.9765z^{-2} + \\ 9.9648z^{-3} - 4.9766z^{-4} + 0.9942z^{-5} \end{array}} \bigg|_{z=e^{jw}}$$

To improve the performance of the filter (44) for the second problem, H(jw) is designed to be a fifth order high-pass type 1 Chebyshev filter with cut off frequency 3.9 rad/sec and 0.5 dB of ripple in the pass band for the same purpose as in the first problem case. The result is $$H_2(jw) = \frac{b^2(1) + b^2(2)z^{-1} + \cdots + b^2(6)z^{-5}}{1 - a^2(2)z^{-1} - \cdots - a^2(6)z^{-5}} \bigg|_{z=e^{jw}} = \quad (46)$$

$$\frac{\begin{array}{c} 0.9218 - 4.6088z^{-1} + 9.2175z^{-2} - \\ 9.2175z^{-3} + 4.6088z^{-4} - 0.9218z^{-5} \end{array}}{\begin{array}{c} 1 + 4.8381z^{-1} - 9.3635z^{-2} + \\ 9.0613z^{-3} - 4.3846z^{-4} + 0.8486z^{-5} \end{array}} \bigg|_{z=e^{jw}}$$

The purpose of the additional linear filter is to attenuate unwanted frequency components in the outputs of the filters (43) and (44) for the above two filtering problems respectively to make the output of the additional filter satisfy the corresponding design requirement.

It will be appreciated that the filter parameters $K_1$, $c_{10}(1), \ldots, c_{10}(K_1)$, associated with the expression $$\left\{1 - \sum_{k_1=1}^{K_1} c_{10}(k_1) \exp[-jwk_1]\right\}$$

in H(jw) can be obtained as a result of dividing the denominator of H(jw) by the numerator of H(jw). The specific H(jw) is given by $H_1(jw)$ and $H_2(jw)$ in equations (45) and (46) for the two filtering problems respectively.

The general description for the nonlinear filters designed as above is $$y(k) - \sum_{k_1=1}^{K_1} c_{10}(k_1) y(k-k_1) = \left[1 - \sum_{k_1=1}^{K_1} c_{10}(k_1) q^{-k_1}\right] y(k) = \quad (47)$$

$$\overline{H}(q^{-1}) y(k) = \sum_{k_1=0}^{K_1} \sum_{k_2=0}^{K_2} c_{02}(k_1, k_2) u(k-k_1) u(k-k_2) =$$

$$\sum_{k_1=0}^{K_1} \sum_{k_2=0}^{K_2} c_{02}(k_1, k_2) q_1^{-k_1} q_2^{-k_2} u(k) \text{ where}$$

$$\overline{H}(q^{-1}) = \left(1 - \sum_{k_1=1}^{K_1} c_{10}(k_1) q^{-k_1}\right), \quad (48)$$

and $q^{-1}$, $q_1^{-1}$ and $q_2^{-1}$ denote the backward shift operators. Another expression in the time domain for (47) is $$y(k) = \overline{H}^{-1}(q^{-1}) \left[\sum_{k_1=0}^{K_1} \sum_{k_2=0}^{K_2} c_{02}(k_1, k_2) q_1^{-k_1} q_2^{-k_2}\right] u(k) \quad (49)$$

Therefore, embodiments of the non-linear filters which have been designed can be realised in a manner as shown in FIG. 8 or more specifically as shown FIG. 9.

It will be appreciated that in FIG. 8 the two components 800 and 802 are represented by $$G_1(q_1^{-1}, q_2^{-1}) = \sum_{k_1=0}^{1} \sum_{k_2=0}^{1} c_{02}(k_1, k_2) q_1^{-k_1} q_2^{-k_2} \text{ and}$$

$$G_2(q^{-1}) = \overline{H}^{-1}(q^{-1}) = \frac{b(1) + b(2)q^{-1} + \cdots + b(6)q^{-5}}{1 - a(2)q^{-1} - \cdots - a(6)q^{-5}}$$

For the first filtering problem in this example $$G_1(q_1^{-1}, q_2^{-1}) = \sum_{k_1=0}^{1}\sum_{k_2=0}^{1} \hat{c}_{02}^2(k_1,k_2) q_1^{-k_1} q_2^{-k_2}$$

with $\hat{c}_{02}^1(k_1,k_2)$'s given by (41) and $$G_2(q^{-1}) = \frac{b^1(1)+b^1(2)q^{-1}+\cdots+b^1(6)q^{-5}}{1-a^1(2)q^{-1}-\cdots-a^1(6)q^{-5}}$$

with $b^1(i)$'s and $a^1(i)$'s given by (45).

For the second filtering problem in this example $$G_1(q_1^{-1}, q_2^{-1}) = \sum_{k_1=0}^{1}\sum_{k_2=0}^{1} \hat{c}_{02}^2(k_1,k_2) q_1^{-k_1} q_2^{-k_2}$$

with $\hat{c}_{02}^2(k_1,k_2)$'s given by (42) and $$G_2(q^{-1}) = \frac{b^2(1)+b^2(2)q^{-1}+\cdots+b^2(6)q^{-5}}{1-a^2(2)q^{-1}-\cdots-a^2(6)q^{-5}}$$

with $b^2(i)$'s and $a^2(i)$'s given by (46).

Figure 10:
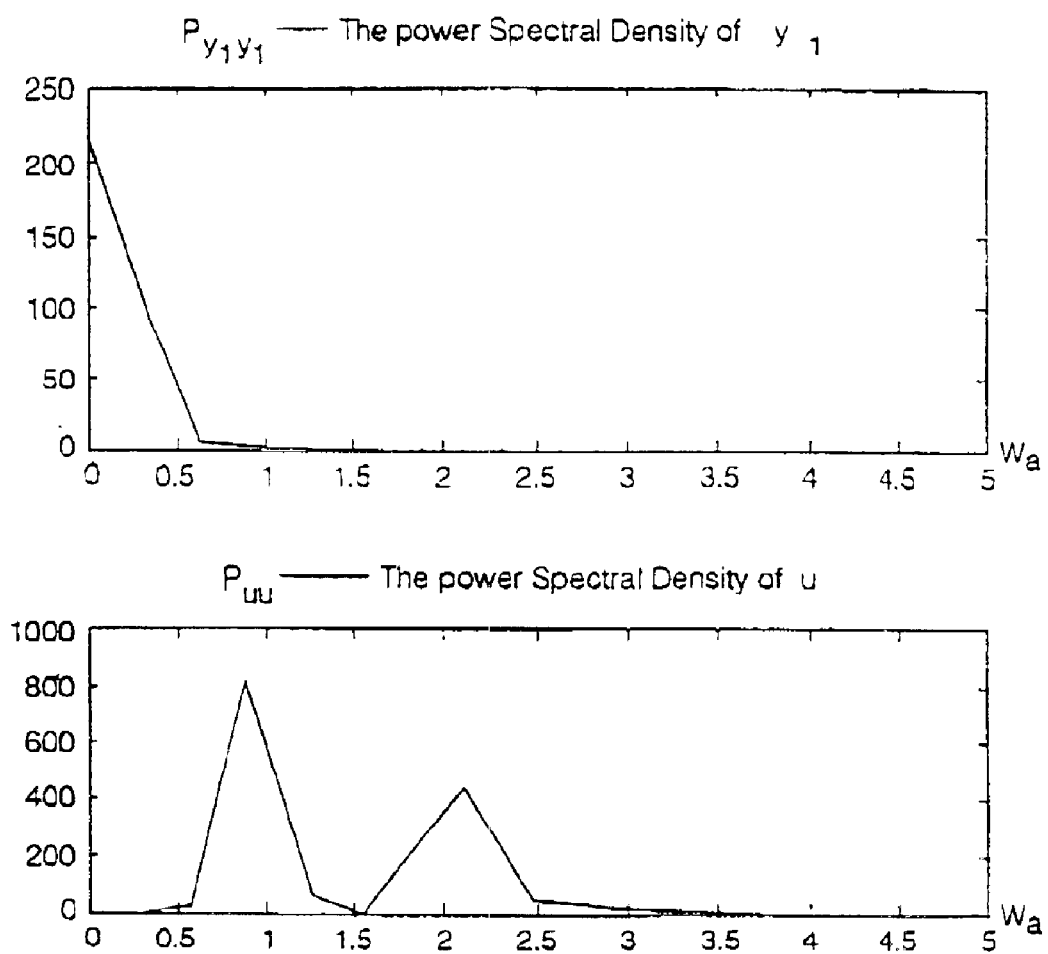
FIG. 10 illustrates the power spectral densities for the input and output signals of the nonlinear system which was obtained using a design which improves the filtering effect shown in FIG. 6.
Figure 11:
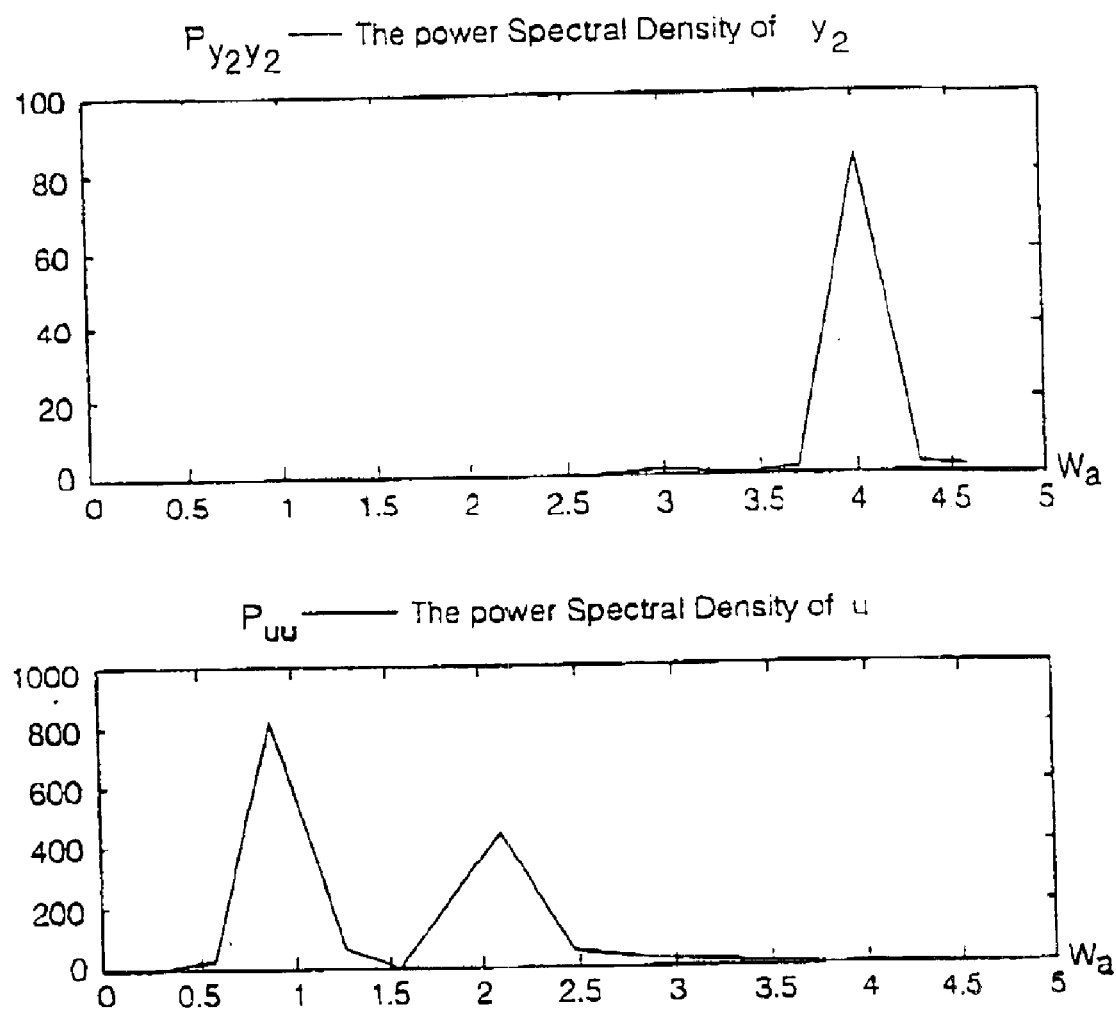
FIG. 11 illustrates the power spectral densities for the input and output signals of the nonlinear system which was obtained using a design which improves the filtering effect shown in FIG. 7.
Figure 12:
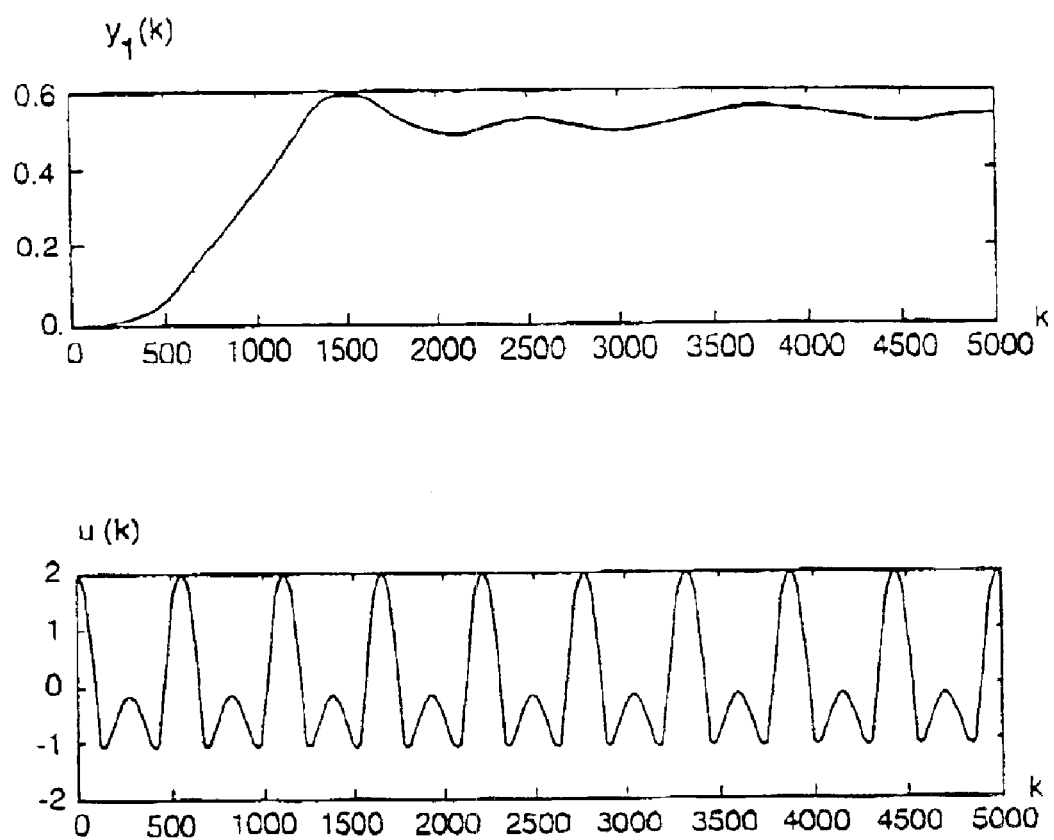
FIG. 12 shows the time domain input and output of the nonlinear system with the frequency domain filtering effect shown in FIG. 10.
Figure 13:
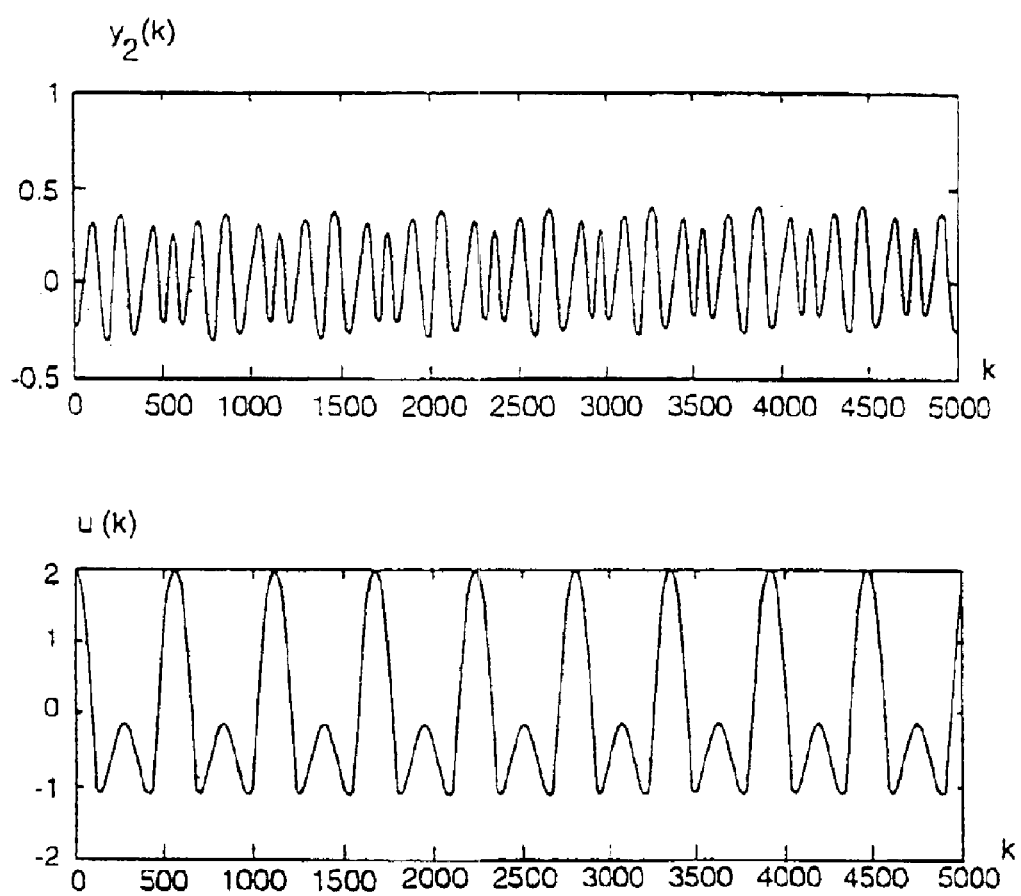
FIG. 13 shows the time domain input and output of the nonlinear system with the frequency domain filtering effect shown in FIG. 11.

Referring to FIGS. 10 and 11, there is shown the filtering effects of the filters designed to address the two filtering problems. FIG. 10 shows the power spectrum densities of the output and input of the nonlinear filter which is finally obtained for the first filtering problem. FIG. 11 shows the power spectrum densities of the output and input of the nonlinear filter which is finally obtained for the second filtering problem. The effects of the filtering in the time domain of the two filters are shown in FIGS. 12 and 13. All the responses indicate that the filters substantially satisfy the design requirements.

II.2 DESIGN 2

Design No. 2 illustrates the detailed procedure and several examples for designing a non-linear system for transferring the energy of a signal from a first predeterminable frequency or range of frequencies to a second predeterminable frequency or range of frequencies such that the output frequency response of the nonlinear system so designed is within specified bounds.

II.2.1 Detailed Procedure (1) Given u(t), the signal to be processed in the time or spatial domain, the frequency band [c,d] to which the energy of u(t) is to be transferred, and the user specified bound $Y^{B*}(w)$ for the output spectrum Y(jw) over [c,d] for the design.

(2) Sample the time or spatial domain signal u(t) with sampling interval T to yield a discrete series {u(k)} and perform a Fast Fourier Transform (FFT) on the series to compute the spectrum U(jw) of u(t) as $$U\left(j\frac{2\pi}{MT}l\right) = TU_d\left(j\frac{2\pi}{M}l\right), l = -\left(\frac{M}{2}-l\right),\cdots, 0, \cdots, \frac{M}{2}$$

where $U_d[j(\cdot)]$ is the result of the FFT operating on {u(k)} and M is the length of the data used to perform the FFT. M is taken as an even number for convenience.

(3) Evaluate the range [a,b] of frequencies in u(t) as $$b = \frac{2\pi}{MT}l_b, a = \frac{2\pi}{MT}l_a$$

where $1_b$ is an integer such that $$\left|U\left(j\frac{2\pi}{MT}l_b\right)\right| \geq 0.05, \left|U\left(j\frac{2\pi}{MT}l\right)\right| < 0.05 \text{ for } l \in \left\{(l_b+1),\cdots,\frac{M}{2}\right\}$$

and $1_a$ is an integer such that $$\left|U\left(j\frac{2\pi}{MT}l_a\right)\right| \geq 0.05, \left|U\left(j\frac{2\pi}{MT}l\right)\right| < 0.05 \text{ for } l \in \{0,\cdots,(l_a-1)\}$$

(4) The relationship between the bound of the output spectrum $Y^B(w)$, the coefficients of the NARX model $$y(k) = \sum_{n=1}^{N} y_n(k)$$

$$y_n(k) = \begin{cases} \sum_{l_1=1}^{K_n}\cdots\sum_{l_n=1}^{K_n} c_{0n}(l_1,\cdots,l_n)\prod_{l=1}^{n} u(k-l_l) & \text{for } n \geq 2 \\ \sum_{l_i=1}^{K_1} c_{10}(l_i)y(k-l_i) + \sum_{l_i=1}^{K_1} c_{01}(l_i)u(k-l_i) & \text{for } n = 1 \end{cases}$$

and the spectrum U(jw) is given by $$Y^B(w) = \frac{1}{\left|1-\sum_{l=l_i}^{K_1} c_{10}(l_i)\exp(-jwl_i)\right|}$$

$$\sum_{n=N_0}^{N}\frac{1}{(2\pi)^{(n-1)}}\left[\sum_{l_1=1}^{K_n}\cdots\sum_{l_n=1}^{K_n}|c_{0n}(l_1,\cdots,l_n)|\right]\frac{|U|*\cdots*|U(jw)|}{n} =$$

$$\frac{1}{\left|1-\sum_{l=l_i}^{K_1} c_{10}(l_i)\exp(-jwl_i)\right|}\sum_{n=N_0}^{N}\frac{1}{(2\pi)^{(n-1)}}c_3\frac{|U|*\cdots*|U(jw)|}{n}$$

where $$C_n = \sum_{l_1=1}^{K_n}\cdots\sum_{l_n=1}^{K_n}|C_{0n}(l_1,\ldots,l_n)|, \quad n=N_0,\ldots,N$$

are parameters associated with the NARX model parameters $K_n, c_{0n}(l_i,\cdots,l_n), l_i = 1,\cdots,K_n,\cdots,l_n = 1,$ $\cdots, K_n, \text{ for } n = N_0,\cdots,N, \frac{|U|*\cdots*|U(jw)|}{n}$ denotes the n-dimensional convolution integration for the magnitude |U(jw)| of the spectrum U(jw), which is defined by $$\underbrace{|U|*\cdots*|U(jw)|}_{n} =$$

$$\int_{-\infty}^{\infty}\cdots\int_{-\infty}^{\infty}|U(jw_1)|\cdots|U[j(w-w_1-,\cdots,-w_{n-1})]|dw_1\cdots dw_{n-1}$$

and $N_0=1$ when the NARX model involves nonlinear terms from order 1 to N.

Based upon this expression, the structure parameters N and $N_0$ and the NARX model parameters are determined as below.

(i) Evaluate $$f_{Y_n} = \begin{cases} \bigcup_{i=1}^{i^*-1} I_i & \text{when } \frac{nb}{(a+b)} - \left[\frac{na}{(a+b)}\right] < 1 \\ \bigcup_{i=0}^{i^*} I_i & \text{when } \frac{nb}{(a+b)} - \left[\frac{na}{(a+b)}\right] \geq 1 \end{cases}$$

where [x] denotes the integer part of x, $$i^* = \left[\frac{na}{(a+b)}\right] + 1$$

$$I_i = [na - i(a+b), nb - i(a+b)], \text{ for } i = 0, \cdots, i^* - 1$$

$$I_{i^*} = [0, nb - i^*(a+b)]$$

for n=1,2, . . . until a value of n is reached such that part of the specified output frequency range [c,d] falls into $f_{Y_n}$. This value of n is used as the value of $N_0$.

(ii) Evaluate $$f_Y = f_{Y_n} \cup f_{Y_{n-1}}$$

for n=2,3, . . . until a value of n is reached such that the frequency range [c,d] falls completely within the corresponding $f_Y$. This value of n is taken as the value of N.

(iii) Calculate $$\underbrace{|U|*\cdots*|U(jw)|}_{n}$$

to yield $$\underbrace{|U|*\cdots*|U(j2\pi i/MT)|}_{n}, \text{ for } i = 0, \cdots, M/2$$

using the algorithm $$\begin{cases} \underbrace{|U|*\cdots*|U(j2\pi i/MT)|}_{n} = T\tilde{\tilde{U}}\left[i + \left(\frac{M}{2} - 1\right)n\right]\left(\frac{2\pi}{M}\right)^{(n-1)} i = 0, \cdots, \frac{M}{2} \\ \{\tilde{\tilde{U}}(0), \cdots, \tilde{\tilde{U}}[n(M-1)]\} = \underbrace{\text{Conv}\{[\tilde{U}(0), \cdots, \tilde{U}(M-1)], \cdots, [\tilde{U}(0), \cdots, \tilde{U}(M-1)]\}}_{n}, \\ \tilde{U}(i) = \left|U_n\left[j\frac{2\pi}{M}\left(i - \frac{M}{2} + 1\right)\right]\right|, i = 0, 1, \cdots, M-1 \end{cases}$$

for n=$N_0$, . . . ,N, where Conv(·) denotes the convolution operation and $\tilde{U}(·)$ and $\tilde{\tilde{U}}(·)$ represent the intermediate results of this algorithm.

(iv) Based on the ($i_d-i_c+1$) equations $$Y^{B*}\left(\frac{2\pi}{M}i\right) = \sum_{n=N_0}^{N} \frac{1}{(2\pi)^{(n-1)}} C_n \underbrace{|U|*\cdots*\left|U\left[j\left(\frac{2\pi i}{MT}\right)\right]\right|}_{n}, i = i_c, i_c^*+1, \cdots, i_d$$

where $i_c = \text{round}\left[\frac{cMT}{2\pi}\right]$, $i_d = \text{round}\left[\frac{dMT}{2\pi}\right]$, and round (x)

means to take the integer nearest to x, use a least squares routine to compute $C_n$, n=$N_0$, . . . ,N, under the constraint that the results must be positive, and then select the NARX model parameters $K_n, c_{0n}(1_1, \ldots, 1_n), 1_1=1, \ldots, K_n, \ldots, 1_n=1, \ldots, K_n$ for n=$N_0$, . . . ,N under the constraints on the summation of the modulus of the coefficients given by $$C_n = \sum_{l_1=1}^{K_n} \cdots \sum_{l_n=1}^{K_n} |c_{0n}(l_l, \cdots, l_n)|, n = N_0, \cdots, N$$

(v) If necessary, design a classical linear filter, for example, a band pass filter which ideally allows the frequency response to be unity over the frequency band [c,d] and zero beyond to yield the linear frequency characteristic $$\frac{1}{\left[1 - \sum_{l_1=1}^{K_1} c_{10}(l_l)\exp(-jwl_l)\right]}$$

and therefore determine the parameters associated with $K_1$, $c_{10}(1_1)$, $1_1=1, \ldots, K_1$. Otherwise, all of the parameters of $c_{10}(·)$ can be taken as zero to yield a model having no regression terms associated with the output.

(5) Construct a NARX model as shown in FIG. (14) using the results obtained in the above (iv) and (v). The nonlinear system illustrated in FIG. 14 comprises a nonlinear part 1400 and a linear part 1402. It will be appreciated in FIG. 14

$$\sum_{l_1,l_n=1}^{K_n} c_{0n}(l_1, \cdots, l_n) \prod_{i=1}^{n} u(k-l_i) =$$

$$\sum_{l_1=1}^{K_n} \cdots \sum_{l_n=1}^{K_n} c_{0n}(l_1, \cdots, l_n) \prod_{i=1}^{n} u(k-l_i)$$

II.2.2 Three Specific Examples
Example 1

This example illustrates a further implementation or design of a nonlinear system following the above detailed procedure.

Figure 15:
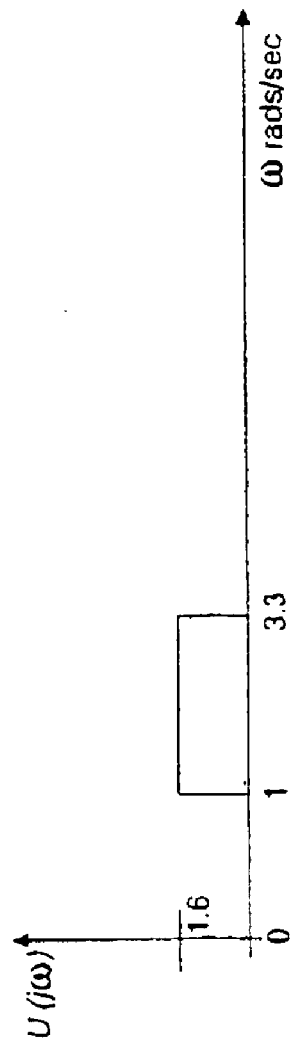
FIG. 15 illustrates the frequency spectrum of a signal to be processed using the present invention.

(1) The signal to be processed is given by $$u(t) = 2M_u \frac{1}{2\pi} \frac{\sin\alpha t - \sin\beta t}{t}$$

with $\alpha=3.3$, $\beta=1$, and $M_u=1.6$. The frequency spectrum $U(jw)$ of the signal is shown in FIG. 15 indicating that the real input frequency range is [1, 3, 3]. The requirement for the design is to transfer energy of the original signal to the frequency band $[c,d]=[5.6, 7.6]$ with the bound on the output spectrum magnitude specified to be $Y^{B+}(w)=1.6$ over this frequency band.

Figure 16:
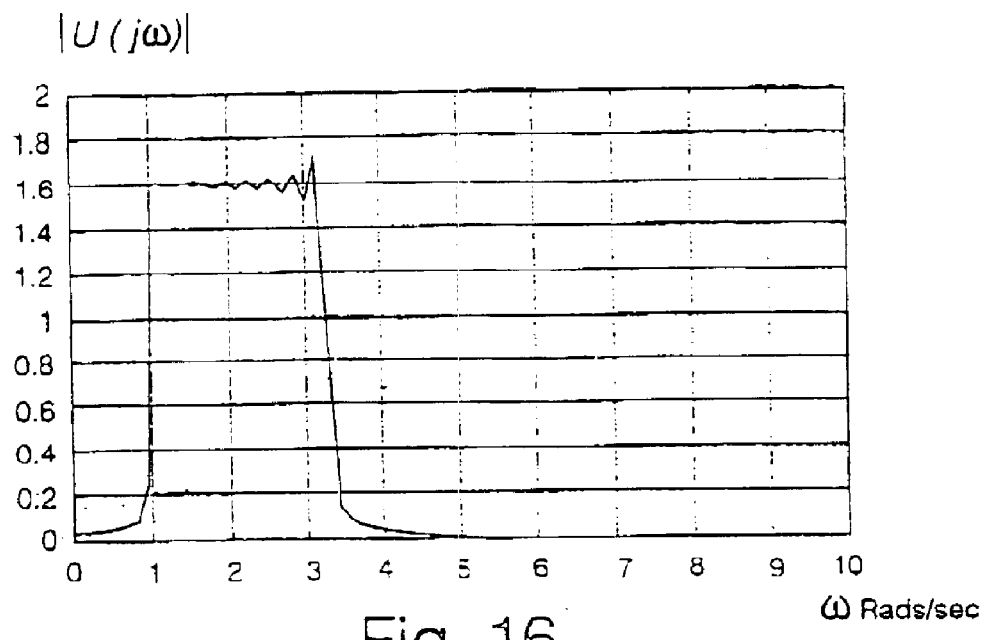
FIG. 16 illustrates the result of a Fast Fourier Transform of an input signal having the spectrum shown in FIG. 15.

(2) Sample $u(t)$ with sampling interval $T=0.01$ sec to produce $$u(k) =$$

$$2M_u \frac{1}{2\pi} \frac{\sin\alpha kT - \sin\beta kT}{kT} = 2 \times 1.6 \times \frac{1}{2\pi} \times \frac{\sin 3.3 \times 0.01k - \sin 0.01k}{0.01k}$$

$$k = -1999, \cdots, 0, \cdots, 2000$$

and perform a Fast Fourier Transform (FFT) on this series (M=4000) to compute $$U_d\left(j\frac{2\pi}{M}l\right) = U_d\left(j\frac{2\pi}{4000}l\right)$$

$$l = -1999, \cdots, 0, \cdots, 2000$$

and then to yield $$U\left(j\frac{2\pi}{MT}l\right) = U\left(j\frac{2\pi}{4000 \times 0.01}l\right) = 0.01 U_d\left(j\frac{2\pi}{4000}l\right)$$

$$l = -1999, \cdots, 0, \cdots, 2000$$

the result of which, in the nonnegative frequency range, is shown in FIG. 16.

Notice the difference between the real spectrum of $u(t)$ in FIG. 15 and the computed spectrum in FIG. 16. The differences are due to the errors caused by the FFT operation. The design should and will be performed based upon the computed spectrum to lead to more practical results.

(3) Evaluate the frequency range [a,b] of $u(t)$ from the computed spectrum giving $a=0.682$ $b=3.7699$ (4) Design the system structure and parameters
(i) Determination of $N_0$.
  Clearly, the output frequency range contributed by the linear part when the input frequencies are within $[a,b]=[0.6283, 3.7699]$ $f_{Y_1}=[a,b]=[0.6283, 3.7699]$ The frequency range $f_{y_2}$ produced by the second order nonlinearity in this case is obtained as follows.
Since n=2, $$\frac{nb}{(a+b)} - \left[\frac{na}{(a+b)}\right] = \frac{2 \times 3.7699}{(3.7699 + 0.6283)} - \left[\frac{2 \times 0.6283}{(3.7699 + 0.6283)}\right] =$$

$$1.7143 - [0.2857] = 1.7143 - 0 > 1 \text{ and}$$

$$i^* = \left[\frac{na}{(a+b)}\right] + 1 = \left[\frac{2 \times 0.6283}{3.7699 + 0.6283}\right] + 1 = [0.2857] + 1 = 0 + 1 = 1 \text{ So}$$

$$f_{Y_i} = \bigcup_{i=0}^{i^*} I_i =$$

$$\left\{\bigcup_{i=0}^{i^*-1} [na - i(a+b), rb - i(a+b)]\right\} \cup [0, rb - i^*(a+b)] = [na, nb] \cup [$$

$$0, rb - (a+b)] = [2 \times 0.6283, 2 \times 3.7699] \cup [0,$$

$$2 \times 3.7699 - (0.6283 + 3.7699)] = [1.2566, 7.5398] \cup [$$

$$0, 3.1416] = [0, 7.5398]$$

$f_{y_2}$ thereby obtained contains part of the specified output frequency range $[c,d]=[5.6, 7.6]$. So, $N_0$ is determined to be $N_0=2$.

(ii) Determination of N.
Evaluating $f_y=f_{Y_n} \cup f_{Y_{n-1}}$ for n=2 yields $f_{Y}|_{n=2}=f_{Y_2} \cup f_{Y_1}=[0, 7.5398] \cup [0.6283, 3.7699]=[0, 7.5398]$ To evaluate $f_{Y}|_{n=3}=f_{Y_3} \cup f_{Y_2}$, calculate $f_{Y_3}$ first. In this case $$\frac{nb}{(a+b)} - \left[\frac{na}{(a+b)}\right] = \frac{3 \times 3.7699}{(3.7699 + 0.6283)} - \left[\frac{3 \times 0.6283}{(3.7699 + 0.6283)}\right]$$

$$= 2.5714 - [0.4286] = 2.5714 - 0 > 1$$

$$i^* = \left[\frac{na}{(a+b)}\right] + 1 = \left[\frac{3 \times 0.6283}{3.7699 + 0.6283}\right] + 1 = [0.4286] + 1 = 0 + 1 = 1$$

So $f_{f_i} = \bigcup_{i=0}^{i^*} I_i = I_0 \cup I_i = [na, nb] \cup [0, nb - (a+b)]$ $$= [3 \times 0.6283, 3 \times 3.7699] \cup [0, 3 \times 3.7699 - (0.6283 + 3.7699)]$$

$$= [1.8848, 11.3097] \cup [0, 6.9115] = [0, 11.3097]$$

$$\underbrace{|U| * \cdots * |U(jw)|}_{n}$$

$$\underbrace{|U| * \cdots * |U(j2\pi i/MT)|}_{n} = \underbrace{|U| * \cdots * |U(j2\pi i/4000 \times 0.01|}_{n}$$

$$i = 0, \ldots, 4000/2, n = 2 \text{ and } 3$$

Figure 17:
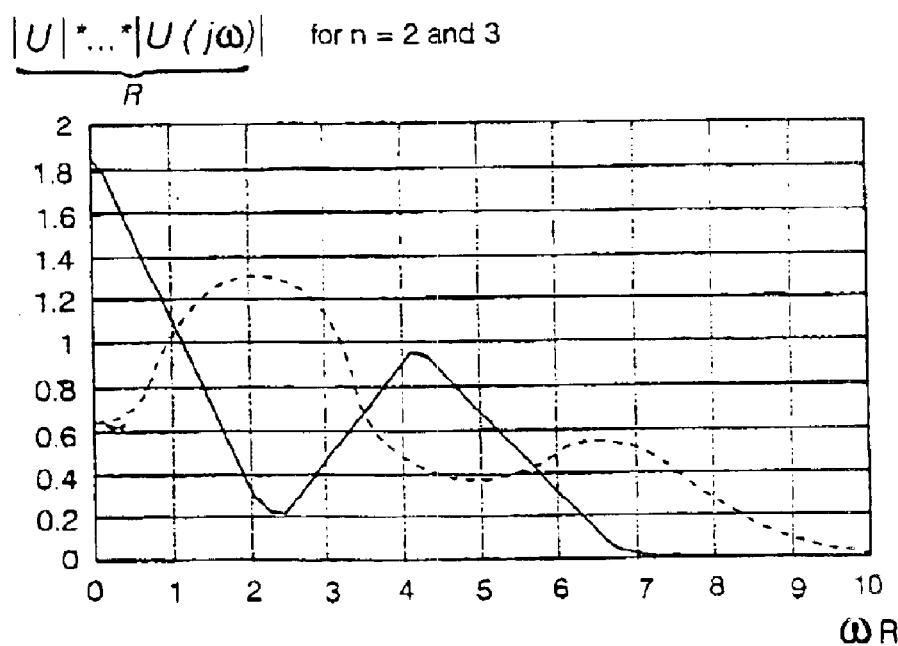
FIG. 17 illustrates the results of the n-dimensional (n=2 and 3) convolution integration for the spectrum shown in FIG. 16.

The results are shown in FIG. 17.
(iv) Based on the $(i_d-i_c+1)$ equations $$Y^{B*}(\pi i/2000 \times 0.01) = 1.6 = \frac{1}{2\pi} C_2 |U| * |U(j\pi i/2000 \times 0.01)| +$$

$$\frac{1}{(2\pi)^2} C_3 |U| * |U(j\pi i/2000 \times 0.01)|$$

$$i = i_c, i_{c+1}, \ldots, i_{d-1}, i_d \text{ with}$$

-continued $$i_c = \text{round}[cMT/2\pi] = \text{round}[5.6 \times 4000 \times 0.01/2 \times \pi] = 36$$

$$i_d = \text{round}[dMT/2\pi] = \text{round}[7.6 \times 4000 \times 0.01/2 \times \pi] = 48$$

use a least squares routine under the constraint of nonnegative solutions to compute $C_2$ and $C_3$, that is, to determine $C_2$ and $C_3$, under the constraints of $C_2 \geq 0$ and $C_3 \geq 0$, to minimises the following expression $$\sum_{i=i}^{i_\Sigma} \left[ 1.6 - \frac{1}{2\pi} C_2 |U| * |U(j\pi\, i/2000 \times 0.01)| - \frac{1}{(2\pi)^2} C_3 |U| * |U| * |U(j\pi\, i/2000 \times 0.01)| \right]^2$$

The results obtained are $$C_2 = 0 \text{ and } C_3 = 3.8367$$

(v) Design, optionally, a linear Butterworth band pass filter to attenuate the frequency components beyond the frequency band $[c, d] = [5.6, 7.6]$ to yield the linear frequency characteristic $$\frac{10^{-3}(0.0986 - 0.1972q^{-2} + 0.0986q^{-6})}{1 - 3.9633q^{-1} + 5.8988q^{-2} - 3.9076q^{-3} + 0.9721q^{-4}} \bigg|_{q = e^{jw}}$$

Figure 14:
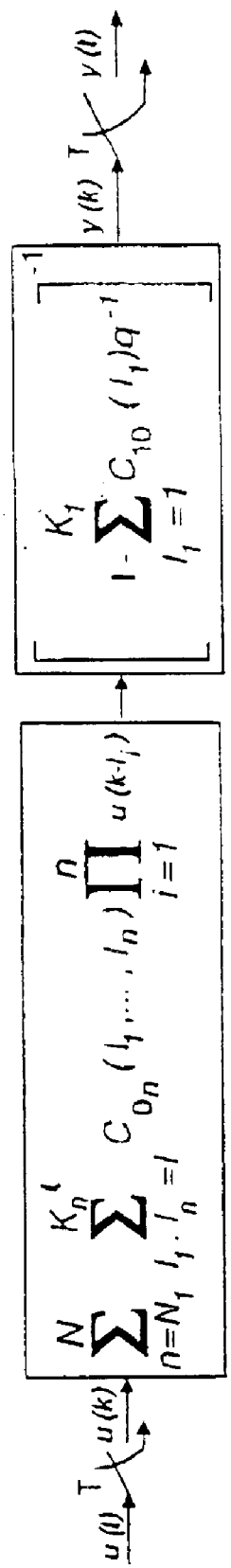
FIG. 14 depicts the structure of a designed nonlinear system.

(5) Construct a NARX model as shown in FIG. 14 with $$N_0 = 2, N = 3, K_2 = K_3 = 1, c_{02}(1, 1) = 0, c_{03}(1,1,1) = 3.8367,$$

that is, $$\sum_{n=N_0}^{N} \sum_{l_1=1}^{K_n} \cdots \sum_{l_n=1}^{K_n} c_{0n}(l_1, \ldots, l_n) \prod_{i=1}^{n} u(k - l_i) =$$

$$\sum_{l_1=i}^{K_2} \sum_{l_q=i}^{K_2} c_{02}(l_1, l_2) \prod_{i=1}^{2} u(k - l_1) +$$

$$\sum_{l_1=i}^{K_3} \sum_{l_2=i}^{K_2} \sum_{l_3=i}^{K_3} c_{03}(l_i, l_2, l_3) \prod_{i=1}^{3} u(k - l_i) =$$

$$\sum_{l_1=1}^{i} \sum_{l_2=1}^{1} c_{02}(l_1, l_2) \prod_{i=1}^{2} u(k - l_i) +$$

$$\sum_{l_1=1}^{1} \sum_{l_2=1}^{1} \sum_{l_3=1}^{1} c_{03}(l_1, l_2, l_3) \prod_{i=1}^{3} u(k - l_i) =$$

$$c_{02}(1, 1)u^2(k-1) + c_{03}(1, l, 1)u^3(k-1) =$$

$$0 \times u^2(k-1) + 3.8367u^3(k-1) = 3.8367u^3(k-1) \text{ and}$$

$$\left[ 1 - \sum_{i_1=1}^{K_1} c_{10}(l_i) q^{-1} \right]^{-1} = \frac{10^{-3}(0.0986 - 0.1972q^{-2} + 0.0986q^{-4})}{1 - 3.9633q^{-1} + 5.8988q^{-2} - 3.9076q^{-3} + 0.9721q^{-4}}$$

which determines the parameters associated with the NARX model parameters $K_1$ and $c_{10}(1_1)$, $1_1 = 1, \ldots, K_1$.

Figure 18:
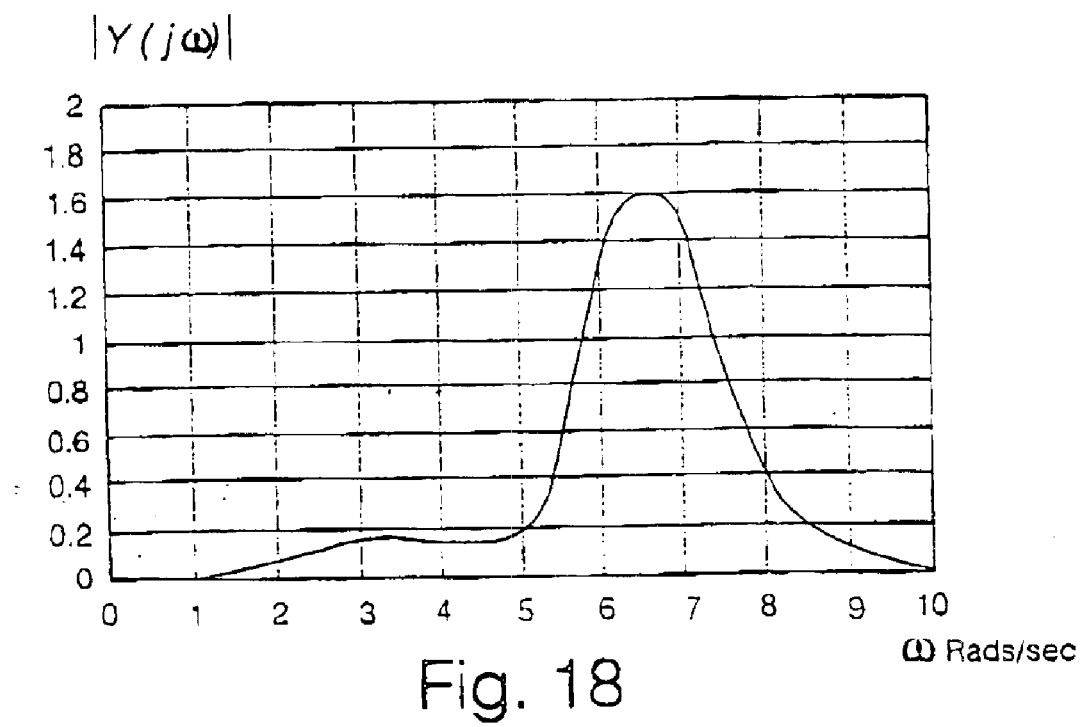
FIG. 18 illustrates the output magnitude frequency response of a designed nonlinear system to an input signal having the frequency spectrum shown in FIG. 15.

The output frequency response under the given input is shown in FIG. 18 indicating that the energy has been transferred to the specified frequency band $[c, d] = [5.6, 7.6]$ with the magnitude of the response below the specified bound 1.6.

Figure 19:
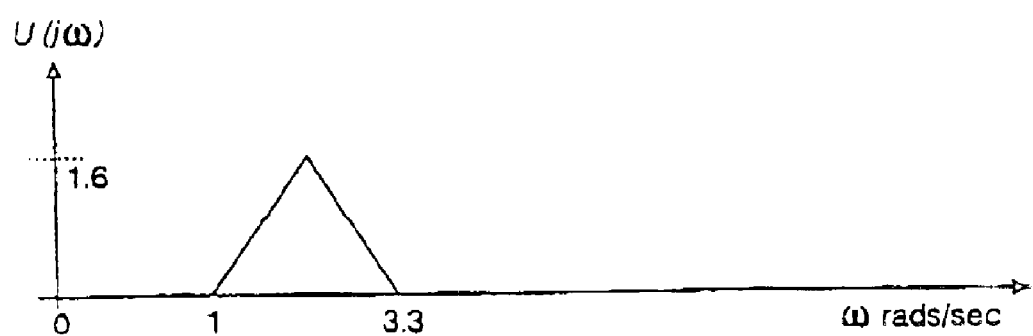
FIG. 19 shows the frequency spectrum of a further signal to be processed using the present invention.

The frequency response of the above design is examined for other input signals below. In the first case, consider $$u(t) = \frac{2M_u}{\pi(b-a)t^2}\left[ 2\cos\frac{(a+b)t}{2} - \cos bt - \cos a\, t \right]$$

where a, b, and $M_u$ are defined as above. The frequency spectrum of the signal is shown in FIG. 19. The frequency range is clearly the same as that of the signal having the spectrum given in FIG. 15 and the magnitude of the spectrum also satisfies the condition that $$|u(jw)| \leq M_u = 1.6$$

Figure 20:
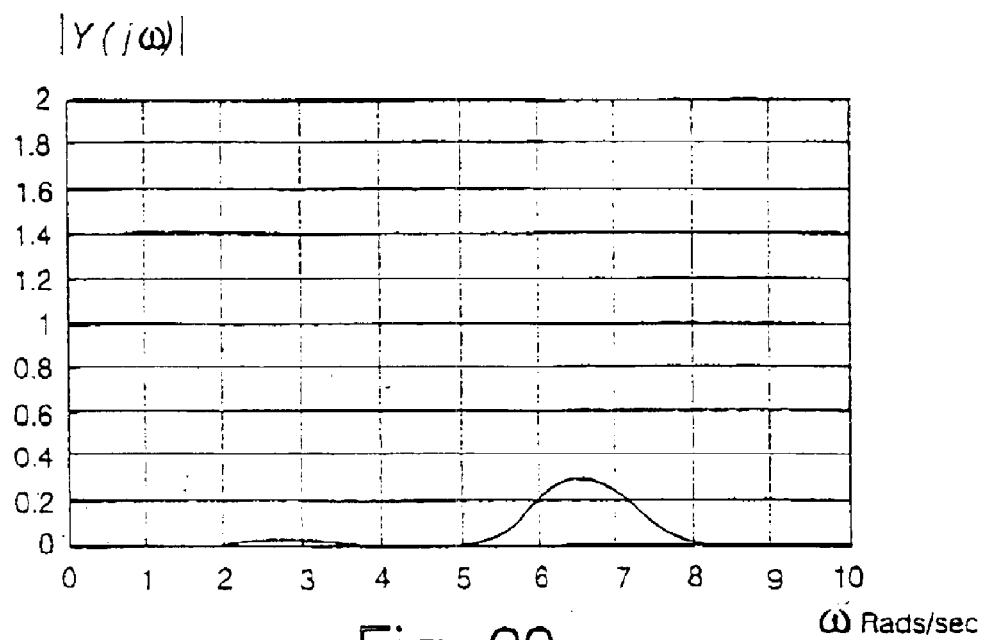
FIG. 20 illustrates the output magnitude frequency response of the same nonlinear system as shown in FIG. 18 to the further signal to be processed having the frequency spectrum shown in FIG. 19.

This implies that the frequency response of the designed system to this u(t) should in theory also transfer energy into the frequency band $[c, d] = [5.6, 7.6]$ with the output magnitude frequency response being less than $Y^{B+}(w) = 1.6$ over this frequency band. FIG. 20 shows this frequency response and indicates that the actual result is consistent with the theoretical predictions.

Figure 21:
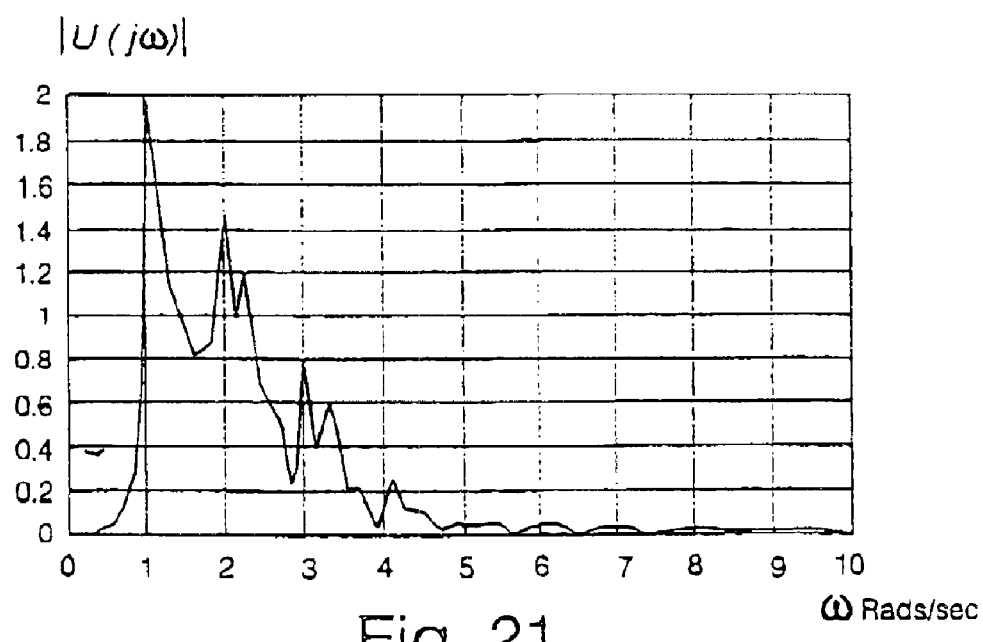
FIG. 21 illustrates the frequency spectrum of a still further signal to be processed using the present invention.
Figure 22:
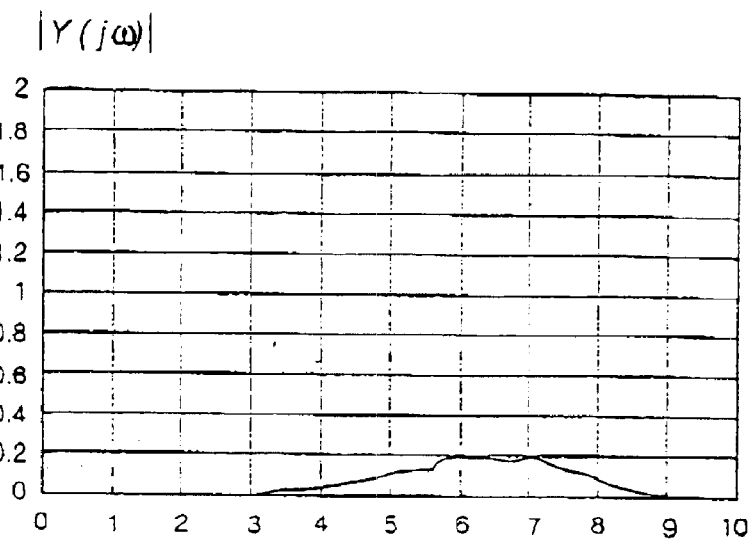
FIG. 22 illustrates the output magnitude frequency response of the same nonlinear system as in FIG. 18 to the still further signal to be processed having the frequency spectrum shown in FIG. 21.

For the second case, u(t) was taken as a random process with the frequency spectrum given in FIG. 21. The frequency spectrum is substantially within the frequency range $[1, 3,3]$ with a magnitude of less than 1.6. Therefore, the same conclusion should apply for the output magnitude frequency response of the designed system to this random input. FIG. 22 shows this response and indicates that the energy is transferred to a new frequency band of substantially $[5.6, 7.6]$. Note that the magnitude of the output spectrum over this frequency band is well below the specified bound $Y^{B+}(w) = 1.6$. This is because of the effect of the attenuation which is due to intrakernel interference of the nonlinear mechanism.

Figure 23:
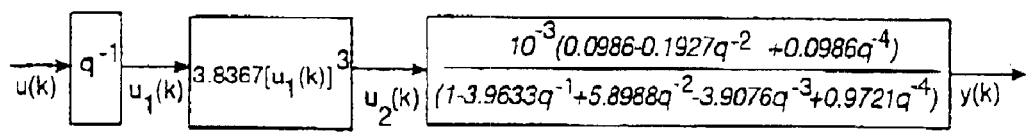
FIG. 23 illustrates the structure of another designed nonlinear system.
Figure 24:
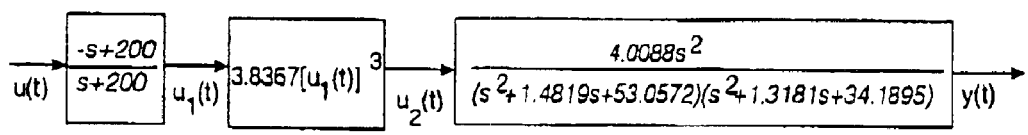
FIG. 24 show the continuous time realisation of the discrete time system in FIG. 23.

The nonlinear filter which has been designed above can be represented by the block diagram shown in FIG. 23. This could be realised electronically by following the approach used to realise Design 1 in FIG. 9. However, for some applications the design may need to be realised in continuous time. Using the bilinear transformation $$q = \frac{1 + (T/2)s}{1 - (T/2)s}$$

where T=0.01 is the sampling interval, $q^{-1}$ is the delay operator, and s is the Laplace Transform operator and substituting in the discrete time design in FIG. 23 provides the equivalent—continuous time system shown in FIG. 24. Similating the system in FIG. 24 produces almost identical responses as the discrete time system response of FIG. 18.

Figure 25:
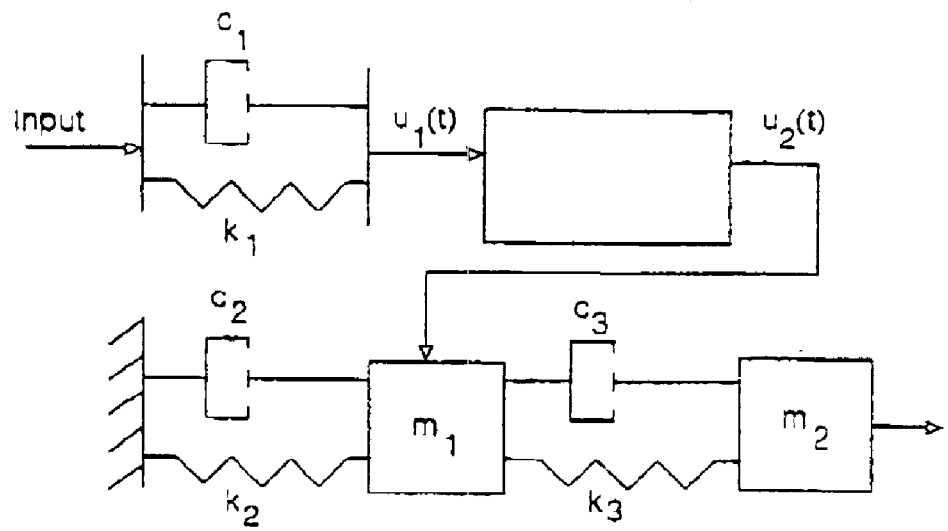
FIG. 25 shows a mechanical implementation of the continuous time system in FIG. 24.

The system in FIG. 24 could for example be realised mechanically as illustrated schematically in FIG. 25 where the cubic device is either a material which exhibits a cubic response or is implemented as an actuator which takes $u_1(t)$ as input and produces an actuation output $u_2(t)$ which is proportional to the cubic power of the input.

One possible application of this design would be in vibration isolation. For example it may be required to transfer energy from an input frequency range $[1, 3.3]$ to the frequency range $[5.6, 7.6]$. The new design could be used to achieve this effect.

Other much more complicated designs for vibration isolation can be achieved based on the present invention. The design procedure would be exactly as described above, but the realisation would involve the synthesis of dampers, damping materials or actuators with the nonlinear dynamic characteristics specified by the designs.

Example 2

Example 2 shows an application of the design above to the attenuation of signal energy over unwanted frequency bands using designed nonlinear effects.

When using linear structures for the attenuation of signal energy in a physical system, the attenuated energy is usually absorbed by devices such as dampers in mechanical systems and resistors in electronic circuits and transformed to other energy forms such as thermal energy. This may lead to undesirable effects and measures, such as using radiating devices, sometimes have to be taken to compensate for these effects. When a nonlinear system is employed, instead of attenuating the signal energy directly as in the linear case, the signal energy at a frequency of interest can be spread over a wider frequency band and attenuated by means of the counteractions between different terms which compose the output spectrum. This means that, to a certain extent, a nonlinear design for signal energy attenuation can reduce the requirements for using energy absorption devices and is of great benefit in practical applications.

Another important application would be, for example, in the design of the foundations or the modification of the characteristics of buildings and structures which are in earthquake zones. The objective in such as application would be to design materials or actuators, tuned as required for each structure, which transfer the damaging input energy from an earthquake to another more acceptable frequency band or spread the energy to be within an acceptable bound over a desired frequency range. Spreading the energy using the present design should produce significant reductions in earthquake damage.

(1) Design a nonlinear system to attenuate the energy of the signal $$u(t) = \frac{2M_u}{\pi(a-b)t^2}\left[2\cos\left(\frac{a+b}{2}t\right) - \cos a\ t - \cos b\ t\right], \text{ where}$$

$$a = 3.3, b = 1, M_u = 1.6.$$

Figure 26:
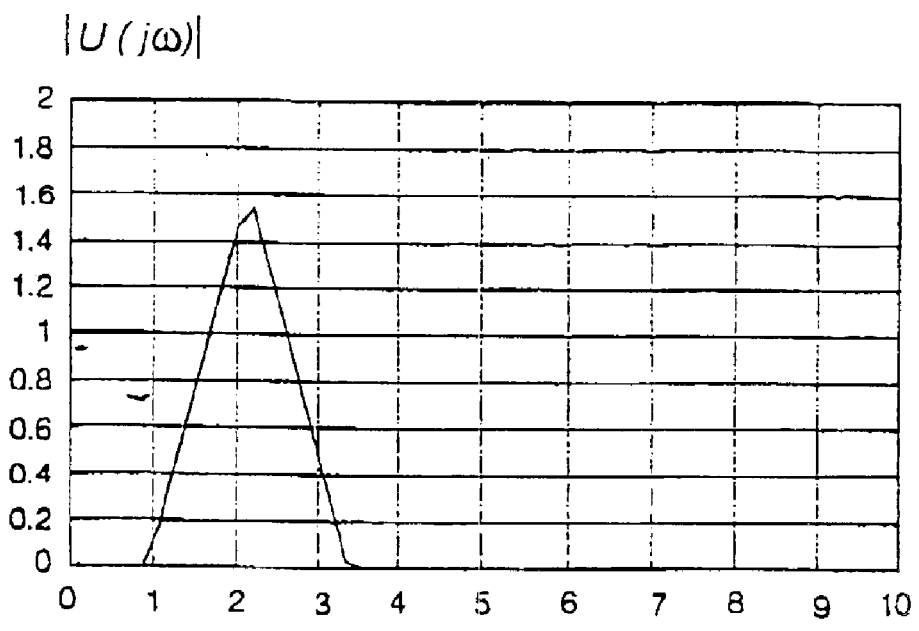
FIG. 26 illustrates the result of a Fast Fourier Transform of the further signal shown in FIG. 19.

(2) The spectrum of the signal is evaluated. This is implemented by sampling the signal with sampling interval T=0.01 sec to produce $$u(k) = \frac{2M_u}{\pi(\alpha-\beta)(kT)^2}\left[2\cos\left(\frac{\alpha+\beta}{2}kT\right) - \cos\alpha\ kT - \cos\beta\ kT\right]$$

$$k = -199.9, \ldots, 0, \ldots, 2000$$

and perform a Fast Fourier Transform (FFT) on this series. The result of the FET is shown in FIG. 26.

(3) Evaluate the [a,b] of frequencies in the signal based on the computed spectrum. The evaluation gives a=1.0996 b=3.1416

This is because the computed spectrum indicates $|U(jw)| \geq 0.05$ for w e [1.0966, 3.1416]

and $|U(jw)| < 0.05$ for other w (4) Assume that, as part of the design, output frequency range is [c,d]=[0, 7.3] and the required bound over this frequency band is $Y^{8*}(w)=1$.

(5) Following the same steps for the design of the system structure and parameters as in example 1 above, $N_0$, $N_w$, and $C_n$, n=$N_0$, ..., N were determined as follows.

(i) $N_0$ $N_0$ is determined to be $N_0=1$. This is because $f_{Y_1}=[a,b]=[1.0996, 3.1416] \epsilon [0, 7.3]=[c,d]$ where $f_{Y_1}$ denotes the output frequency band contributed by the system linear part, and part of the selected output frequency range falls into the linear output frequency range $f_{Y_1}$.

(ii) N

In this case, it can be obtained using a=1.0990 and b=3.1416 that $f_{Y_2}=[2.1992, 6.2832] \cup [0, 2.0420]$ $f_{Y_3}=\cup[0, 9.4248]$ Thus, if the maximum nonlinear order is taken to be 2, then the output frequency range of the system is $f_Y|n=1=f_{Y_1} \cup f_{Y_1}=[0, 6.2832]$ If the maximum order is taken to be 3, then the output frequency range $f_Y|_{n=3}=f_{Y_1} \cup f_{Y_1}=[0, 9.4248]$ Clearly, $f_Y|_{n=3}$ contains the whole selected output frequency range [c,d]=[0, 7.3], N is therefore determined to be N=3.

(iii) $c_n$, n=1,2,3.

$C_n$, n=1,2,3, are determined to minimize the following expression.

$$\sum_{i=i_e}^{i_n}\left[1 - C_i|U(j2\pi i/MT)| - \frac{1}{2\pi}C_2|U|*|U(j2\pi i/MT)| - \frac{1}{(2\pi)^2}C_3|U|*|U|*|U(j2\pi\ 1/MT)|\right]^2$$

under the constraints of $c_i \geq 0$, i=1,2,3.

Notice that for this specific example, $$M = 4000$$

$$i_e = \text{round}\left[\frac{cMT}{2\pi}\right] = \text{round}\left[\frac{0 \times 4000 \times 0.01}{2\pi}\right] = 0$$

$$i_d = \text{round}\left[\frac{dMT}{2\pi}\right] = \text{round}\left[\frac{7.6 \times 4000 \times 0.01}{2\pi}\right] = 48$$

The solution to this minimisation problem is $C_1=0$, $C_2=2.1932$, $C_3=6.0550$ (6) Select the NARX model parameters $K_n, c_{0n}(1_1, \ldots, 1_n)$, $1_1=1, \ldots, K_n, \ldots, K_n$, for n=$N_0$, ..., N, based on the results obtained in (5) as $K_1=K_2=K_3=2$ $c_{01}(.)=0$, $c_{02}(1,1)=1.932$, $c_{02}(1,2)=c_{02}(2,1)=0$, $c_{02}(2,2)=-1$, $c_{02}(1,1,1)=3,0550$, $c_{03}(2,2,2)=-3$, and other $c_{02}(.)$'s and zero and consequently construct a NARX model as $$y(k) = \sum_{n=N_n}^{N}\sum_{l_q=1}^{K_q} \ldots \sum_{l_n=1}^{K_n} c_{On}(l_i, \ldots, l_n)\prod_{i=l}^{n} u(k-l_i) =$$

$$\sum_{l_i=l}^{K_l} c_{01}(l_1)u(k-1_i) + \sum_{l_i=1}^{N_n}\sum_{l_2=1}^{K_2} c_{02}(l_1, l_2)\prod_{i=1}^{2} u(k-l_i) +$$

-continued $$\sum_{l_1=1}^{K_i}\sum_{l_2=1}^{K_2}\sum_{l_3=1}^{K_3} c_{03}(l_1, l_2, l_3)\prod_{i=1}^{3} u(k-l_i) =$$

$$\sum_{l_i=i}^{2} c_{01}(l_i)u(k-l_i) + \sum_{l_1=1}^{K_i}\sum_{l_2=i}^{K_2} c_{02}(l_1, l_2)\prod_{i=1}^{2} u(k-l_i) +$$

$$\sum_{i=l}^{2}\sum_{i=l}^{2}\sum_{i_2=l}^{2} c_{03}(l_i, l_2, l_3)\prod_{i=l}^{3} u(k-l_i) = c_{02}(1,1)u^2(k-1) +$$

$$c_{02}(2,2)u^2(k-1) + c_{03}(1,1,1)u^3(k-1) + c_{03}(2,2,2)u^3(k-2) =$$

$$1.1932u^2(k-1) - u^2(k-2) + 3.0550u^3(k-1) - 3u^3(k-2)$$

Notice that the selected NARX model parameters satisfy the relationship $$\sum_{l_i=i}^{K_i}|c_{01}(l_i)| = 0 = C_i$$

$$\sum_{l_i=i}^{K_2}\sum_{l_i=i}^{K_2}|c_{02}(l_1, l_2)| =$$

$$|c_{02}(1,1)| + |c_{02}(2,2)| = |1.1932| + |-1| = 2.1932 = C_2$$

$$\sum_{l_1=1}^{K_i}\sum_{l_2=1}^{K_2}\sum_{l_3=1}^{K_3}|c_{03}(l_i, l_2, l_3)| =$$

$$c_{03}(1,1,1) + |c_{03}(2,2,2)| = |3.0550| + |-3| = 6.0550 = C_3|$$

and the different signs selected for $c_{02}(1,1)$ and $c_{02}(2,2)$ and for $c_{03}(1,1,1)$ and $c_{03}(2,2,2)$ are such as to give effect to the intra-kernel and inter-kernal interferences, which is to attenuate the energy of the input signal.

Figure 27:
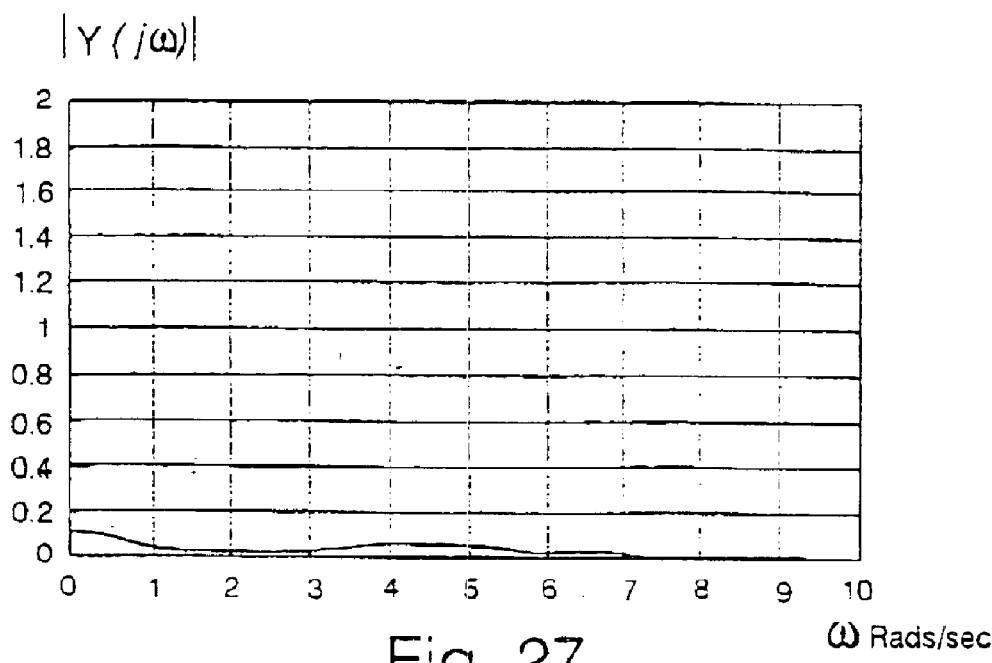
FIG. 27 illustrates the output magnitude frequency response of a further designed nonlinear system to the further signal shown in FIG. 19.

The frequency domain response of the constructed model to the sampled series of the input signal is shown in FIG. 27. It can be seen that excellent energy attenuation has been achieved by the designed system. It will be appreciated that the input energy in FIG. 26 has been spread over the designed frequency band by the nonlinear filter.

Example 3

This example shows another application of the present invention to the attenuation of signal energy over unwanted frequency bands using designed nonlinear effects. The example also illustrates the effect of the same design on a different input signal to demonstrate the effectiveness in energy attenuation of the designed system in different circumstances.

(1) Design a nonlinear system to attenuate the energy of the signal $$u(t) = 2M_u \frac{1}{2\pi} \frac{\sin\alpha\, t - \sin\beta\, t}{t}$$

with $\alpha$=3.3, $\beta$=1, and $M_u$=1.6

(2) The spectrum of the signal is evaluated by sampling the signal with sampling interval T=0.01 sec to produce $$u(k) = 2M_u \frac{1}{2\pi} \frac{\sin\alpha kT - \sin\beta\, kT}{kT} =$$

$$2\times 1.6 \times \frac{1}{2\pi} \times \frac{\sin 3.3\times 0.01k - \sin 0.01\, k}{0.01k}$$

$$k = -1999, \ldots, 0, \ldots, 2000$$

and then performing a Fast Fourier Transform (FET) on the obtained time series. The result of the FFT is the same as that shown in FIG. 16.

(3) Evaluating the range [a,b] of frequencies in the signal based on the computed spectrum gives a=0.6283 b=3.7699 as the computed spectrum indicates $|U(jw)|\geq 0.05$ for w $\in$[0.6283, 3.7699]

and $|U(jw)|<0.05$ for other w.

(4) Assume that, as part of the design, it is desired that the output frequency range is [c,d]=[0,10.3] and the required bound over this frequency range is $Y^{2*}(w)=1$.

(5) Following the same steps for the design of the system structure and parameters as in example 1 above, the parameters $N_0$, N, and $C_n$, n=$N_0$, . . . , N are determined as follows.

(i) $N_0$ $N_0$ is determined to be $N_0$=1 due to $f_{Y_1}$=[a,b]=[0.6283, 3.7699]$\in$[0, 10.3]=[c, d], which indicates that part of the selected output frequency range falls into the linear output frequency range $f_{Ydi\, 1}$.

(ii) N

In this example, N is obtained using a=0.6283 and b=3.7699. Therefore, $f_{Y_2}$=[0, 7.5398]

$f_{Y_3}$=[0, 11.3097].

Hence, if the maximum nonlinear order is taken to be 2, the output frequency range of the system is $f_Y|_{n=2}=f_{Y_2}\cup f_{Y_1}$=[0, 7.5398].

If the maximum order is taken to be 3, the output frequency range $f_Y|_{n=1}=f_{Y_3}\cup f_{Y_1}$=[0, 11.3097].

As $f_Y|_{n=3}$ contains the whole selected output frequency range [c,d]=[0, 7.6], N, for the design, is determined to be N=3.

(iii) $C_n$, n=1,2,3

$C_n$, n=1,2,3 are determined in such a manner as to minimise $$\sum_{i=1}^{i_c}\left[1-C_1|U(j2\pi i/MT)|\frac{1}{2\pi}C_2|U|*|U(j2\pi i/MT)|-\frac{1}{(2\pi)^2}C_3|U|*|U|*|U(j2\pi i/MT)|\right]^2$$

under the constraints of $C_i \geq 0$, i=1,2,3. In this case also M=4000 but $$i_c = \text{round}\left[\frac{cMT}{2\pi}\right] = \text{round}\left[\frac{0 \times 4000 \times 0.01}{2\pi}\right] = 0$$

$$i_d = \text{round}\left[\frac{dMT}{2\pi}\right] = \text{round}\left[\frac{10.3 \times 4000 \times 0.01}{2\pi}\right] = 66$$

The solution to this minimisation problem is
$C_1=0$, $C_2=0.2928$, $C_3=0.9763$
(6) The NARX model parameters
$K_n$, $C_{0n}(1_1, \ldots, 1_n)$, $1_1=1, \ldots, K_n$, $1_n=1, \ldots, K_n$, for $n=N_0, \ldots N$, are selected based on the results obtained in (5) as
$K_1=K_2=K_3=2$
$C_{01}(.)=0$
$C_{02}(1,1)=0.1928$, $c_{02}(1,2)=-0.1$, $C_{02}(2,1)=0$, $C_{02}(2,2)=0$, $C_{03}(1,1,1)=0.6763$, $c_{03}(1,2,2)=-0.3$, and other $c_{03}(.)$'s are zero.
and consequently a NARX model is constructed $$y(k) = \sum_{n=N_0}^{N}\sum_{l_1=1}^{K_n}\cdots\sum_{l_0=1}^{K}C_{02}(l_1,\cdots,l_n)\prod_{i=1}^{n}u(k-l_1)$$

$$= \sum_{l_1=1}^{2}c_{01}(l_2)u(k-l_1) + \sum_{l_1=1}^{2}\sum_{l_1=1}^{2}c_{02}(l_1,l_2)\prod_{i=1}^{2}u(k-l_i) +$$

$$\sum_{l_1=1}^{2}\sum_{l_2=1}^{2}\sum_{l_3=1}^{2}c_{03}(l_1,l_2,l_3)\prod_{i=1}^{3}u(k-l_1)$$

$$= c_{02}(1,1)u^2(k-1) + c_{02}(1,2)u(k-1)u(k-2) + c_{03}(1,1,1)u^3(k-1) +$$

$$c_{03}(1,2,2)u(k-1)u^2(k-2)$$

$$= 0.1928u^2(k-1) - 0.1u(k-1)u(k-2) + 0.6763u^3(k-1) -$$

$$0.3u(k-1)u^2(k-2)$$

The selected NARX model parameters satisfy the relationships $$\sum_{l_1=1}^{K_1}|c_{01}(1_1)| = 0 = C_1$$

$$\sum_{l_1=1}^{K_1}\sum_{l_2=1}^{K_2}|c_{02}(1_1,1_2)| =$$

$$|c_{02}(1,1)| + |c_{02}(1,2)| = |0.1928| + |-0.1| = 0.2928 = C_2$$

$$\sum_{l_1=1}^{K_1}\sum_{l_2=1}^{K_2}\sum_{l_3=1}^{K_3}|c_{03}(1_1,1_2,1_3)| =$$

$$|c_{03}(1,1,1)| + |c_{03}(1,2,2)| = |0.6763| + |-0.3| = 0.9763 = C_3$$

and the different signs selected for
$c_{02}(1,1)$ and $c_{02}(1,2)$ and for
$c_{03}(1,1,1)$ and $c_{03}(1,2,2)$
are in order to give effect to the intra kernel and inter-kernel interferences, which is to attenuate the energy of the input signal.

Figure 28:
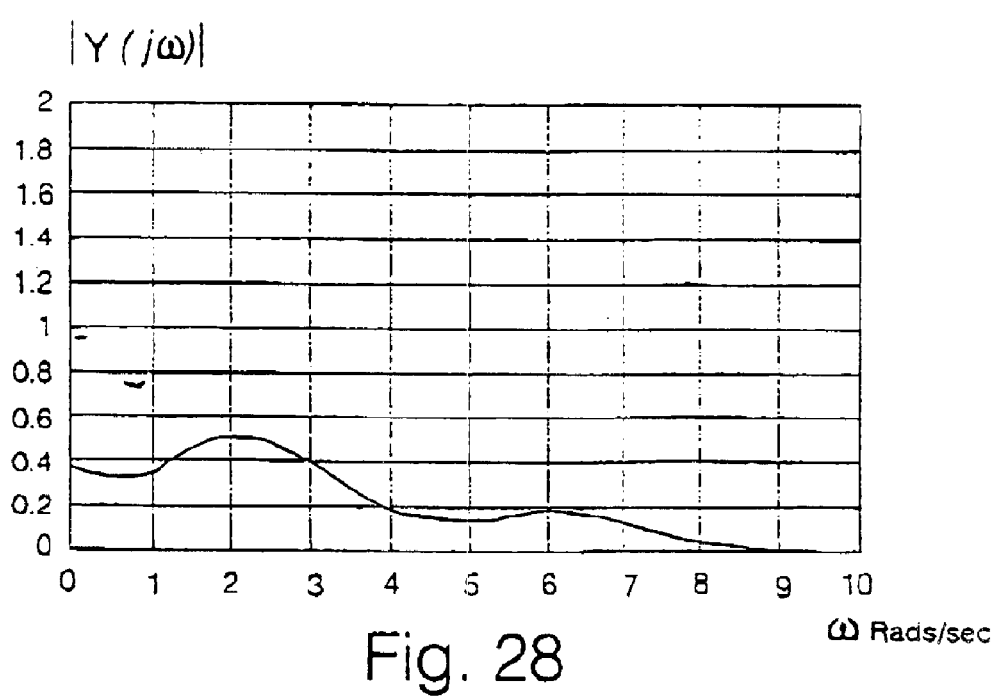
FIG. 28 illustrates the output magnitude frequency response of a still further designed nonlinear system to the signal shown in FIG. 15.

The frequency response of the constructed model to the input signal specified above is shown in FIG. 28 which indicates that the required energy attenuation has been realised.

Figure 29:
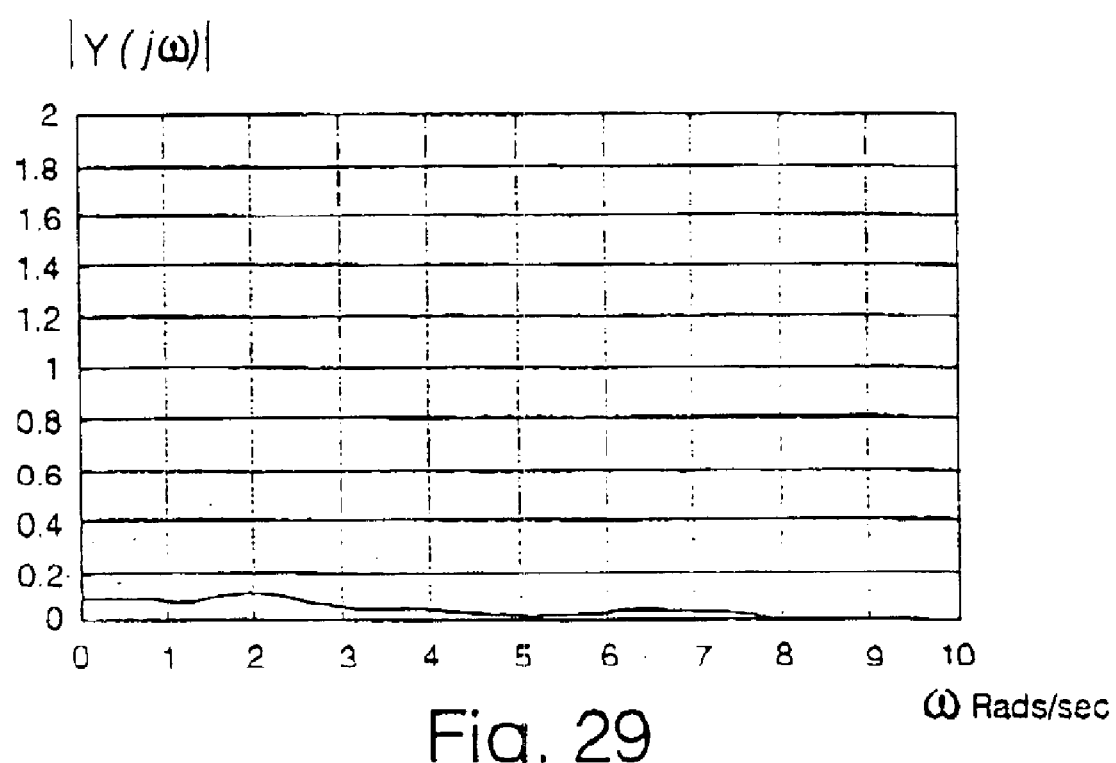
FIG. 29 illustrates the output magnitude frequency response of the nonlinear system shown in FIG. 28 to the further signal shown in FIG. 19.

The frequency response of the design above to the input signal in Example 2 gives the result shown in FIG. 29. The nonlinear system design above clearly also works for the signal in example 2 in energy attenuation although the model was not specifically designed for this signal. This is reasonable since the magnitude of the spectrum of the signal in example 2 is less than the magnitude of the spectrum of the signal in this example over almost all of the input frequency band and over the other frequency bands the magnitudes of the spectra of the two signals are all zero. This illustrates that the above design is effective not only for the input based on which the design is implemented but also for other inputs with magnitude frequency characteristics less than the magnitude of the spectrum of the considered input.

III. FLOWCHARTS

Figure 30:
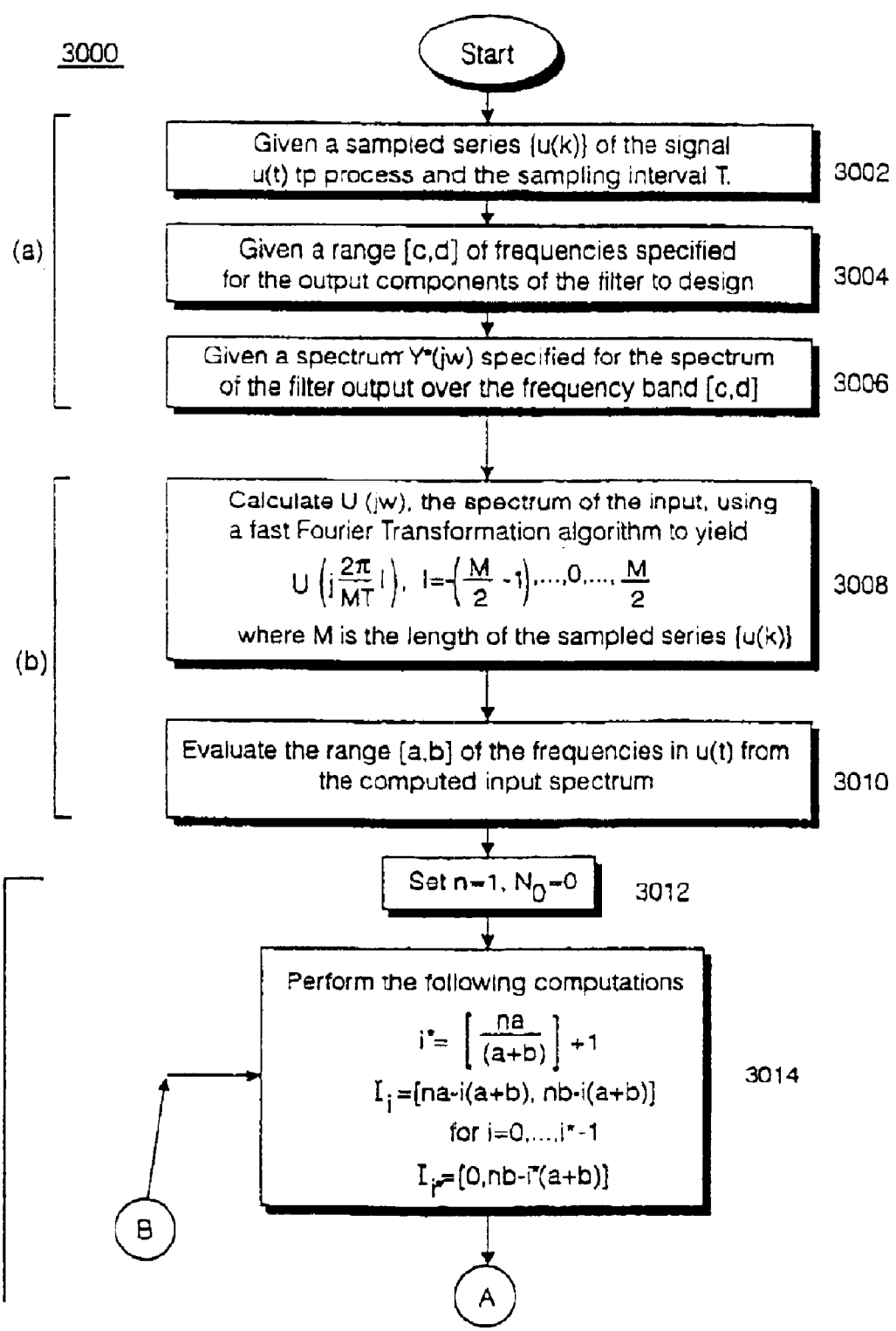
FIG. 30 illustrates a flow chart for designing a nonlinear system according to an embodiment.

Referring to FIG. 30, there is shown a flow chart 3000 depicting the steps of an embodiment of the present invention in which the output spectrum is specified over a given range of output frequencies.

The signal to be processed and the desired frequency response of the non-linear system to be designed are input via steps 3002 to 3006.

At step 3002, a digital input signal {u(k)} and its sampling interval T are to be provided. The range of output frequencies [c,d] over which the energy of the input signal is to be transformed is given in step 3004. The output frequency range is specified using beginning and end frequencies c and d respectively. The distribution of the energy over the output frequency range [c,d] is requested or specified in step 3006.

The frequency characteristics of the input signal are determined at steps 3008 and 3010. More particularly, the frequency components of the digitised input signal, {u(k)}, are calculated using a Fast Fourier Transform at step 3008. The range of frequency components contained within the input signal is determined from the FFT at step 3010.

Referring to steps 3012 to 3024, the orders of the non-linearities required to realise a desired nonlinear system and, hence, the energy transformation, are calculated.

Variables n and $N_o$ are set to one and zero respectively at step 3012. The output frequency components resulting from the nth-order of system nonlinearities are determined at steps 3014 and 3016.

A determination is made at step 3018 as to whether or not $N_o=0$, that is to say, whether or not the smallest order of system nonlinearities which makes a contribution to the desired energy transformation has been determined. If $N_o$ is equal to zero, a determination is made at step 3020 as to whether or not part of the specified output frequency range falls within $f_{Yn}$. If the determination is negative, processing continues at step 3026 at which the value of n is increased by one. However, if the determination is positive, the value of $N_o$ is set to equal n at step 3022 and processing continues at step 3026.

If $N_o$ is not equal to zero, then a determination is made at step 3024 as to whether or not the specified output frequency range lies completely within $f_Y = f_{Y_n} \cup f_{Y_{n-1}}$. If the determination is positive, processing continues with step 3027. However, if the determination is negative, the value of n is incremented by one at step 3026 and processing continues at step 3014.

Steps 3028 to 3034 determines the values of the lags of the nonlinear model for all values of $n = N_0, N_{0+1}, \ldots, N$ and determine the parameters of the nonlinear system to be designed.

Step 3036 represents a step for fine tuning of the output or frequency response of the designed non-linear system.

Steps 3038 and 3040 determine whether or not the resulting frequency response is sufficient to meet the design requirements. If the frequency response of the designed filter is acceptable, the discrete version of the filter is output at step 3042. However, if the designed non-linear system does not have an acceptable frequency response, then step 3044 increments the value of $K_n$ by one for all $n = N_0, N_{0+1}, \ldots, N$ and steps 3030 to 3040 are iteratively repeated.

The determination in step 3040 as to whether or not the designed filter is acceptable is made, for example, by calculating the difference between the required output spectrum and the real output spectrum of the designed system over the frequency band [c,d]. If the modulus of the difference is below a predeterminable threshold over all the output frequency band [c,d], then the designed nonlinear system may be deemed to be acceptable. However, if the modulus of the difference is greater than the threshold at any frequency over [c,d], then the design is refined.

Figure 31:
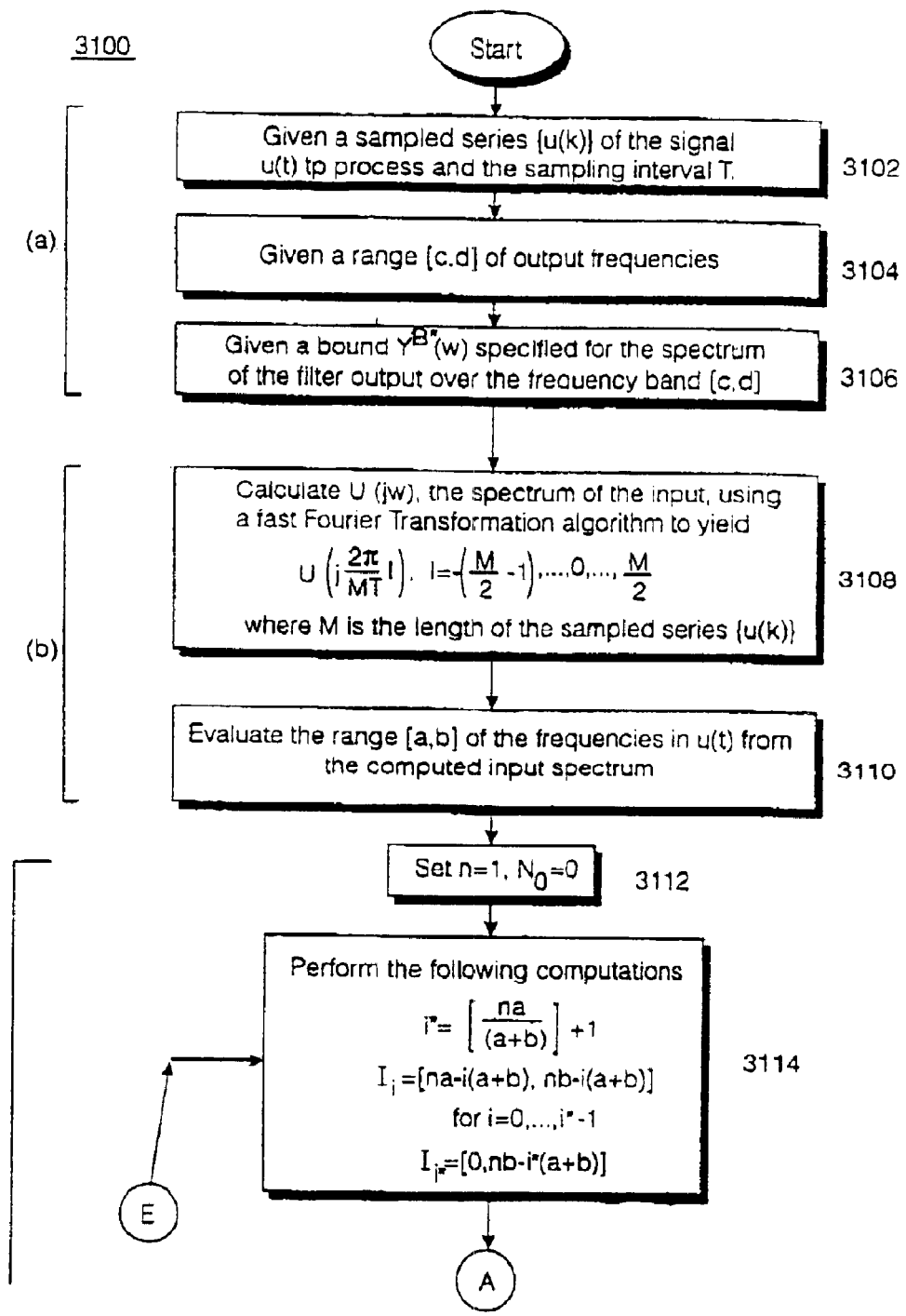
FIG. 31 illustrates a flow chart for designing a nonlinear system according to a further embodiment.

Referring to FIG. 31, there is shown a flow chart 3100 for implementing computer code according to a second embodiment of the present invention.

The signal to be processed and the specification for the desired bound to be imposed upon the output signal frequency characteristics is input at steps 3102 to 3106.

At step 3102, a digitised input signal and its sampling interval T are to be provided. The range of output frequencies [c,d] over which the energy of the input signal is to be transformed is specified in step 3104. A bound $Y^{B*}(w)$ for the distribution of the energy over the output frequency band [c,d] is input at step 3106.

The frequency characteristics of the input signal are determined at step 3108 and 3110. More particularly, the frequency components of the digitised input signal, {u(k)}, are calculated using a Fast Fourier Transform at step 3108. The range of frequency components contained within the input signal is determined from the FFT at step 3110.

Referring to steps 3112 to 3124, the orders of the non-linearities required to realise a desired nonlinear system and, hence, the energy transformation, are calculated.

Variables n and $N_o$ are set to one and zero respectively at step 3112. The frequency components resulting from the nth-order of system nonlinearities are determined at steps 3114 and 3116.

A determination is made at step 3118 as to whether or not $N_o = 0$, that is to say, whether or not the smallest order of system nonlinearities which contributed to the desired energy transformation has been determined. If $N_o$ is equal zero, a determination is made at step 3120 as to whether or not part of the specified output frequency range falls within $f_{Y_n}$. If the determination is negative, processing continues at step 3126 in which the value of n is increased by one. However, if the determination is positive, the value of $N_o$ is set to equal n at step 3122 and processing continues at step 3126.

If, at step 3118, it is determined that $N_o$ is not equal to zero, then a determination is made at step 3124 as to whether or not the specified output frequency range lies completely within $f_Y = f_{Y_n} \cup f_{Y_{n-1}}$. If the determination is positive, processing continues with step 3127. However, if the determination is negative, the value of n is incremented by one at step 3126 and processing continues at step 3114.

Steps 3128 to 3134 determine the values $c_n$ for all values of $n = N_0, N_{0+1}, \ldots, N$, which represents the summation of the modulus of the values of the parameters of the nonlinear system.

At step 3136 the parameters of a NARX model are selected given the constraints imposed upon the non-linear system obtained in steps 3128 to 3134. A determination is made via steps 3138 and 3140 as to whether or not the frequency response beyond the frequency band [c,d] of the designed filter is acceptable. If the frequency response is acceptable, the filter design parameters are output at step 3142. However, if the filter characteristics are not acceptable at frequencies outside the frequency range [c,d], then a conventional filter. $H(q^{-1})$, is designed, at step 3144, in order to reduce or obviate the frequency response of the designed filter outside the range of frequencies [c,d], Finally, the design is completed at step 3146 by combining, the designed non-linear and linear filters, if any.

The determination in step 3140 as to whether or not the frequency response of the designed filter is acceptable outside the range of frequencies [c,d] is made, for example, by comparing the modulus of the frequency response beyond the frequency range [c,d] with a predeterminable threshold. If the modulus is below the threshold over all the frequency range outside [c,d], then the designed nonlinear system may be deemed to be acceptable. However, if the modulus is greater than the threshold at any frequency beyond [c,d], the design is refined.

IV. THREE MORE DESIGNS AND EXAMPLES

IV.1 DESIGN OF NONLINEAR FILTERS WITH SPECIFICATIONS FOR BOTH THE MAGNITUDE AND PHASE OF OUTPUT FREQUENCY RESPONSES

It will be appreciated that the basic principles of the present invention can be applied to the design of nonlinear filters based on specifications for both the magnitude and phase of output frequency responses. The ability to modulate phase as well as or instead of magnitude is of particular importance in telecommunication applications.

Consider a filtering problem such that given an input spectrum U(jw) over a frequency band [a,b] and a desired output spectrum Y*(jw) over another frequency band [c,d], a filter is required to be designed so that the output frequency response Y(jw) can match the desired spectrum Y*(jw) as closely as possible in terms of both magnitude and phase characteristics. The basic principles in Section I can be directly applied to realise the design of such a filter. The procedure to be followed is described below.

First, a nonlinear filter $y_1(t) = N[u(t)]$ is designed using the basic principles described in Steps (i)–(iv) and (v.1) Part 1 in Section I to produce a frequency response $Y_1(jw)$ such that $Y_1(jw)$ can match $Y_1^*(jw)$ over the specified output frequency range [c,d] as closely as possible in terms of both the magnitude and phase.

Secondly, if required, design a linear filter with a frequency response function $H_1(jw)$ such that, ideally, $$H_1(jw) = \frac{Y^*(jw)}{Y_1(jw)} \quad w \in [c, d]$$

Third can be used to improve $Y_1(jw)$, the result obtained from the nonlinear design, so that the frequency response of the corresponding output.

$$Y_2(jw) = H_1(jw)Y_1(jw)$$

provides a better match to the desired spectrum $Y_1^*(jw)$.

Figure 32:
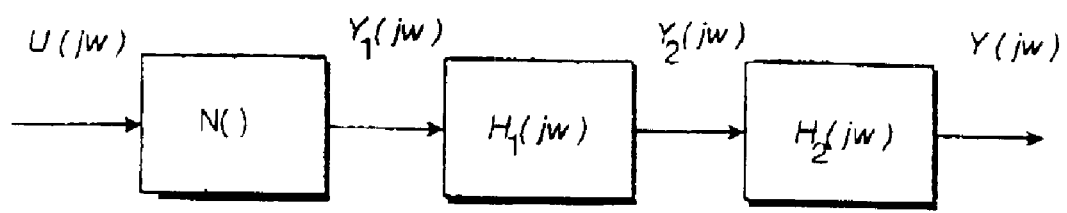
FIG. 32 shows the structure of a nonlinear filter designed based on specification for both the magnitude and phase of output frequency responses.

Thirdly, if required, design a linear phase FIR (Finite Impulse Response) band pass filter $H_2(jw)$ with the ideal magnitude frequency characteristic $$|H_1(jw)| = \begin{cases} 1 & w \in [c, d] \\ 0 & \text{otherwise} \end{cases}$$

and a linear phase over the frequency range. The construct the designed filter using linear filters $H_1(jw)$ and $H_2(jw)$ and nonlinear filter $N[u(t)]$ as shown in FIG. 32 to yield the output frequency response $$Y(jw) = H_2(jw)Y_2(jw)$$

The second and third steps above follow the design principle described in Step (v.1) Part 2 in Section I so as to augment the performance of the nonlinear filter $y_1(t) = N[u(t)]$ designed in the first step.

$$|Y(jw)| = \begin{cases} |H_1(jw)||Y_2(jw)| = |Y_2(jw)| = |H_1(jw)Y_1(jw)| = |Y^*(jw)| & w \in [c, d] \\ 0 & \text{otherwise} \end{cases}$$

and $$\angle Y(jw) = \angle H_2(jw) + \angle Y_2(jw) = k_c w + \angle Y^*(jw)$$

due to the linear phase characteristic of $H_2(jw)$ where $k_c$ is a coefficient which is a function of the order of $H_2(jw)$. This indicates that the output frequency response of the designed filter is ideally the same as the desired response over the output frequency range $[c,d]$ except for a linear phase difference between the real and the desired phase response. This is in fact an unavoidable phenomenon if band pass filtering such as the effect of $H_2(jw)$ is applied for the design. However, this is still an ideal characteristic since a linear phase implies that the filter group delay is constant, the filtered signal is simply delayed for some time determined by $k_c$, and the wave shape of the processed signal is preserved, that is, there is no phase distortion in the filter output.

Figure 33:
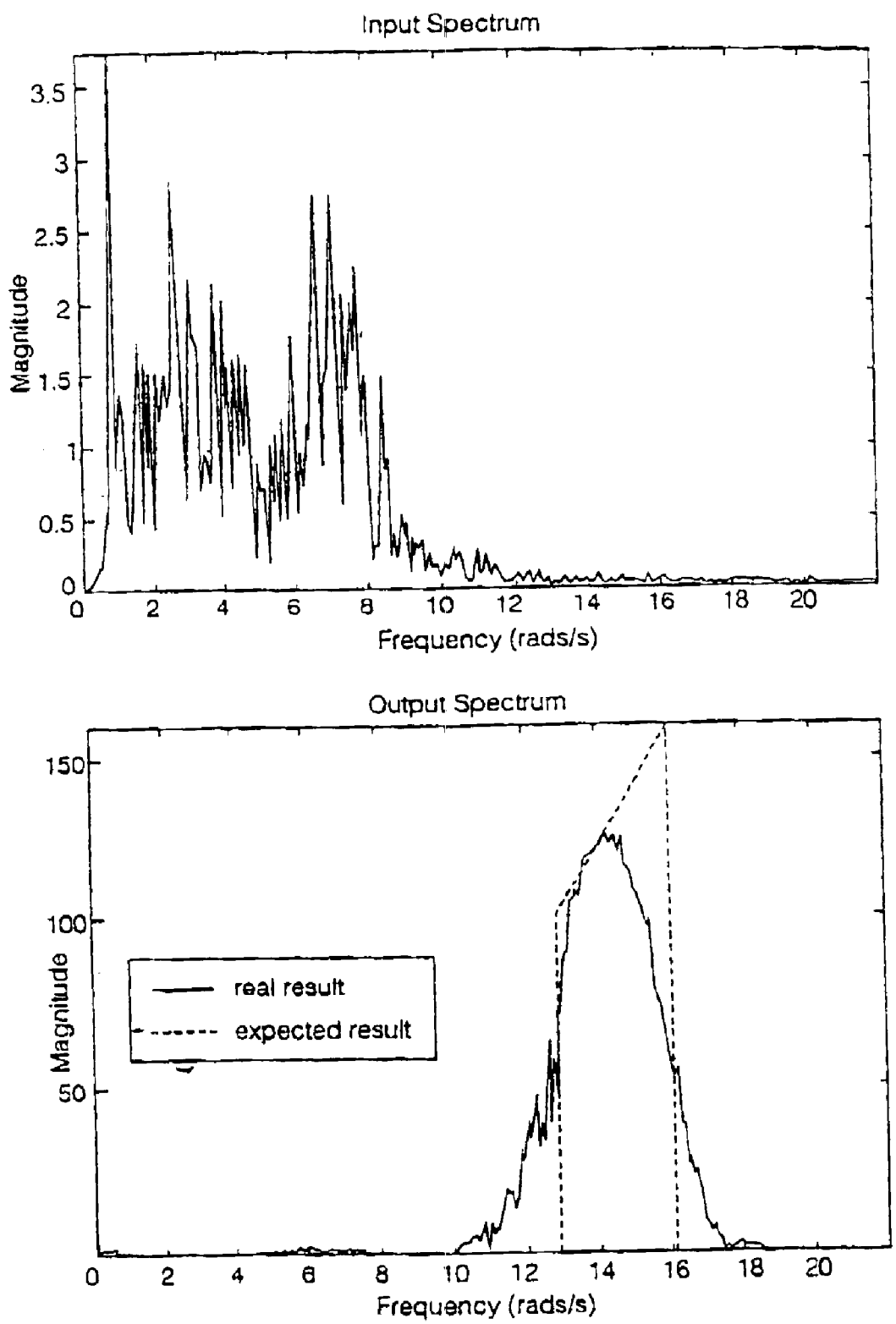
FIG. 33 depicts the input and output magnitude frequency characteristics of a specific nonlinear filter designed based on specifications for both the magnitude and phase.
Figure 34:
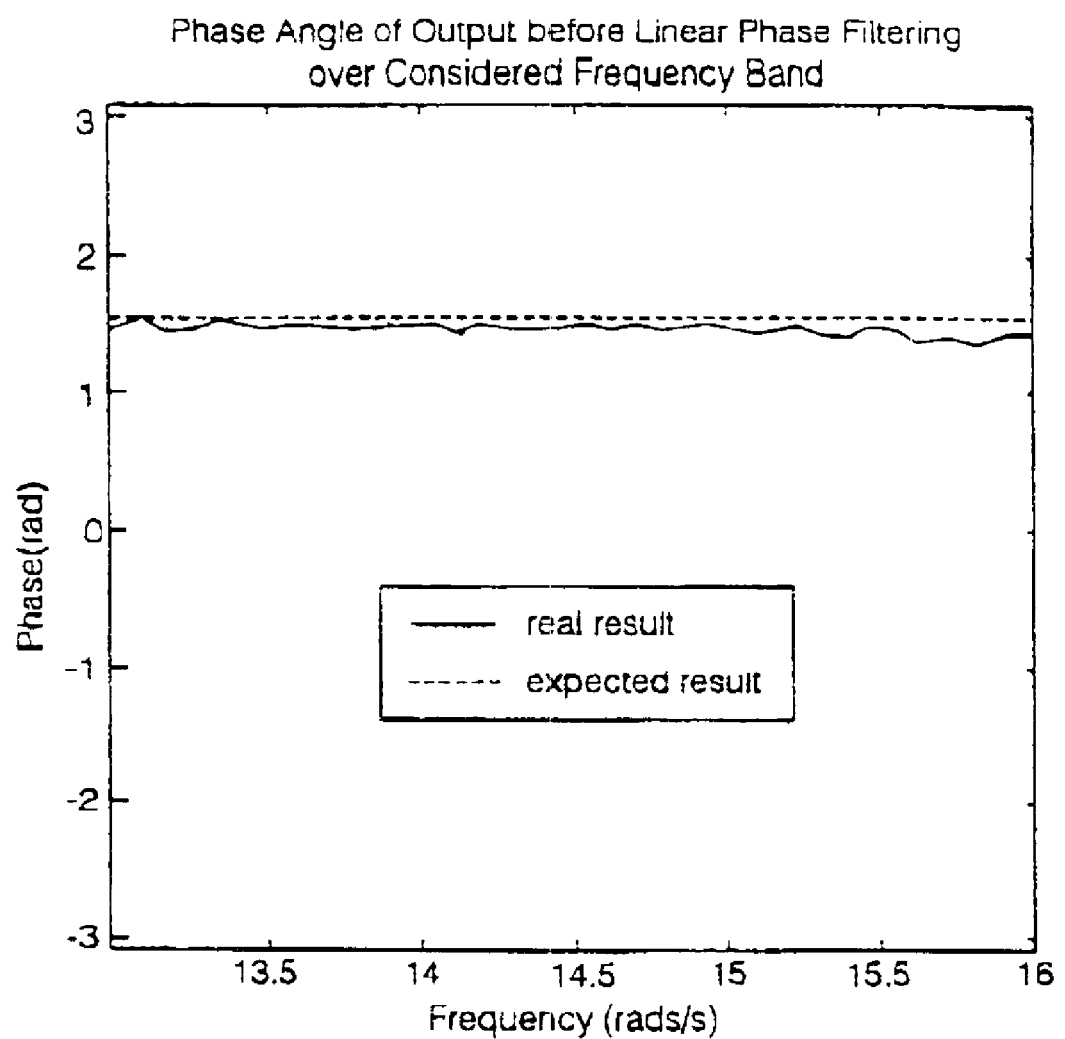
FIG. 34 shows the phase angle of the spectrum $Y_2(jw)$ in FIG. 32 in the specific design case shown in FIG. 33 which reflects the phase response characteristic determined by the design.
Figure 35:
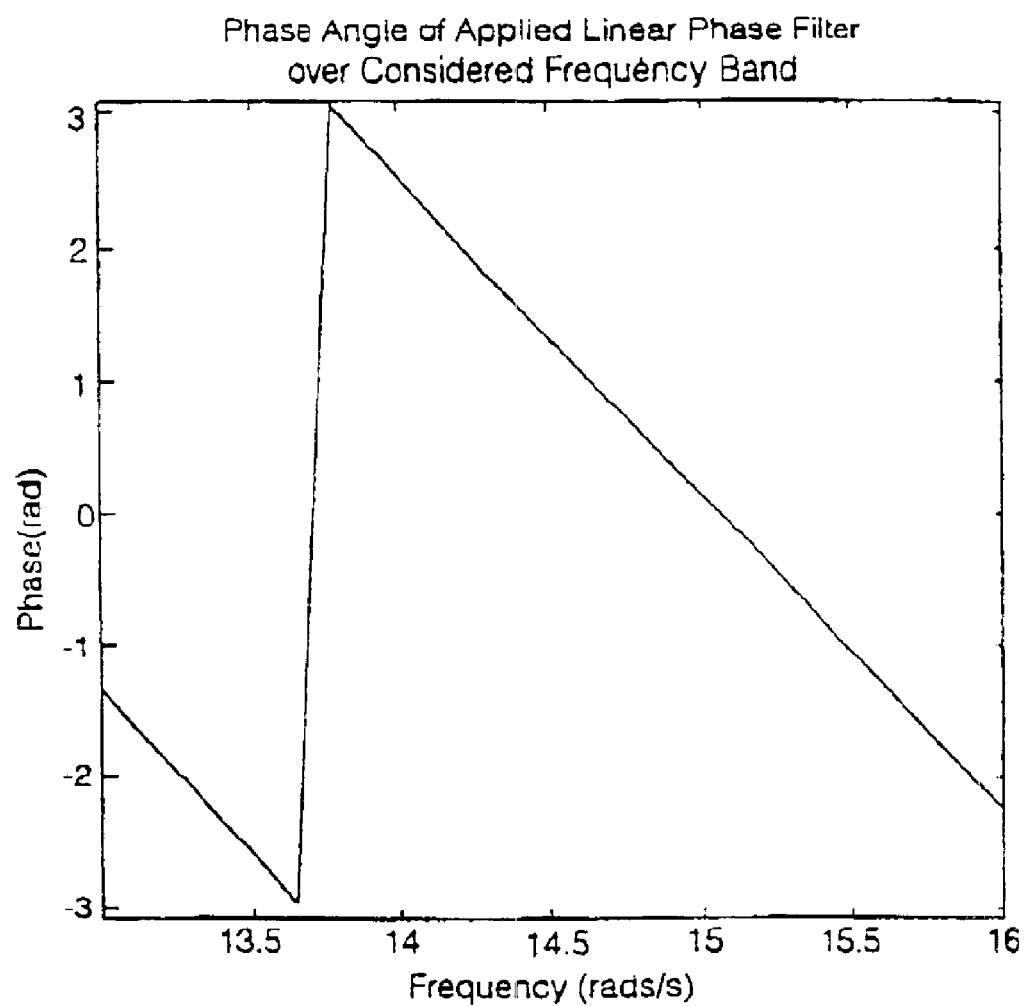
FIG. 35 shows the phase characteristics of the linear phase FIR filter in the specific design case shown in FIG. 33.

The results of a specific nonlinear filter design obtained using the above procedure and based on specifications for both the magnitude and phase are shown in FIGS. 33–35.

The given input for this design was produced using a white noise sequence uniformly distributed in $[0,4]$ and band limited within the frequency range $[a,b]=[1,8]$ under a sampling interval $T_s=0.02$ s. The magnitude of the spectrum of the given input is shown in FIG. 33.

The desired output spectrum was chosen to be $$Y^*(jw) = \begin{cases} \dfrac{\exp(-500w) + j(600w^2)}{1000} & w \in [c, d] = [13, 16] \\ 0 & \text{otherwise} \end{cases}$$

FIG. 33 also shows the comparison between the magnitude of the output spectrum $Y(jw)$ of the designed nonlinear filter and the magnitude of the desired spectrum $Y^*(jw)$.

FIG. 34 shows the comparison between the phase angle of $Y_2(jw)$, the output spectrum before linear phase filtering, and the phase angle of the desired spectrum $Y^*(jw)$.

FIG. 35 shows the phase angle of the applied linear phase filter $H_2(jw)$.

It can be observed from the above that a nonlinear filter designed using the basic principles of the present invention can produce an output frequency response which FIG. 35 shows the phase angle of the applied linear phase filter $H_2(jw)$.

It can be observed from the above that a nonlinear filter designed using the basic principles of the present invention can produce an output frequency response which satisfies a design specification in terms of both the magnitude and phase.

The discrete time model description of the designed filter is given below where the nonlinear part of the model is the discrete time model description of the nonlinear filter.

$$Y_1(t) = N[u(t)]$$

and the linear part of the model is the discrete time model description of the linear filter, the frequency response function of which is $$H(jw) = H_1(jw)H_2(jw)$$

Nonlinear part of the model:

$$\begin{aligned}
y(k) = &+ (3.123e+06)u(k-1) + (-2.244e+07)u(k-2) + \\
&(6.602e+07)u(k-3) + (-1.027e+08)u(k-4) + \\
&(8.961e+07)u(k-5) + (-4.18e+07)u(k-6) + \\
&(8.176e+06)u(k-7) + (4.239e+09)u(k-1)u(k-1) + \\
&(-1.772e+10)u(k-1)u(k-2) + (5.897e+09)u(k-1)u(k-3) + \\
&(7.213e+09)u(k-1)u(k-4) + (-3.66e+09)u(k-1)u(k-5) + \\
&(-1.869e+08)u(k-1)u(k-6) + (6.736e+07)u(k-1)u(k-7) + \\
&(-6.777e+08)u(k-2)u(k-2) + (8.003e+10)u(k-2)u(k-3) + \\
&(-7.57e+10)u(k-2)u(k-4) + (6.023e+09)u(k-2)u(k-5) + \\
&(8.648e+09)u(k-2)u(k-6) + (-4.365e+08)u(k-2)u(k-7) + \\
&(-8.365e+10)u(k-3)u(k-3) + (2.268e+10)u(k-3)u(k-4) + \\
&(1.005e+11)u(k-3)u(k-5) + (-3.795e+10)u(k-3)u(k-6) + \\
&(-2.516e+09)u(k-3)u(k-7) + (1.054e+11)u(k-4)u(k-4) + \\
&(-1.97e+11)u(k-4)u(k-5) + (1.109e+10)u(k-4)u(k-6) + \\
&(1.907e+10)u(k-4)u(k-7) + (2.352e+10)u(k-5)u(k-5) + \\
&(8.173e+10)u(k-5)u(k-6) + (-3.318e+10)u(k-5)u(k-7) + \\
&(-4.218e+10)u(k-6)u(k-6) + (2.042e+10)u(k-6)u(k-7) + \\
&(-1.658e+09)u(k-7)u(k-7)
\end{aligned}$$

Linear part of the model:

$y(k) = b(1)u(k) + b(2)u(k-1) + \ldots + b(m)u(k-m) - a(1)y(k-1) - \ldots - a(n)y(k-n)$ with n = 2 and m = 303 where $[a(1), \ldots, a(n)] =$
−1.86215871605398   0.95715116734794 and $[b(1), \ldots, b(m)] =$
1.0e − 03 +

| Columns 1 through 4 | | | |
|---|---|---|---|
| 0.00000003328202 | 0.00000021432147 | 0.00000080368128 | 0.00000227704991 |

| Columns 5 through 8 | | | |
|---|---|---|---|
| 0.00000537879856 | 0.00001113499106 | 0.00002079938253 | 0.00003571014847 |

| Columns 9 through 12 | | | |
|---|---|---|---|
| 0.00005704570668 | 0.00008548478679 | 0.00012079738459 | 0.00016141668710 |

| Columns 13 through 16 | | | |
|---|---|---|---|
| 0.00020406372559 | 0.00024351205626 | 0.00027258483896 | 0.00028246765302 |

| Columns 17 through 20 | | | |
|---|---|---|---|
| 0.00026339508245 | 0.00020572744049 | 0.00010137844659 | −0.00005450964923 |

| Columns 21 through 24 | | | |
|---|---|---|---|
| −0.00026181250429 | −0.00051381800480 | −0.00079603373996 | −0.00108568381434 |

| Columns 25 through 28 | | | |
|---|---|---|---|
| −0.00135214637123 | −0.00155851835832 | −0.00166438952001 | −0.00162976908378 |

| Columns 29 through 32 | | | |
|---|---|---|---|
| −0.00141994747987 | −0.00101090816448 | −0.00039475153522 | 0.00041552374840 |

| Columns 33 through 36 | | | |
|---|---|---|---|
| 0.00138259540242 | 0.00244344402372 | 0.00351062196838 | 0.00447655873267 |

| Columns 37 through 40 | | | |
|---|---|---|---|
| 0.00522101718800 | 0.00562147075427 | 0.00556579258464 | 0.00496627276545 |

| Columns 41 through 44 | | | |
|---|---|---|---|
| 0.00377365278712 | 0.00198963381599 | −0.00032378155160 | −0.00303968275897 |

| Columns 45 through 48 | | | |
|---|---|---|---|
| −0.00596769040539 | −0.00886230677976 | −0.01143843394688 | −0.01339358387193 |

| Columns 49 through 52 | | | |
|---|---|---|---|
| −0.01443551408603 | −0.01431325012233 | −0.01284878916639 | −0.00996641286493 |

| Columns 53 through 56 | | | |
|---|---|---|---|
| −0.00571602453045 | −0.00028726506096 | 0.00598841256370 | 0.01264965179911 |

| Columns 57 through 60 | | | |
|---|---|---|---|
| 0.01913182739200 | 0.02480771068003 | 0.02903991461588 | 0.03124135106508 |

| Columns 61 through 64 | | | |
|---|---|---|---|
| 0.03093862246516 | 0.02783233132424 | 0.02184786863383 | 0.01317044094614 |

| Columns 65 through 68 | | | |
|---|---|---|---|
| 0.00225896524855 | −0.01016501602446 | −0.02315515892661 | −0.03560414378179 |

| Columns 69 through 72 | | | |
|---|---|---|---|
| −0.04633007891956 | −0.05417943987784 | −0.05813822813951 | −0.05744137376473 |

| Columns 73 through 76 | | | |
|---|---|---|---|
| −0.05166958483783 | −0.04082303832663 | −0.02536256454818 | −0.00621129546254 |

| Columns 77 through 80 | | | |
|---|---|---|---|
| 0.01528703636150 | 0.03745307958913 | 0.05839584942467 | 0.07616729599331 |

| Columns 81 through 84 | | | |
|---|---|---|---|
| 0.08893537701557 | 0.09516078483677 | 0.09376093809767 | 0.08424478625381 |

| Columns 85 through 88 | | | |
|---|---|---|---|
| 0.06680350720636 | 0.04234527006789 | 0.01246669428018 | −0.02064087852648 |

| Columns 89 through 92 | | | |
|---|---|---|---|
| −0.05434613862312 | −0.08578337461088 | −0.11209316760456 | −0.13067820746590 |

-continued

| Columns 93 through 96 | | | |
|---|---|---|---|
| −0.13945154456062 | −0.13705390892471 | −0.12301823047738 | −0.09786316009190 |

| Columns 97 through 100 | | | |
|---|---|---|---|
| −0.06310299056015 | −0.02116847625143 | 0.02475895107438 | 0.07098889554710 |

| Columns 101 through 104 | | | |
|---|---|---|---|
| 0.11362138287669 | 0.14887942949652 | 0.17344622849594 | 0.18477606135825 |

| Columns 105 through 108 | | | |
|---|---|---|---|
| 0.18134984027062 | 0.16284982658307 | 0.13023456167487 | 0.08570350882143 |

| Columns 109 through 112 | | | |
|---|---|---|---|
| 0.03255064587105 | −0.02508361142904 | −0.08254318260252 | −0.13504269472806 |

| Columns 113 through 116 | | | |
|---|---|---|---|
| −0.17807650738416 | −0.20781448143133 | −0.22144885867665 | −0.21746018536730 |

| Columns 117 through 120 | | | |
|---|---|---|---|
| −0.19577680884658 | −0.15781155123986 | −0.10636991902139 | −0.04543567185132 |

| Columns 121 through 124 | | | |
|---|---|---|---|
| 0.02014930576277 | 0.08508414798056 | 0.14405304899329 | 0.19217566873157 |

| Columns 125 through 128 | | | |
|---|---|---|---|
| 0.22542441249983 | 0.24097171607669 | 0.23743645368538 | 0.21500740460840 |

| Columns 129 through 132 | | | |
|---|---|---|---|
| 0.17543256598964 | 0.12187499247761 | 0.05864768640035 | −0.00914923229050 |

| Columns 133 through 136 | | | |
|---|---|---|---|
| −0.07605725937466 | −0.13671663683833 | −0.18631209098366 | −0.22096869885059 |

| Columns 137 through 140 | | | |
|---|---|---|---|
| −0.23806415895179 | −0.23643147511610 | −0.21643603250516 | −0.17992231311682 |

| Columns 141 through 144 | | | |
|---|---|---|---|
| −0.13003701658436 | −0.07094606546323 | −0.00747191949549 | 0.05531598034943 |

| Columns 145 through 148 | | | |
|---|---|---|---|
| 0.11252149812387 | 0.15981666793597 | 0.19377819943088 | 0.21213874239435 |

| Columns 149 through 152 | | | |
|---|---|---|---|
| 0.21393429471004 | 0.19953878954962 | 0.17058700949905 | 0.12979660938955 |

| Columns 153 through 156 | | | |
|---|---|---|---|
| 0.08070832589097 | 0.02736960335274 | −0.02600882989955 | −0.07539394440027 |

| Columns 157 through 160 | | | |
|---|---|---|---|
| −0.11724060322409 | −0.14874679880287 | −0.16803574024719 | −0.17425382855726 |

| Columns 161 through 164 | | | |
|---|---|---|---|
| −0.16758132308460 | −0.14916007746448 | −0.12094944070741 | −0.08552673296083 |

| Columns 165 through 168 | | | |
|---|---|---|---|
| −0.04585223365109 | −0.00502017035384 | 0.03398322634818 | 0.06849574758055 |

| Columns 169 through 172 | | | |
|---|---|---|---|
| 0.09635411698109 | 0.11601725927068 | 0.12663256434628 | 0.12804494388799 |

| Columns 173 through 176 | | | |
|---|---|---|---|
| 0.12075316710299 | 0.10582180562013 | 0.08475985344594 | 0.05937858562038 |

| Columns 177 through 180 | | | |
|---|---|---|---|
| 0.03164147930605 | 0.00351816237707 | −0.02314740959980 | −0.04674674074459 |

| Columns 181 through 184 | | | |
|---|---|---|---|
| −0.06598945884170 | −0.07995651694641 | −0.08812411270222 | −0.09036059631364 |

| Columns 185 through 188 | | | |
|---|---|---|---|
| −0.08690017680683 | −0.07829817708583 | −0.06537295841595 | −0.04913952047510 |

| Columns 189 through 192 | | | |
|---|---|---|---|
| −0.03073930999045 | −0.01137008308799 | 0.00778109613199 | 0.02559935810198 |

| Columns 193 through 196 | | | |
|---|---|---|---|
| 0.04109626424759 | 0.05345544314259 | 0.06206856688305 | 0.06656076607150 |

-continued

|  | Columns 197 through 200 | | |
|---:|---:|---:|---:|
| 0.06680468888031 | 0.06292254225138 | 0.05527568217195 | 0.04444169619049 |
|  | Columns 201 through 204 | | |
| 0.03117946545587 | 0.01638338990942 | 0.00102875697648 | −0.01388895099522 |
|  | Columns 205 through 208 | | |
| −0.02741724189660 | −0.03870846951445 | −0.04707559699096 | −0.05203784736309 |
|  | Columns 209 through 212 | | |
| −0.05335260858175 | −0.05103084289941 | −0.04533443158680 | −0.03675527219878 |
|  | Columns 213 through 216 | | |
| −0.02597741626758 | −0.01382495500742 | −0.00119959263130 | 0.01098723157804 |
|  | Columns 217 through 220 | | |
| 0.02188226583806 | 0.03075319656401 | 0.03704059636285 | 0.04039599306472 |
|  | Columns 221 through 224 | | |
| 0.04070212260137 | 0.03807460516092 | 0.03284505620907 | 0.02552746332356 |
|  | Columns 225 through 228 | | |
| 0.01677103005022 | 0.00730378144712 | −0.00212808430644 | −0.01081988478115 |
|  | Columns 229 through 232 | | |
| −0.01816221252030 | −0.02368447649585 | −0.02708498340864 | −0.02824561802129 |
|  | Columns 233 through 236 | | |
| −0.27230660984541 | −0.02427029083261 | −0.01973202360355 | −0.01408149907660 |
|  | Columns 237 through 240 | | |
| −0.00783828203366 | −0.00152977531128 | 0.00435233046871 | 0.00938952420923 |
|  | Columns 241 through 244 | | |
| 0.01326503243370 | 0.01578162483958 | 0.01686791315533 | 0.01657347478885 |
|  | Columns 245 through 248 | | |
| 0.01505411203293 | 0.01254934451451 | 0.00935476560966 | 0.00579214028759 |
|  | Columns 249 through 252 | | |
| 0.00218008037598 | −0.00119246975076 | −0.00408581800286 | −0.00632711824010 |
|  | Columns 253 through 256 | | |
| −0.00781483506799 | −0.00852066157236 | −0.00848329376098 | −0.00779740923517 |
|  | Columns 257 through 260 | | |
| −0.00659902170090 | −0.00504908820003 | −0.00331691201488 | −0.00156482692685 |
|  | Columns 261 through 264 | | |
| 0.00006463440339 | 0.00145824730714 | 0.00253783620427 | 0.00326220436512 |
|  | Columns 265 through 268 | | |
| 0.00362556118310 | 0.00365304002511 | 0.00339409451670 | 0.00291465798950 |
|  | Columns 269 through 272 | | |
| 0.00228895177653 | 0.00159174429109 | 0.00089171267597 | 0.00024636506918 |
|  | Columns 273 through 276 | | |
| −0.00030123128510 | −0.00072387920912 | 0.00100998481168 | −0.00116188515783 |
|  | Columns 277 through 280 | | |
| −0.00119315515203 | −0.00112532046764 | −0.00098439594641 | −0.00079761965498 |
|  | Columns 281 through 284 | | |
| −0.00059067279083 | −0.00038557775676 | −0.00019936402666 | −0.00004349568836 |
|  | Columns 285 through 288 | | |
| 0.00007602486265 | 0.00015801946885 | 0.00020513691086 | 0.00022267635728 |
|  | Columns 289 through 292 | | |
| 0.00021739726997 | 0.00019645030203 | 0.00016652267489 | 0.00013324716819 |
|  | Columns 293 through 296 | | |
| 0.00010088214188 | 0.00007223559481 | 0.00004878213424 | 0.00003090906954 |

-continued

| Columns 297 through 300 | | | |
|---|---|---|---|
| 0.00001822614592 | 0.00000988083116 | 0.00000483478363 | 0.00000207399807 |

| Columns 301 through 303 | | |
|---|---|---|
| 0.00000074209218 | 0.00000020073804 | 0.00000003164528 |

IV.2 Design of Nonlinear Filters to Focus Energy from Different Frequency Bands into a Single Frequency Band The above embodiments of the present invention illustrate how the principles underlying the invention can be used to transfer energy from one frequency or frequency range to another frequency or frequency range. However, it will be appreciated that the present invention can equally well be utilised to focus energy from a given frequency band or given frequency bands into a single, and preferably, narrower frequency band.

The problem to be addressed in this design is that given an input spectrum which possesses nonzero magnitude characteristics over two different frequency bands $[a_1,b_1]$ and $[a_2,b_2]$, where $a_1>b_1$, a filter is required to be designed to focus energy from the two different input frequency bands into a single output frequency band $[c,d]$, where $c>b_1$, $d<a_2$, with the spectrum of the filter output over the output frequency range $[c,d]$ satisfying certain specifications. The specifications to be satisfied can be specified in terms of magnitude, phase or both.

The only difference of this design compared to the designs in Section I is that the determination of the maximum order N of the filter nonlinearities should not only ensure that the specified output frequency band $[c,d]$ is covered by the filter's output frequency range, but also should ensure that the output energy over $[c,d]$ is derived from the input frequency range $[a_1,b_1]$ and the input frequency range $[a_2, b_2]$. Therefore, the principles for this design are exactly the same as those described in Section I except for step (iii) which should follow the new principle above.

Consider an example where a nonlinear filter is to be designed to focus the energy from two different frequency bands [3,4] and [10,11] of an input signal $$u(t) = 2M_u\left(\frac{1}{2\pi}\frac{\sin 2\pi b_1 t - \sin 2\pi a_1 t}{t} + \frac{1}{2\pi}\frac{\sin 2\pi b_2 t - \sin 2\pi a_2 t}{t}\right)$$

where $b_1=4$, $a_1=3$, $b_2=11$, $a_2=10$, $M_w=0.03$, into a single frequency band around frequency f=7 with the single output frequency band as small as possible and the output magnitude characteristic at frequency f=7 being $3M_w=0.09$.

It can be shown that when subject to the excitation of an input with the frequency spectrum over two different frequency bands $[a_1,b_1]$ and $[a_2,b_2]$, the output frequency ranges of a nonlinear system contributed by the system's 2nd order nonlinearity is $[2a_2,2b_2]$, $[2a_1,2b_1]$, $[a_1+a_2,b_1+b_2]$, $[0,b_1-a_1]\cup[0,b_2-a_2]$ and $[a_2-b_1,b_2-a_1]$ substituting $b_1=4$, $a_1=3$, $b_2=11$, $a_2=10$ into $a_2-b_1$ and $b_2-a_1$ yields $[a_1-b_1,b_2-a_1]=[6,8]$ Clearly this output frequency range covers frequency f=7 and the system output energy over this frequency band is derived from the input frequency range $[a_1,b_1]=[3,4]$ and the input frequency range $[a_2,b_2]=[10,11]$. Therefore, the maximum order of system nonlinearities can be taken to be N=2 for this specific design.

Figure 36:
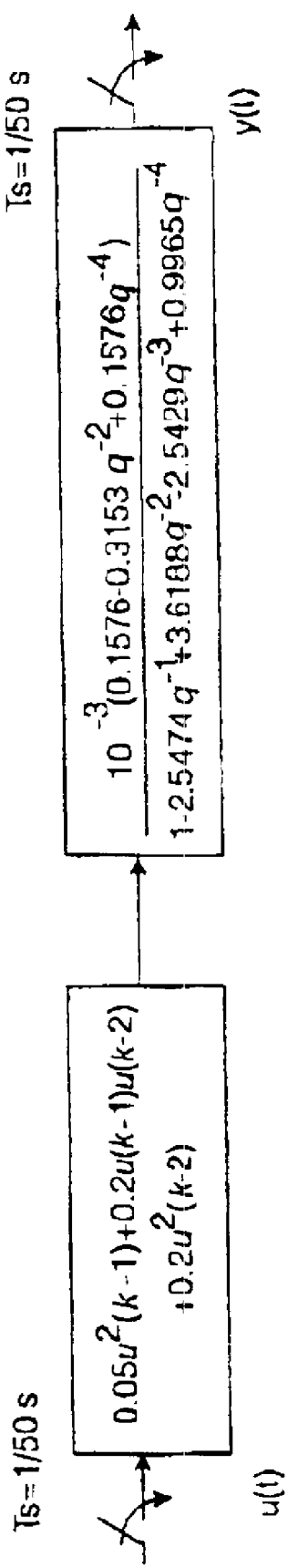
FIG. 36 depicts the discrete time model of a nonlinear filter designed to focus energy from two different frequency bands into a single frequency band.

Moreover, following the same design principles as described in Section I, a discrete time nonlinear filter under the sampling period, $T_s=\frac{1}{50}$ s can be obtained for this specific design. FIG. 36 illustrates schematically such a filter.

Figure 37:
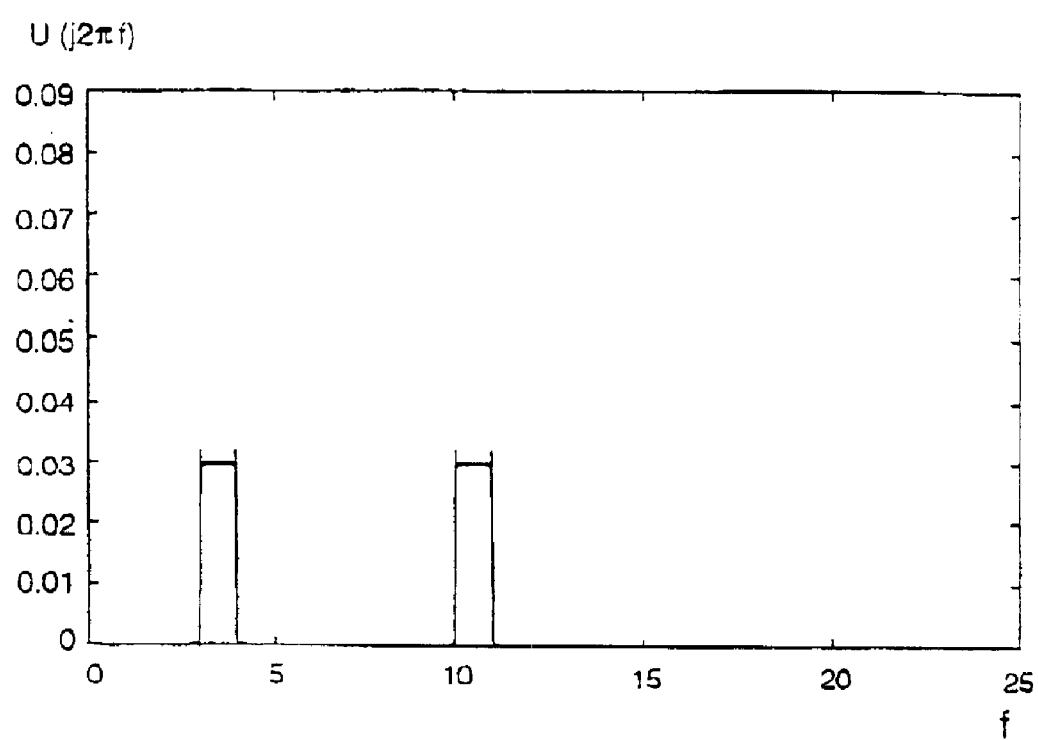
FIG. 37 shows the spectrum of an input signal of the nonlinear filter in FIG. 36.
Figure 38:
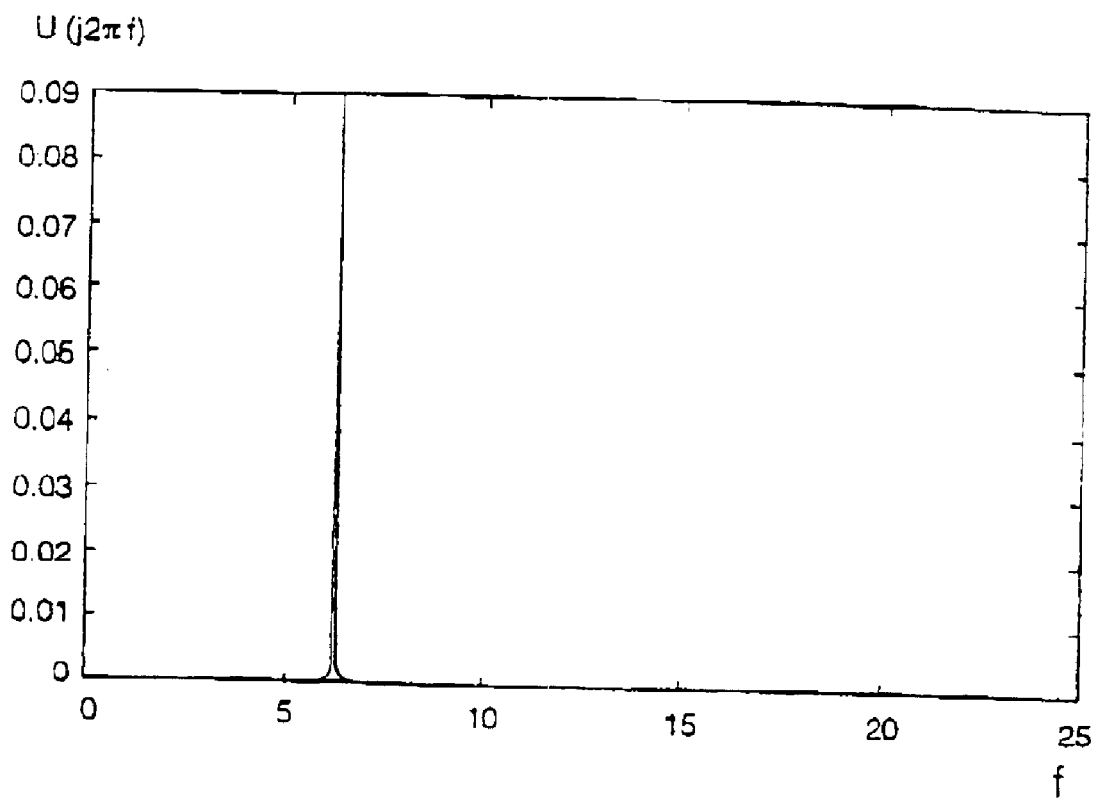
FIG. 38 shows the frequency response of the nonlinear filter in FIG. 36 to the input in FIG. 37, which indicates an energy focus effect of the nonlinear filter.

FIGS. 37 and 38 show the input and output frequency spectra of this filter respectively and clearly indicate that the input energy over the two different input frequency bands [3,4] and [10,11] have been, as required, successfully focused into a very small band around frequency f=7.

IV.3 Design of Spatial Domain Nonlinear Filters

Although the above embodiments have been described with reference to the design of non-linear time-domain systems, it will be appreciated that the present invention is equally applicable to non-linear spatial-domain systems.

In the one dimensional case, the present invention can be directly applied and the only difference of the one-dimensional spatial domain case over the above time-domain embodiments is that the time-domain variables t and k in the continuous and discrete time filter equations become the continuous and discrete spatial variables x and $x_k$ in the spatial domain filter equations.

Consider a one dimensional spatial domain filtering problem that is the same as the second problem addressed in Section II.1 except that the time variables t and k become the spatial variables X and $X_k$ in the present design.

Figure 39:
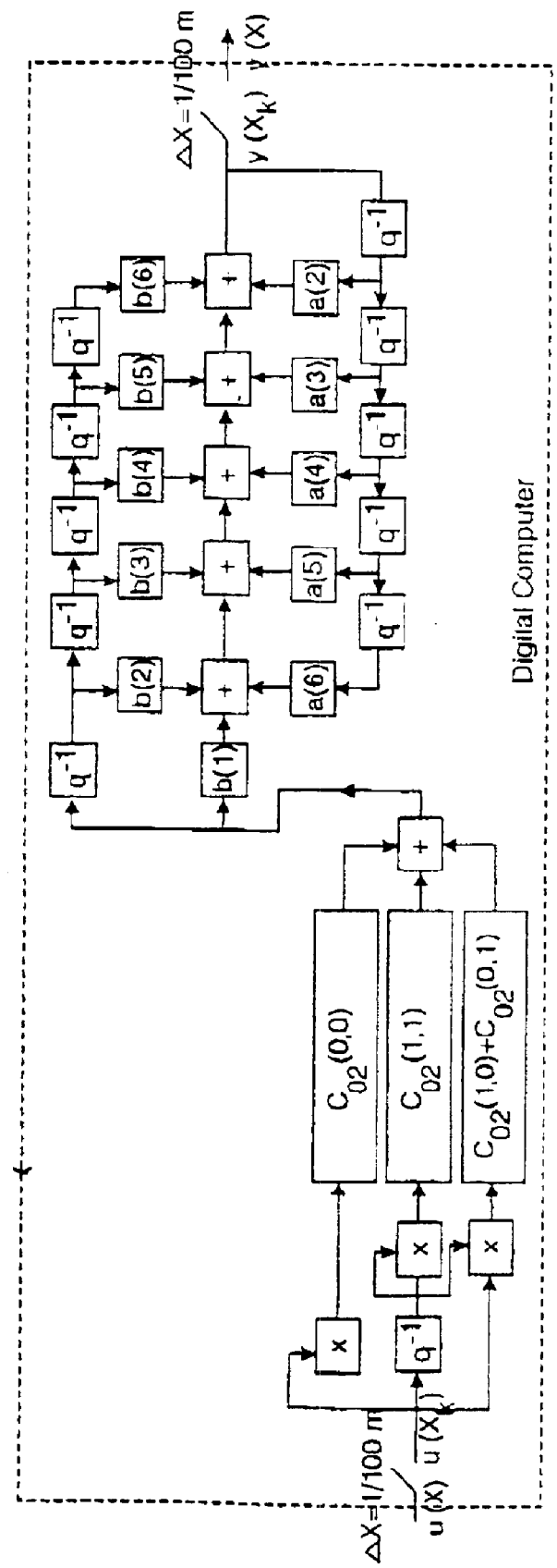
FIG. 39 illustrates the block diagram of a spatial domain nonlinear filter.

FIG. 39 shows the block diagram of the spatial domain nonlinear filter designed in this case. It can be seen that the spatial-domain filter is exactly the same as that shown in FIG. 9 which is the block diagram of the corresponding time domain nonlinear filter designed in Section II.1 except that the time variables t, k, T, and s (second) in FIG. 9 have been changed to the spatial variables X, $X_k$, ΔX, and m (meter) in FIG. 39.

Figure 40:
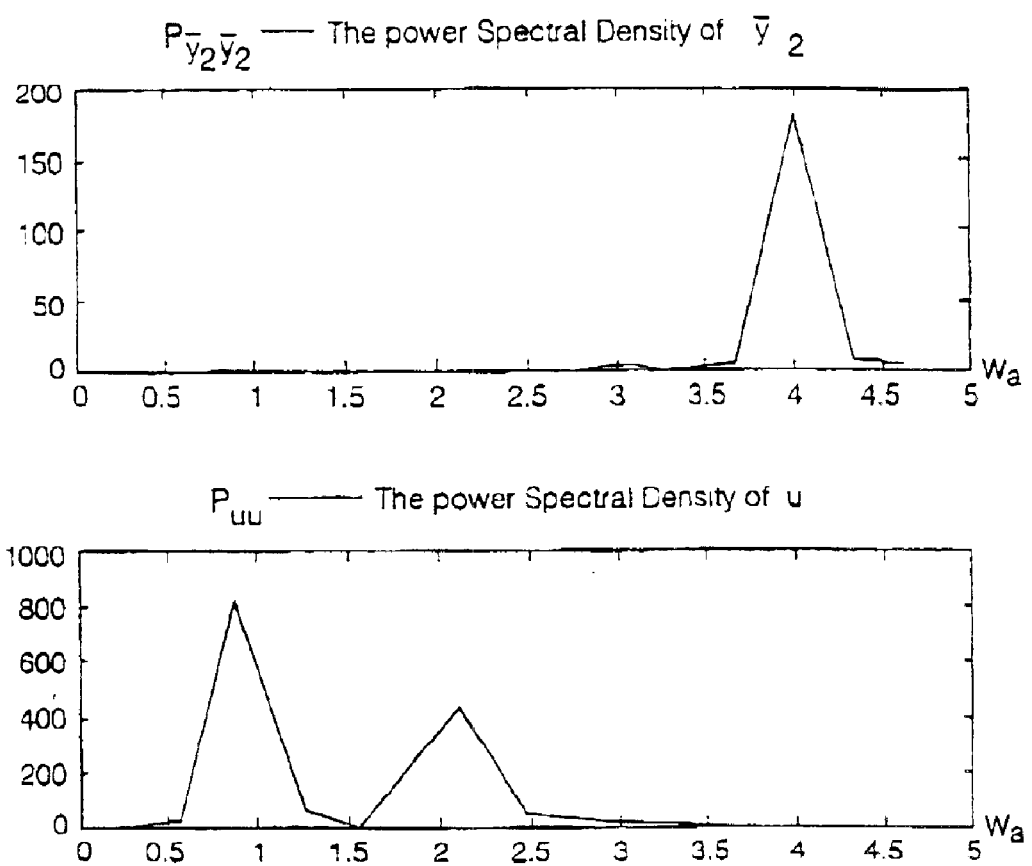
FIG. 40 depicts the power spectral densities of an input and the corresponding output of the spatial domain nonlinear filter in FIG. 39.
Figure 41:
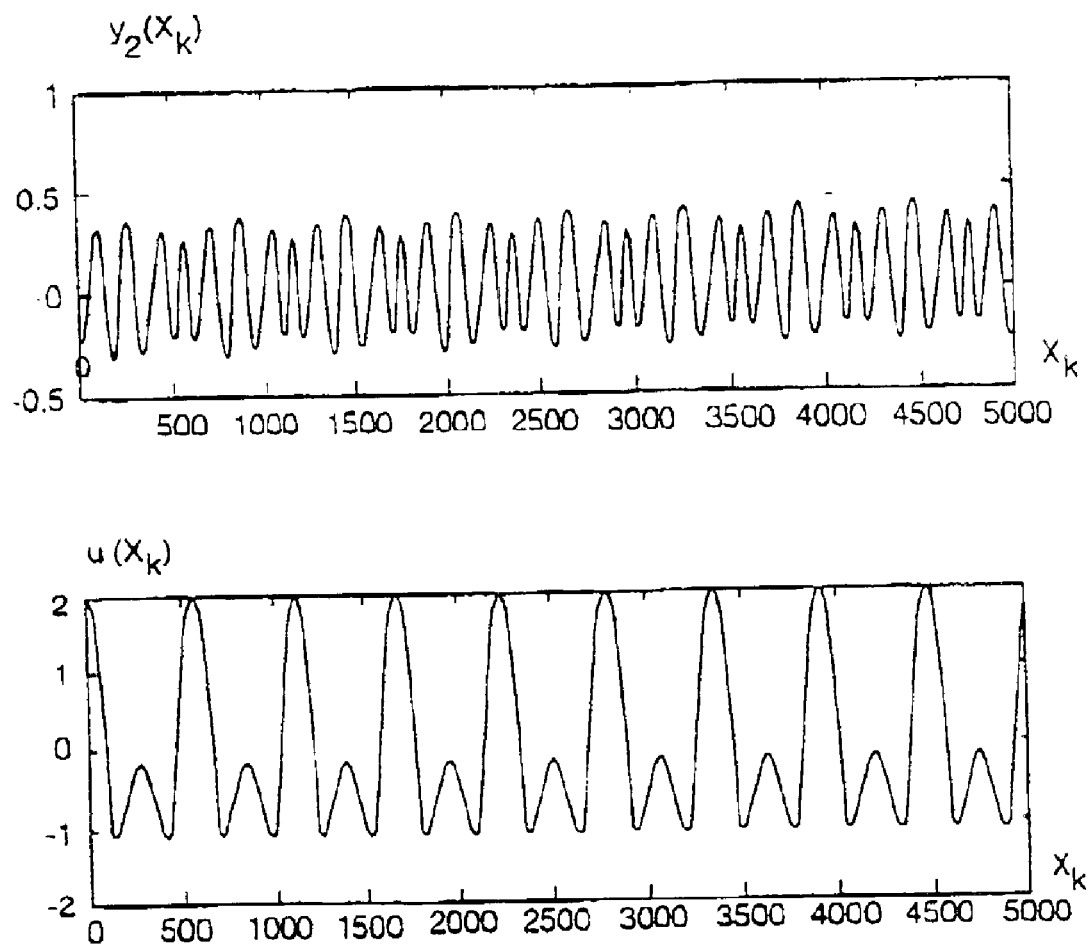
FIG. 41 depicts an spatial domain input and corresponding output of the filter in FIG. 39.

FIGS. 40 and 41 show the effects of spatial domain nonlinear filter. Again, except for the time variables being changed to spatial variables, the figures are the same as FIGS. 11 and 13 which are the results of the corresponding time domain nonlinear filter.

The filtering effect in the time domain of the second nonlinear filter designed in Section II.1 indicates an energy transfer from the input frequencies $w_{a1}=1$ and $w_{a2}=2$ to the output frequency $w_{a0}=4$. FIG. 40 indicates the same effect but in the spatial domain. In this case, the spatial domain nonlinear filter transfers energy from the input spatial frequencies $w_{a1}=1$ and $w_{a2}=2$ to the output spatial frequency $w_{a0}=4$.

Figure 42:
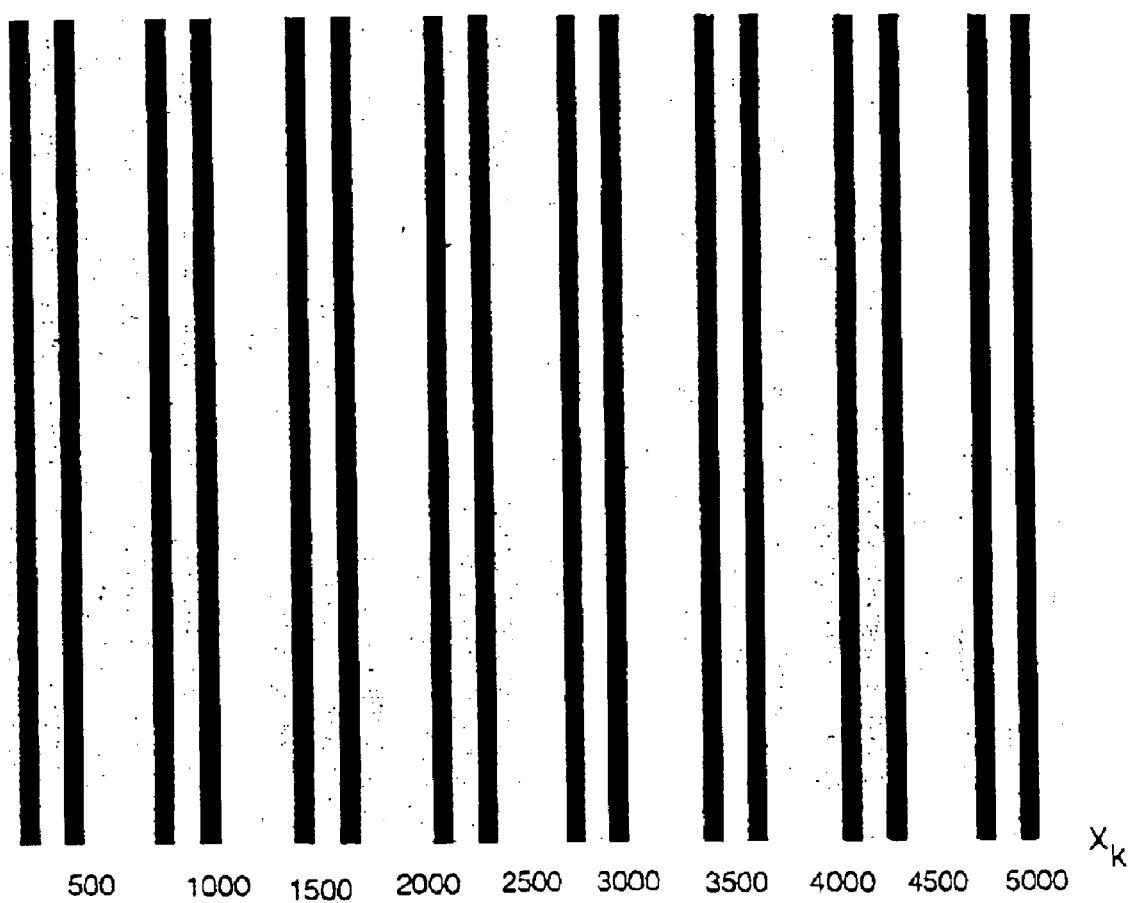
FIG. 42 shows a one dimensional image to be processed by the spatial domain nonlinear filter in FIG. 39.
Figure 43:
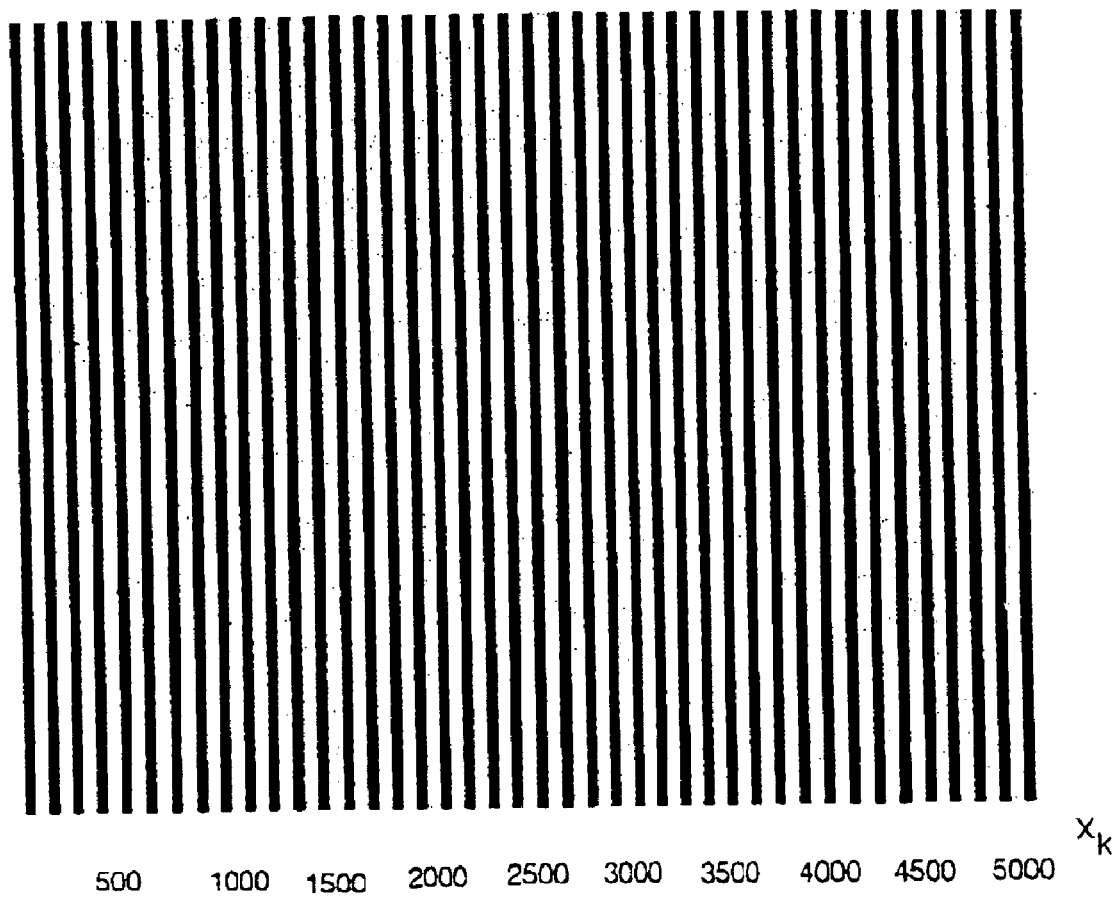
FIG. 43 shows the one dimensional image obtained by processing the image in FIG. 42 using the spatial domain nonlinear filter in FIG. 39.

When this one dimensional spatial domain nonlinear filter is applied for one dimensional image processing, where FIG. 41 represents the intensities over the spatial variable X of the images before and after the processing, the energy transformation effect of the spatial domain nonlinear filter can be further illustrated by FIGS. 42 and 43. FIG. 42 shows the one dimensional input image with energy located in spatial frequencies $w_{a1}=1$ and $w_{a2}=2$ and FIG. 43 shows the one dimensional output image with energy located in another spatial frequency $w_{a0}=4$ due to the effect of nonlinear filtering.

Although the present invention has been described above with reference to a one dimensional case in the spatial domain, it will be appreciated that the present invention is not limited thereto. The present invention can equally well be applied to the design and implementation of non-linear systems for realising transfer of energy from first m-dimensional spatial domain frequencies to specified second n-dimensional spatial domain frequencies, where m and n are greater than one.

It will be appreciated that an application of the transfer of energy from first m-dimensional spatial domain frequencies to specified second n-dimensional spatial domain frequencies would be digital image processing or filtering. In such a case m=n=2. The present invention can be designed to produce filters that operate upon digital images. The filters can be designed to perform numerous different functions such as, for example, image compression or filtering to remove noise or vary the colour space of an image.

The phrase "transfer of energy" includes, without limitation, the processing of a first signal, specified in the time domain or spatial domain, to produce second signal having predeterminable characteristics including a specified energy distribution.

Furthermore, it will be appreciated that the terms "frequency range" and "range of frequencies" includes a group of frequencies or frequency group. A group of frequencies comprises a plurality of frequencies spatially distributed within an n-dimensional space or over a subspace.

It will be appreciated by those skilled in the art that the phrase "specified spectrum" relates to the specification of at least one of either the magnitude and phase of a signal or frequency components of a signal and is equally applicable to situations in which only the magnitude is specified and to situations in which both the magnitude and phase are specified.

It will be appreciated that the input and output signals of any or all of the various embodiments of the present invention may be time or spatial domain continuous or discrete input or output signals.

Figure 44:
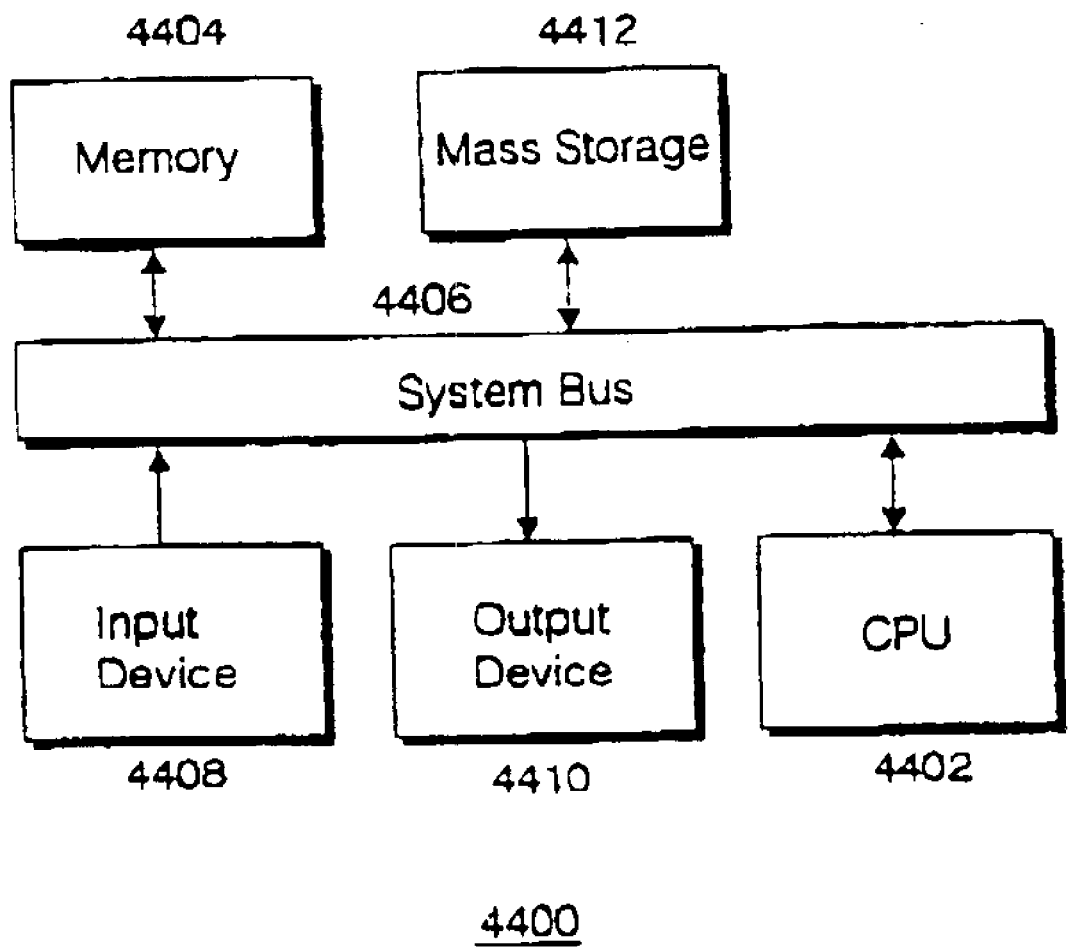
FIG. 44 illustrates a data processing system upon which embodiments of the present invention can be implemented.

Referring to FIG. 44 there is shown a data processing system 4400 upon which embodiments of the present invention, that is to say, the non-linear systems and the methods of design thereof can be implemented or realised. It will also be appreciated that the non-linear systems so designed may be implemented in digital form using the data processing system or other suitable hardware and software. The data processing system 4400 comprises a central processing unit 4402 for processing computer instructions for implementing the design of nonlinear systems given an input signal and particular output signal requirements. The data processing system also comprises a memory 4404 for storing data to be processed or the results of processing as well as computer program instructions for processing such data, a system bus 4406, an input device 4408, an output device 4410 and a mass storage device, for example, a hard disc drive 4412.

What is claimed is:

1. A computer-implemented method for designing a non-linear system for transferring energy from a time or spatial domain input signal having a first spectrum at a first pre-determinable frequency or range of frequencies to a time or spatial domain output signal having a second spectrum at a second pre-determinable frequency or range of frequencies, said method comprising the steps of identifying or specifying the first spectrum of the time or spatial domain input signal from which energy is to be transferred, specifying the second spectrum of the time or spatial domain output signal to which said energy is to be transferred, and calculating, using a frequency domain description of said output signal expressed in terms of a frequency domain description of said input signal and coefficients of a time or spatial domain description of a generalised non-linear system, the coefficients of the time or spatial domain description of the generalised non-linear system in order to give affect to the energy transfer.

2. A computer-implemented method as claimed in claim 1, further comprising the step of selecting a time or spatial domain description of the generalised non-linear system;

determining or defining a frequency domain description of the time or spatial domain input for the generalised non-linear system; and determining or defining the frequency domain description of the output signal, for example, the output spectrum, of the generalised non-linear system expressed in terms of the frequency domain description of said input signal and the coefficients of the time or spatial domain description of a generalised non-linear system.

3. A computer-implemented method as claimed in either of claim 1 or 2, wherein the frequency domain description of the input signal is $U(jw)$, the time or spatial domain description of said generalised non-linear system is given by the generalised NARX model $$y(k) = \sum_{n=1}^{N} y_n(k) \text{ where} \tag{C1}$$

$$y_n(k) = \tag{C2}$$

$$\sum_{p=0}^{n} \sum_{1_{p+q}=1}^{K_n} c_{pq}(l_1, \ldots, l_{p+q}) \prod_{i=1}^{p} y(k-l_i) \prod_{i=p+1}^{p+q} u(k-l_i) \text{ with}$$

$$p+q=n, l_i=1, \ldots, K_n, i=1, \ldots, p+q, \text{ and}$$

$$\sum_{l_1, 1_{p+q}=1}^{K_n} \equiv \sum_{l_1=1}^{K_n} \cdots \sum_{1_{p+q}=1}^{K_n}$$

the frequency domain description of the output of the generalised non-linear system is given by $$Y(jw) = \sum_{n=1}^{\overline{N}} Y_n(jw) \text{ where} \tag{C3}$$

$$Y_n(jw) = \frac{1/\sqrt{n}}{(2\pi)^{n-1}} \int_{w_1+\ldots+w_n=w} H_n(jw_1, \ldots, jw_n) \prod_{i=1}^{n} U(jw_i) d\sigma_w \tag{C4}$$

$\overline{N}$ is the maximum order of dominant system nonlinearities, $$\int_{w_1+\ldots+w_n=w} (.) d\sigma_w$$

denotes an integration over the nth-dimensional hyperplane $w_1+\ldots+w_n=w$, and $H_n(jw_1, \ldots, jw_n)$, n=1, ...

$\overline{N}$ are generalised frequency response functions of the non-linear system.

4. A computer-implemented method in any preceding claim, further comprising the step of determining a mapping between the time or spatial domain description of the generalised nonlinear system and the frequency domain description of the generalised nonlinear system.

5. A computer-implemented method as claimed in claim 4, wherein the mapping from the time or spatial domain description of the generalised non-linear system to the frequency domain description of the system is given $$\left\{1 - \sum_{l_1=1}^{K_1} c_{10}(l_1)\exp[-j(w_1 + \ldots + w_n)l_1]\right\} H_n(jw_1, \ldots, jw_n) = \tag{C5}$$

$$\sum_{l_1,l_n=1}^{K_n} c_{0n}(l_1, \ldots, l_n)\exp[-j(w_1l_1 + \ldots + w_nl_n)] \text{ as } +$$

$$\sum_{q=1}^{n-1}\sum_{p=1}^{n-q}\sum_{l_1,l_{p+q}=1}^{K_{p+q}} c_{pq}(l_1, \ldots, l_{p+q})\exp[-j(w_{n-q+1}l_{p+1} + $$

$$\ldots, +w_n l_{p+q})]H_{n-q,p}(jw_1, \ldots, jw_{n-q}) + $$

$$\sum_{p=2}^{n}\sum_{l_1,l_p=1}^{K_p} c_{p0}(l_1, \ldots, l_p)H_{n,p}(jw_1, \ldots, jw_n) \text{ where}$$

$$H_{np}(jw_1, \ldots, jw_n) = \sum_{i=1}^{n-p+1} H_i(jw_1, \ldots, jw_i) \tag{C6}$$

$$H_{n-i,p-1}(jw_{i+1}, \ldots, jw_n)\exp[-j(w_1 + \ldots + w_i)l_p]$$

6. A computer-implemented method as claimed in any preceding claims, further comprising the steps of defining or determining a general relationship between the input and output frequency ranges of the generalised non-linear system.

7. A computer-implemented method as claimed in any preceding claim, wherein the relationship between the input and output frequencies or frequency ranges is given by the following $$f_y = f_{y\overline{N}} \cup f_{y\overline{N}-1} \tag{C7}$$

where $f_y$ denotes the range of frequencies of the output, and $f_{y\overline{N}}$ and $f_{y\overline{N}-1}$ denote the ranges of frequencies produced by the $\overline{N}$th-order and $(\overline{N}-1)$th-order nonlinearities, and $$f_{y_n} = \begin{cases} \bigcup_{k=0}^{i^*-1} I_k & \text{when } \frac{nb}{(a+b)} - \left[\frac{na}{(a+b)}\right] < 1 \\ \bigcup_{k=0}^{i^*} I_k & \text{when } \frac{nb}{(a+b)} - \left[\frac{na}{(a+b)}\right] \geq 1 \end{cases} \tag{C8}$$

$$n = \overline{N} \text{ and } \overline{N} - 1$$

where [.] relates to or means take the integer part, $$i^* = \left[\frac{na}{(a+b)}\right] + 1$$

$$I_k = [na - k(a+b), nb - k(a+b)] \text{ for } k = 0, \ldots, i^* - 1,$$

$$I_{i^*} = [0, nb - i^*(a+b)],$$

and the frequencies of the signal to be processed are in the range [a,b] and given [a,b] and the required output frequency range $f_y$, the method further comprises the step of determining the smallest $\overline{N}$ from the relationship above for the generalised non-linear system which can bring about the specified frequency domain energy transformation.

8. A computer-implemented method as claimed in claim 7, wherein, with $\overline{N}$ having been determined and $K_n$, n=1, . . . , $\overline{N}$, being given a priori, the method further comprises the steps of:

taking N as $\overline{N}$ and determining the coefficients of the time or spatial domain model of the generalised non-linear system from the description from the system output spectrum given in terms of the spectrum of the input signal and the coefficients of the time or spatial domain model of the said generalised non-linear system.

9. A computer-implemented method as claimed in claim 8, further comprising the steps of substituting $H_n(jw_1, \ldots, jw_n)$ given in (C5) into (c4), and substituting the resultant expression for $Y_n(jw)$ into (C3) to obtain the description for the system output spectrum in terms of a function of the spectrum of the input signal and the coefficients of the time or spatial domain model of the said generalised nonlinear system.

10. A method for realising or manufacturing a non-linear system for transferring energy from a time or spatial domain input signal having a first spectrum at a first pre-determinable frequency or range of frequencies to a time or spatial domain output signal having a second spectrum at a second pre-determinable frequency or range of frequencies, the method comprising steps of (a) designing the non-linear system using the method as claimed in any of claims 1 to 9, (b) materially producing the non-linear system so designed or using the non-linear system so designed to modify materially the transfer function of an existing linear or non-linear system.

11. A data processing system for designing a non-linear system for transferring energy from a time or spatial domain input signal having a first spectrum at a first pre-determinable frequency or range of frequencies to a time or spatial domain output signal having a second spectrum at a second pre-determinable frequency or range of frequencies, said system comprising a processor to execute a program of instructions stored in the memory of the computer;

a memory to store a program of instructions for performing a method for designing a non-linear system for transferring energy from a time or spatial domain input signal having a first spectrum at a first pre-determinable frequency or range of frequencies to a second or spatial domain output signal having a second spectrum at a second pre-determinable frequency or range of frequencies;

a display to display the results of the computer implemented method;

means for identifying or specifying the first spectrum of the time or spatial domain input signal from which energy is to be transferred, means for specifying the second spectrum of the time or spatial domain output signal to which said energy is to be transferred, and means for calculating, using a frequency domain description of said output signal expressed in terms of a frequency domain description of said input coefficients of a time or spatial domain description of a generalised non-linear system, the coefficients of the time or spatial domain description of said generalised non-linear system in order to give effect to the energy transfer.

12. A data processing system as claimed in claim 11, further comprising means for selecting a time or spatial domain description of the generalised non-linear system;

means for determining or defining a frequency domain description of the time or spatial domain input for the generalised non-linear system; and means for determining or defining the frequency domain description of the output of the generalised non-linear system expressed in terms of the frequency domain description of said input signal and the coefficients of the time or spatial domain description of a generalised non-linear system.

13. A data processing system as claimed in either of claim 11 or 12, wherein the frequency domain description of the input signal is U(jw), the time of spatial domain description of the generalised non-linear system is given by the generalised NARX model $$y(k) = \sum_{n=1}^{N} y_n(k) \quad \text{where} \tag{C9}$$

$$y_n(k) = \tag{C10}$$

$$\sum_{p=0}^{n} \sum_{l_{p+q}=1}^{K_n} c_{pq}(l_1, \ldots, l_{p+q}) \prod_{i=1}^{p} y(k-l_i) \prod_{i=p+1}^{p+q} u(k-l_i) \quad \text{with}$$

$$p+q = n, l_i = 1, \ldots, K_n, i = 1, \ldots, p+q,$$

$$\text{and} \sum_{l_i,l_{p+q}=1}^{K_n} \equiv \sum_{l_i=1}^{K_n} \ldots \sum_{l_{p+q}=1}^{K_n}$$

the frequency domain description of the output of the generalised non-linear system is given by $$Y(jw) = \sum_{n=1}^{\overline{N}} Y_n(jw) \quad \text{where} \tag{C11}$$

$$Y_n(jw) = \frac{1/\sqrt{n}}{(2\pi)^{n-1}} \int_{w_1+\ldots+w_n=w} H_n(jw_1, \ldots, jw_n) \prod_{i=1}^{n} U(jw_i) d\sigma_w \tag{C12}$$

$\overline{N}$ is the maximum order of dominant system nonlinearities, $$\int_{w_1+\ldots+w_n=w} (\cdot) d\sigma_w$$

denotes an integration over the nth-dimensional hyperplane $w_1+\ldots+w_n=w_1$ and $H_n(jw_1\ldots,jw_n)$, $n=1,\ldots,\overline{N}$ are generalised frequency response functions of the said non-linear system.

14. A data processing system as claimed in any of claims 11 to 13, further comprising means for determining a mapping between the time or spatial domain description of the generalised nonlinear system and the frequency domain description of the generalised nonlinear system.

15. A data processing system as claimed in claim 14, wherein the mapping form the time of spatial domain description of the generalised non-linear system to the frequency domain description of the system is given as $$\left\{1 - \sum_{l_1=1}^{K_1} c_{10}(l_1)\exp[-j(w_1+,\ldots,+w_n)l_1]\right\} H_n(jw_1,\ldots,jw_n) = \tag{C13}$$

$$\sum_{l_1,l_n=1}^{K_n} c_{0n}(l_1,\ldots,l_n)\exp[-j(w_1l_1+,\ldots,+w_nl_n)] +$$

$$\sum_{q=1}^{n-1}\sum_{p=1}^{n-q}\sum_{l_1,l_{p+q}=1}^{K_{p+q}} c_{pq}(l_1,\ldots,l_{p+q})\exp[-j(w_{n-q+1}l_{p+1}+,$$

$$\ldots, +w_n l_{p+q})] H_{n-q,p}(jw_1,\ldots,jw_{n-q}) +$$

$$\sum_{p=2}^{n}\sum_{l_1,l_p=1}^{K_p} c_{p0}(l_1,\ldots,l_p) H_{n,p}(jw_1,\ldots,jw_n) \quad \text{where}$$

$$H_{np}(jw_1,\ldots,jw_n) = \sum_{i=1}^{n-p+1} H_i(jw_1,\ldots,jw_i) \tag{C14}$$

$$H_{n-i,p-1}(jw_{i+1},\ldots,jw_n)\exp[-j(w_1+,\ldots,+w_i)l_p]$$

16. A data processing system as claimed in ay of claims 11 to 15, further comprising means for defining or determining a general relationship between the input and output frequency or frequency ranges of the generalised non-linear system.

17. A data processing system as claimed in any of the claims 11 to 16, wherein the relationship between the input and output frequencies or frequency ranges is given by the following $$f_y = f_{y\overline{N}} \cup f_{y\overline{N}-1} \tag{C15}$$

where $f_y$ denotes the range of frequencies of the output, and $f_{y\overline{N}}$ and $f_{y\overline{N}-1}$ denote the ranges of frequencies produced by the $\overline{N}$th-order and $(\overline{N}-1)$th-order nonlinearities, and $$f_{Y_n} = \begin{cases} \bigcup_{k=0}^{i^*-1} I_k & \text{when } \frac{nb}{(a+b)} - \left[\frac{na}{(a+b)}\right] < 1 \\ \bigcup_{k=0}^{i^*} I_k & \text{when } \frac{nb}{(a+b)} - \left[\frac{na}{(a+b)}\right] \geq 1 \end{cases} \quad n = \overline{N} \text{ and } \overline{N}-1 \tag{C16}$$

where [.] relates to or means take the integer part, $$i^* = \left[\frac{na}{(a+b)}\right] + 1$$

$$I_k = [na - k(a+b), nb - k(a+b)] \quad \text{for } k = 0, \ldots, i^*-1,$$

$$I_{i^*} = [0, nb - i^*(a+b)],$$

and the frequencies of the signal to be processed are in the range [a,b] and given [a,b] and the required output frequency range fy, the system further comprises the means for determining the smallest $\overline{N}$ from the relationship above the said generalised non-linear system which can bring forth the specified frequency domain energy transformation.

18. A data processing system as claimed in claim 17, wherein, with $\overline{N}$ having been determined and $K_n$, n=1, ..., $\overline{N}$, being given a priori, the system further comprises the means:

for taking N as $\overline{N}$ and for determining the coefficients of the time or spatial domain model of the generalised non-linear system from the description from the system from the description for the system output spectrum given in terms of the spectrum of the input signal and the coefficients of the time or spatial domain model of the generalised non-linear system.

19. A data processing system as claimed in claim 18, further comprising means for substituting $H_n(jw_1, \ldots, jw_n)$ given in (c13) into (c12), and substituting the resultant expression for $Y_n(jw)$ into (C11) to obtain the description for the system output spectrum in terms of a function of the spectrum of the input signal and the coefficients of the time or spatial domain model of the generalised nonlinear system.

20. A computer program product for designing a non-linear system for transferring energy from a time or spatial domain input signal having a first spectrum at a first pre-determinable frequency or range of frequencies to a time or spatial domain output signal having a second spectrum at a second pre-determinable frequency or range of frequencies, in a computer readable storage medium, comprising computer program instructions which when executed on a computer performs a process, the process comprising the steps of:

identifying or specifying the first spectrum of a time or spatial domain input signal from which energy is to be transferred;

specifying the second spectrum of a time or spatial domain output signal to which said energy is to be transferred, and calculating, using a frequency domain description of the output signal expressed in terms of a frequency domain description of the input and coefficients of a time or spatial domain description of a generalised non-linear system, the coefficients of a time or spatial domain description of said generalised non-linear system in order to give effect to the energy transfer.

21. A computer program product as claimed in claim 20, further comprising computer program instructions for selecting a time or spatial domain description of the generalized non-linear system;

determining or defining a frequency domain description of the time or spatial domain input for the generalised non-linear system; and determining or defining the frequency domain description of the output of the generalised non-linear system expressed in terms of the frequency domain description of said input signal and the coefficients of the time or spatial domain description of a generalised non-linear system.

22. A computer program product as claimed in either claim 20 or 21, wherein the frequency domain description of the input signal is U(jw), the time or spatial domain description of the generalised non-linear system is given by the generalised NARX model $$y(k) = \sum_{n=1}^{N} y_n(k) \text{ where} \quad (C17)$$

$$y_n(k) = \quad (C18)$$

$$\sum_{p=0}^{n} \sum_{l_1, l_{p+q}=1}^{K_n} c_{pq}(l_1, \ldots, l_{p+q}) \prod_{i=1}^{p} y(k-l_i) \prod_{i=p+1}^{p+q} u(k-l_i) \text{ with}$$

$$p+q=n, l_i=l, \ldots, K_n, i=1, \ldots p+q,$$

$$\text{and} \sum_{l_1, l_{p+q}=1}^{K_n} \equiv \sum_{l_1=1}^{K_n} \ldots \sum_{l_{p+q}=1}^{K_n}$$

the frequency domain description of the output of the generalised non-linear system is given by $$Y(jw) = \sum_{n=1}^{\overline{N}} Y_n(jw) \text{ where} \quad (C19)$$

$$Y_n(jw) = \frac{1/\sqrt{n}}{(2\pi)^{n-1}} \int_{w_1+, \ldots, +w_n=w} H_n(jw_1, \ldots, jw_n) \prod_{i=1}^{n} U(jw_i) d\sigma_w \quad (C20)$$

$\overline{N}$ is the maximum order of dominant system nonlinearities, $$\int_{w_1+, \ldots, +w_n=w} (\cdot) d\sigma_w$$

denotes an integration over the nth-dimensional hyperplane $w_1+, \ldots, +w_n=w$, and $H_n(jw_1, \ldots, jw_n)$, n=1, ..., $\overline{N}$ are generalised frequency response functions of the non-linear system.

23. A computer program product as claimed in any of claims 20 to 22, further comprising computer program instructions for determining a mapping between the time or spatial domain description of the generalised nonlinear system and the frequency domain description of the generalised nonlinear system.

24. A computer program product as claimed in claim 23, wherein the mapping from the time or spatial domain description of the generalised non-linear system to the frequency domain description of the system is given as $$\left\{1 - \sum_{l_1=1}^{K_1} c_{10}(l_1) \exp[-j(w_1+, \ldots, +w_n)l_1]\right\} H_n(jw_1, \ldots, jw_n) = \quad (C21)$$

$$\sum_{l_1, l_n=1}^{K_n} c_{0n}(l_1, \ldots, l_n) \exp[-j(w_1 l_1 +, \ldots, +w_n l_n)] +$$

$$\sum_{q=1}^{n-1} \sum_{p=1}^{n-q} \sum_{l_1, l_{p+q}=1}^{K_{p+q}} c_{pq}(l_1, \ldots, l_{p+q}) \exp[-j(w_{n-q+1} l_{p+1} +,$$

$$\ldots, +w_n l_{p+q})] H_{n-q,p}(jw_1, \ldots, jw_{n-q}) +$$

$$\sum_{p=2}^{n} \sum_{l_1, l_p=1}^{K_p} c_{p0}(l_1, \ldots, l_p) H_{n,p}(jw_1, \ldots, jw_n) \text{ where}$$

-continued $$H_{np}(jw_1, \ldots, jw_n) = \sum_{i=1}^{n-p+1} H_i(jw_1, \ldots, jw_i) \quad \text{(C22)}$$

$$H_{n-i,p-1}(jw_{i+1}, \ldots, jw_n)\exp[-j(w_1 +, \ldots, +w_i)l_p]$$

25. A computer program product as claimed in any of claims 20 to 24, further comprising computer program instructions for defining or determining a general relationship between the input and output frequency or frequency ranges of the generalised non-linear system.

26. A computer program product as claimed in any of claims 20 to 25, wherein the relationship between the input and output frequencies or frequency ranges is given by the following $$f_y = f_{y_{\overline{N}}} \cup f_{y_{\overline{N}-1}} \quad \text{(C23)}$$

where $f_y$ denotes the range of frequencies of the output, and $f_{y_{\overline{N}}}$ and $f_{y_{\overline{N}-1}}$ denotes the ranges of frequencies produced by the $\overline{N}$th-order and $(\overline{N}-1)$th-order nonlinearities, and $$f_{Y_n} = \begin{cases} \bigcup_{k=0}^{i^*-1} I_k & \text{when } \frac{nb}{(a+b)} - \left[\frac{na}{(a+b)}\right] < 1 \\ \bigcup_{k=0}^{i^*} I_k & \text{when } \frac{nb}{(a+b)} - \left[\frac{na}{(a+b)}\right] \geq 1 \end{cases} \quad n = \overline{N} \text{ and } \overline{N}-1 \quad \text{(C24)}$$

where [.] relates to or means take the integer part, $$i^* = \left[\frac{na}{(a+b)}\right] + 1$$

$$I_k = [na - k(a+b), nb - k(a+b)] \text{ for } k = 0, \ldots, i^* - 1,$$

$$I_{i^*} = [0, nb - i^*(a+b)],$$

and the frequencies of the signal to be processed are in the range [a,b], given [a,b] and the required output frequency range $f_Y$, the computer program product further comprises computer instructions for determining the smallest $\overline{N}$ from the relationship above for the said generalised non-linear system which can bring about the specified frequency domain energy transformation.

27. A computer program product as claimed in claim 26, wherein, with $\overline{N}$ having been determined and $K_n$, n=1, . . . , $\overline{N}$, being given a priori, said product further comprises computer program instructions for taking N as $\overline{N}$ and determining the coefficients of the time or spatial domain model of the generalised non-linear system from the description for the system output spectrum given in terms of the spectrum of the input signal and the coefficients of the time or spatial domain model of the said generalised non-linear system.

28. A computer program product as claimed in any of claims 20 to 27, further comprising computer program instructions for substituting $H_n(jw_1, \ldots, jw_n)$ given in (C21) into (C20), and substituting the resultant expression for $Y_n(jw)$ into (C19) to obtain the description for the system output spectrum in terms of a function of the spectrum of the input signal and the coefficients of the time or spatial domain model of the generalised nonlinear system.

29. A non-linear system which can transfer energy from a time or spatial domain input signal having a first spectrum at a first pre-determinable frequency or range of frequencies to a time or spatial domain output signal having a second spectrum at a second pre-determinable frequency or range of frequencies, said system comprising means for identifying the first spectrum of the time or spatial domain input signal from which energy is to be transferred, means for specifying the second spectrum of the time or spatial domain output signal to which said energy is to be transferred, and means for giving effect to the energy transfer using coefficients of a time or spatial domain description of a generalised non-linear system, said coefficients having been calculated using a frequency domain description of said output signal expressed in terms of a frequency domain description of said input signal and coefficients of a time or spatial domain description of a generalised non-linear system.

30. A non-linear system for transferring energy from a time or spatial domain input signal having a first spectrum at a first pre-determinable frequency or range of frequencies to a time or spatial domain output signal having a second spectrum at a second pre-determinable frequency or range of frequencies, said system comprising means for implementing a method as claimed in any of claims 1 to 9.

31. A computer-implemented method as claimed in claim 1 wherein said output signal is the output spectrum.

32. A data processing system as claimed in claim 11 wherein said output signal is the output spectrum.

33. A computer program product as claimed in claim 20 wherein said output signal is the output spectrum.

34. A non-linear system as claimed in claim 29 wherein said output signal is the output spectrum.

* * * * *